US005963800A

United States Patent [19]
Augusto

[11] Patent Number: 5,963,800
[45] Date of Patent: Oct. 5, 1999

[54] CMOS INTEGRATION PROCESS HAVING VERTICAL CHANNEL

[75] Inventor: Carlos Jorge Ramiro Proenca Augusto, Louvain, Belgium

[73] Assignee: Interuniversitair Micro-Elektronica Centrum (IMEC vzw), Louvain, Belgium

[21] Appl. No.: 08/668,215

[22] Filed: Jun. 17, 1996

Related U.S. Application Data

[60] Provisional application No. 60/001,022, Jul. 11, 1995, and provisional application No. 60/010,476, Jan. 23, 1996.

[30] Foreign Application Priority Data

Jun. 16, 1995 [EP] European Pat. Off. .............. 95870071

[51] Int. Cl.$^6$ ............................................. H01L 21/8238
[52] U.S. Cl. ........................ 438/212; 438/213; 438/270; 438/277; 438/279; 438/283; 257/334
[58] Field of Search ...................... 438/212, 213, 438/268, 270, 277, 279, 283, FOR 426; 257/330, 334

[56] References Cited

U.S. PATENT DOCUMENTS

| | | |
|---|---|---|
| 4,236,166 | 11/1980 | Cho . |
| 4,550,489 | 11/1985 | Chappell et al. . |
| 4,740,826 | 4/1988 | Chatterjee . |
| 4,788,158 | 11/1988 | Chatterjee ................................ 438/213 |
| 5,398,200 | 3/1995 | Mazure et al. . |
| 5,414,655 | 5/1995 | Ozaki et al. . |
| 5,451,800 | 9/1995 | Mohammad . |
| 5,497,017 | 3/1996 | Gonzales . |
| 5,670,803 | 9/1997 | Beilstein, Jr. et al. .................. 257/330 |

OTHER PUBLICATIONS

"Fabrication of Three–Terminal Resonant Tunneling Devices in Silicon–Based Material," Zaslavsky, et al., *Appl. Phys. Lett.* 64 (13), pp. 1699–1701, Mar. 28, 1994.

"Ballistic Metal–Oxide–Semiconductor Field Effect Transistor," Natori, K., *J. Appl. Phys.* 76 (8), pp. 4879–4890, Oct. 15, 1994.

"The Physics and Device Applications of Epitaxially Grown Si and $Si_{1-x}GE_x$ Heterostructures," Kearney, M.J., *GEC Journal of Research* vol. 10, No. 3, pp. 158–165, 1993.

*Primary Examiner*—John Niebling
*Assistant Examiner*—Long Pham
*Attorney, Agent, or Firm*—Knobbe, Martens, Olson & Bear, LLP

[57] ABSTRACT

The present invention relates to processes for fabrictation of Vertical MISFET devices or a stack of several Vertical MISFET devices having high fabrication yield.

8 Claims, 44 Drawing Sheets

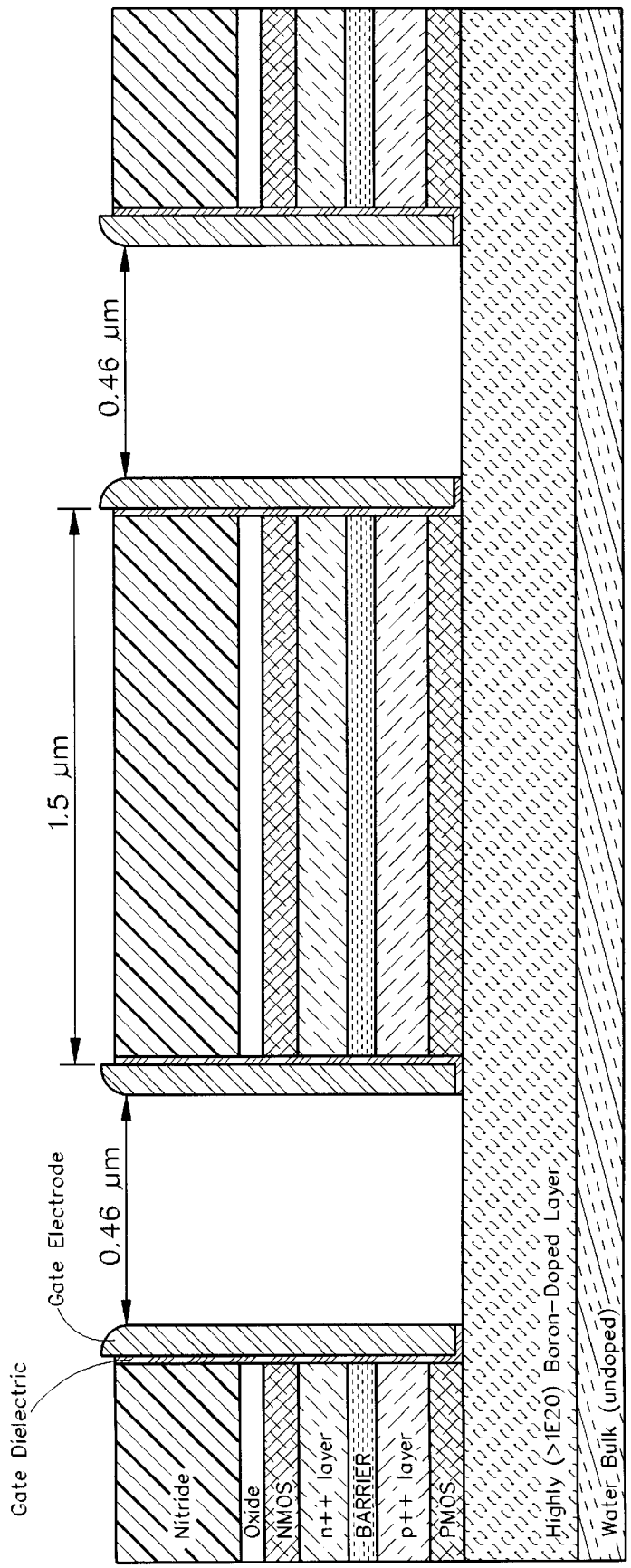
FIG. 7.1

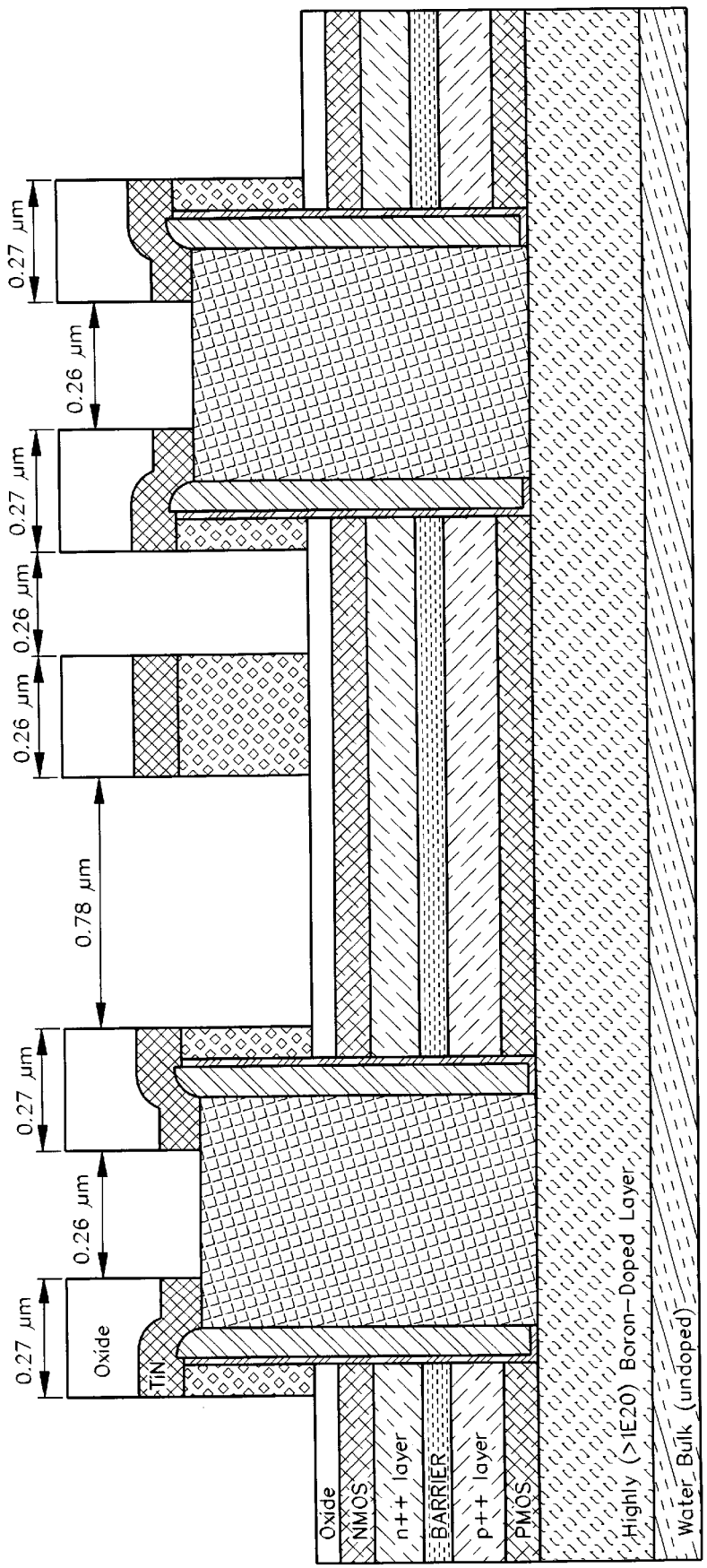
FIG. 7.2

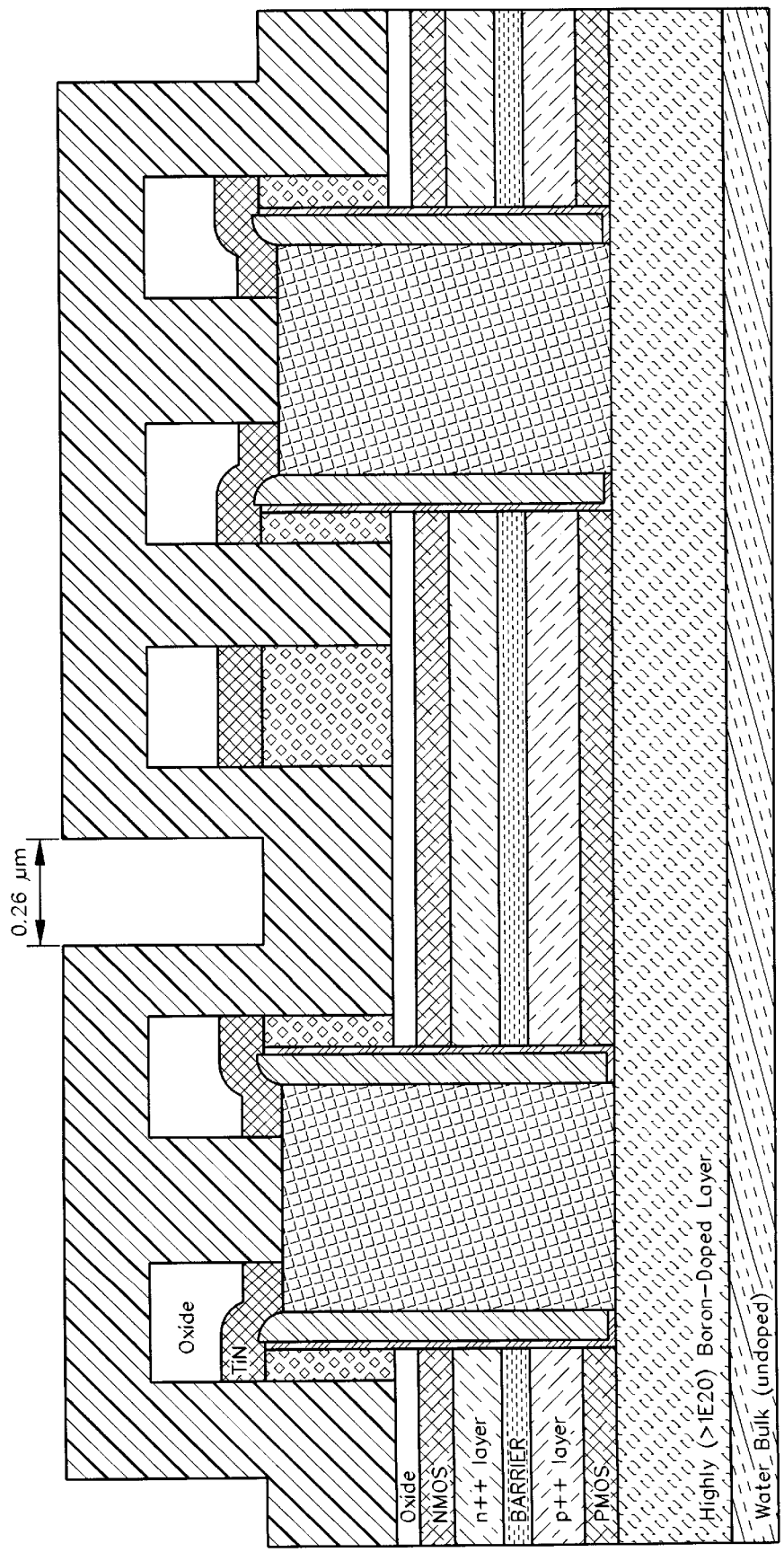
FIG. 7.3

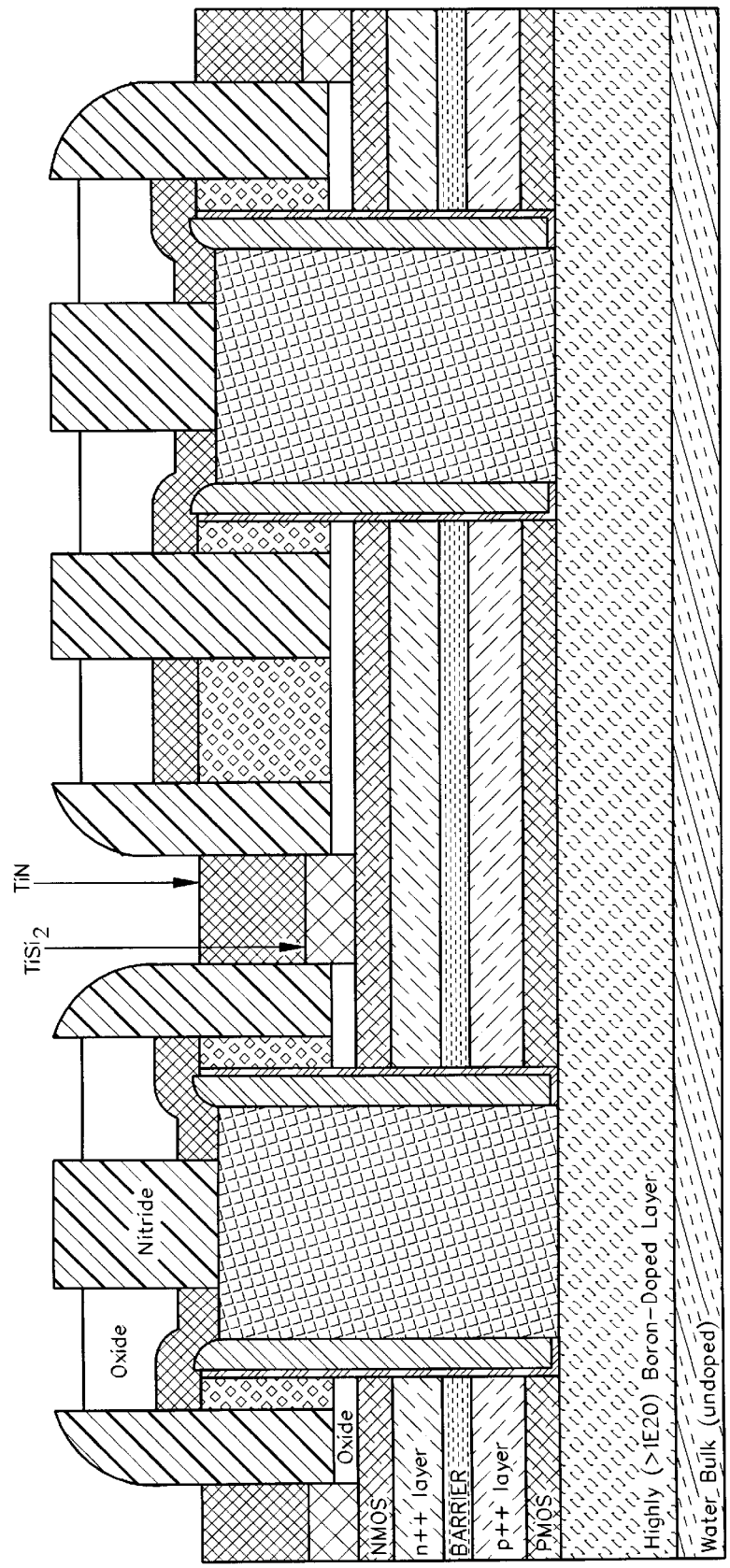
FIG. 7.4

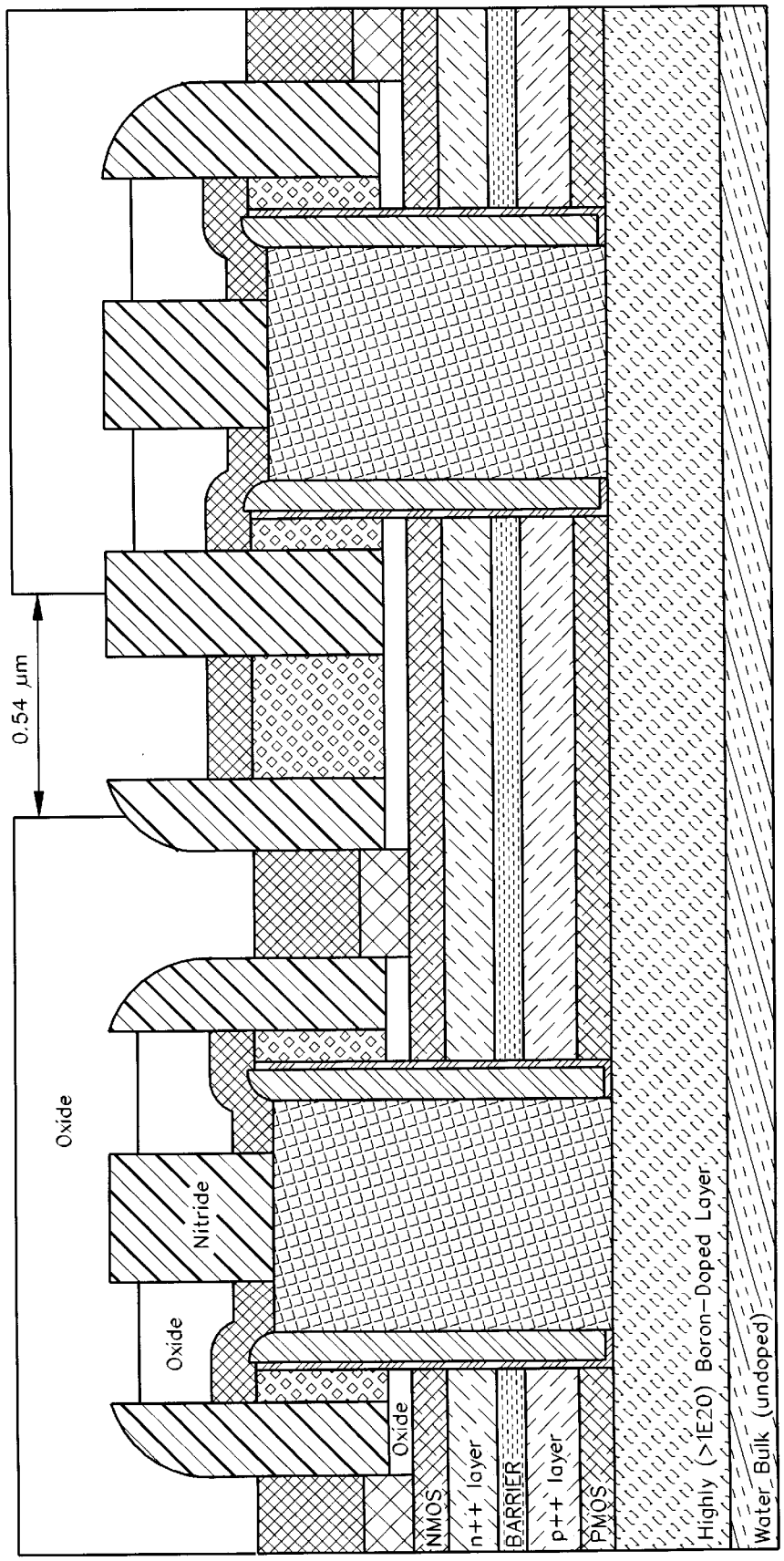
FIG. 7.5

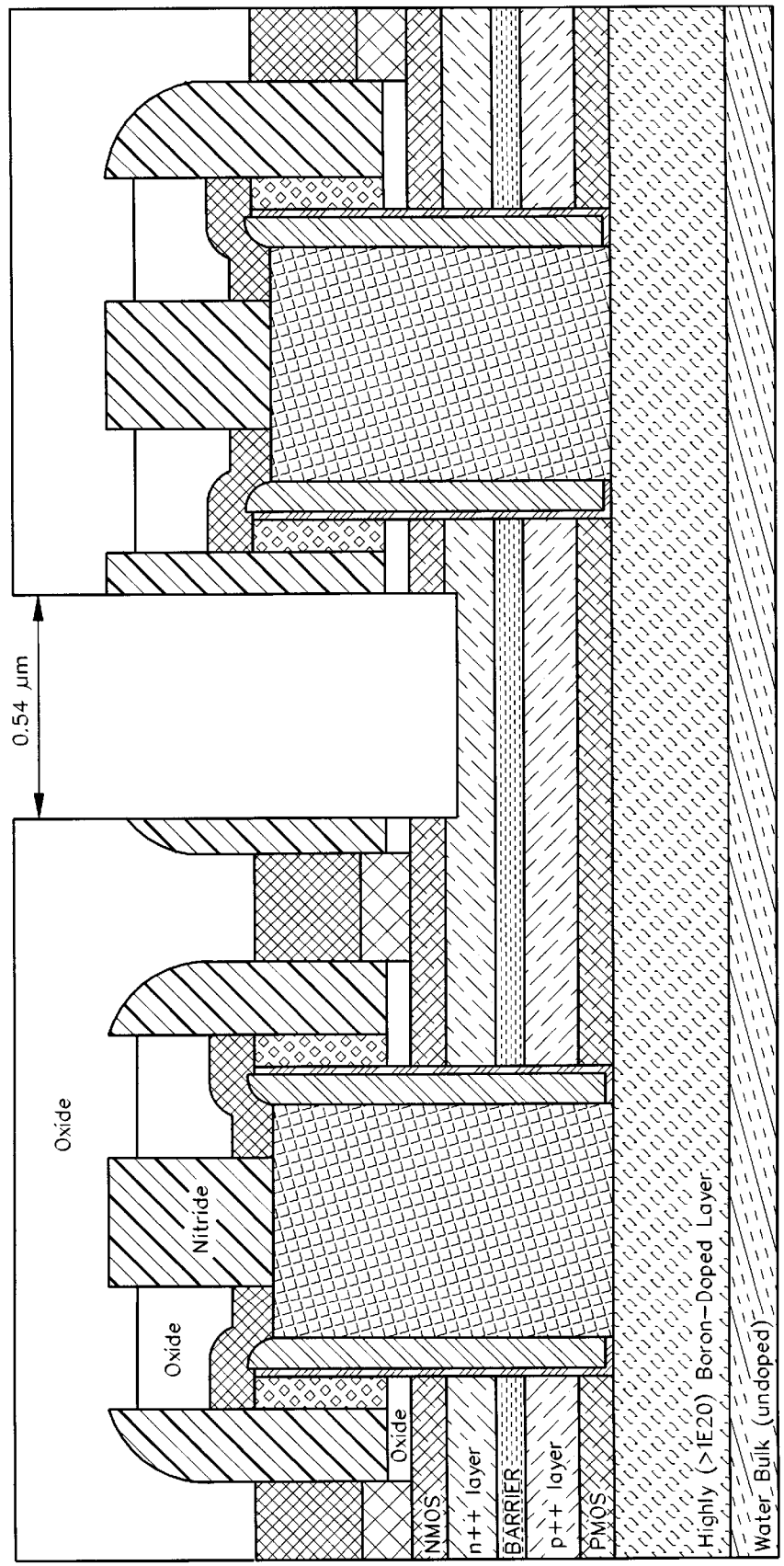
FIG. 7.6

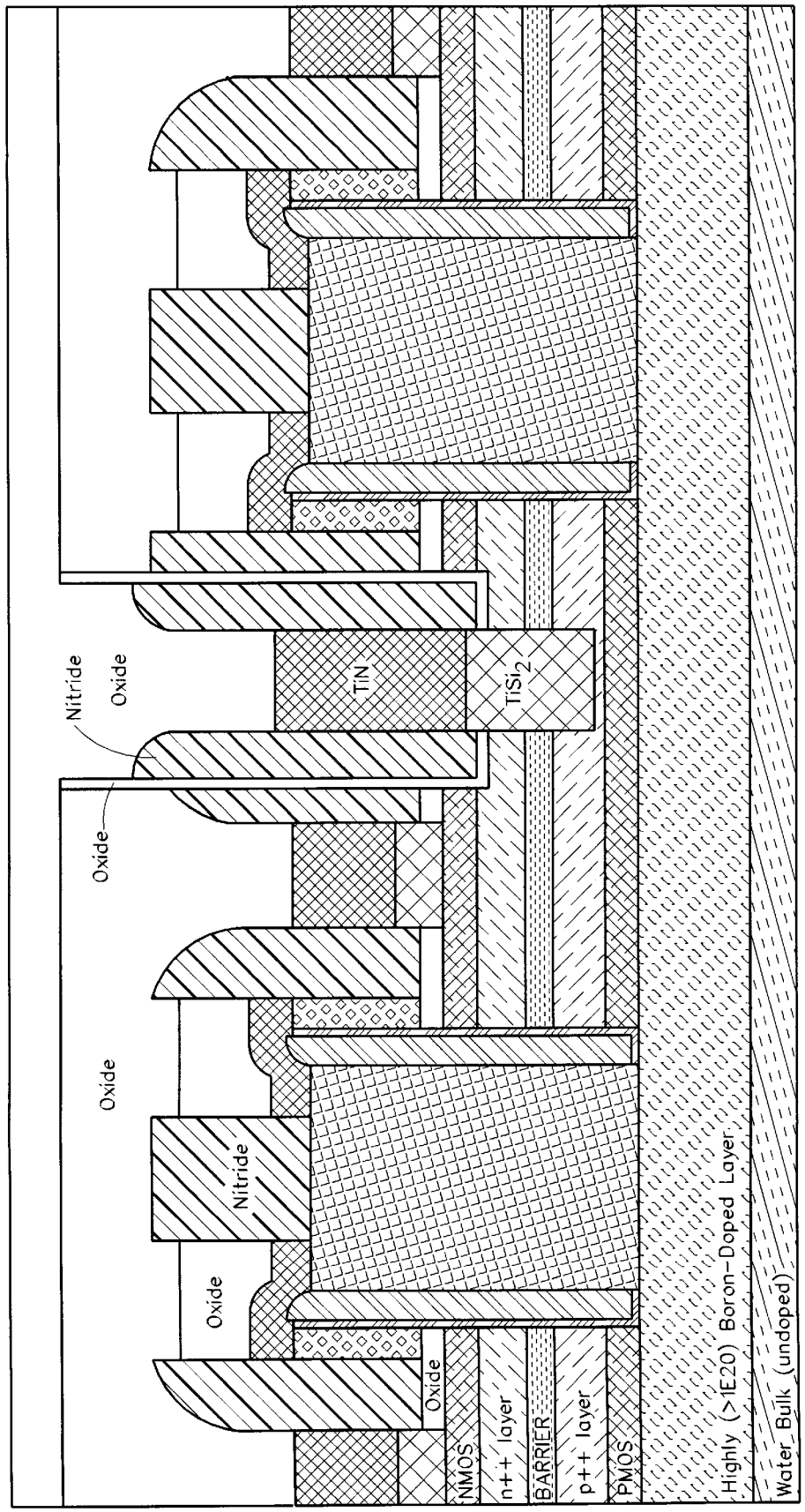
FIG. 7.7

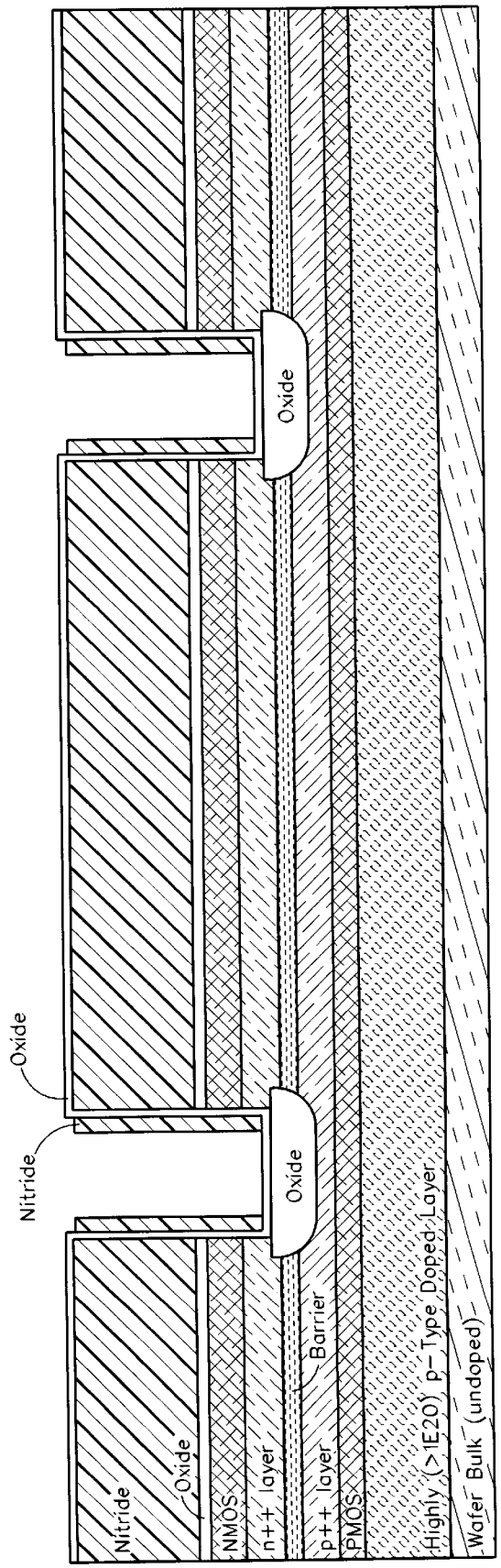
FIG. 8.1

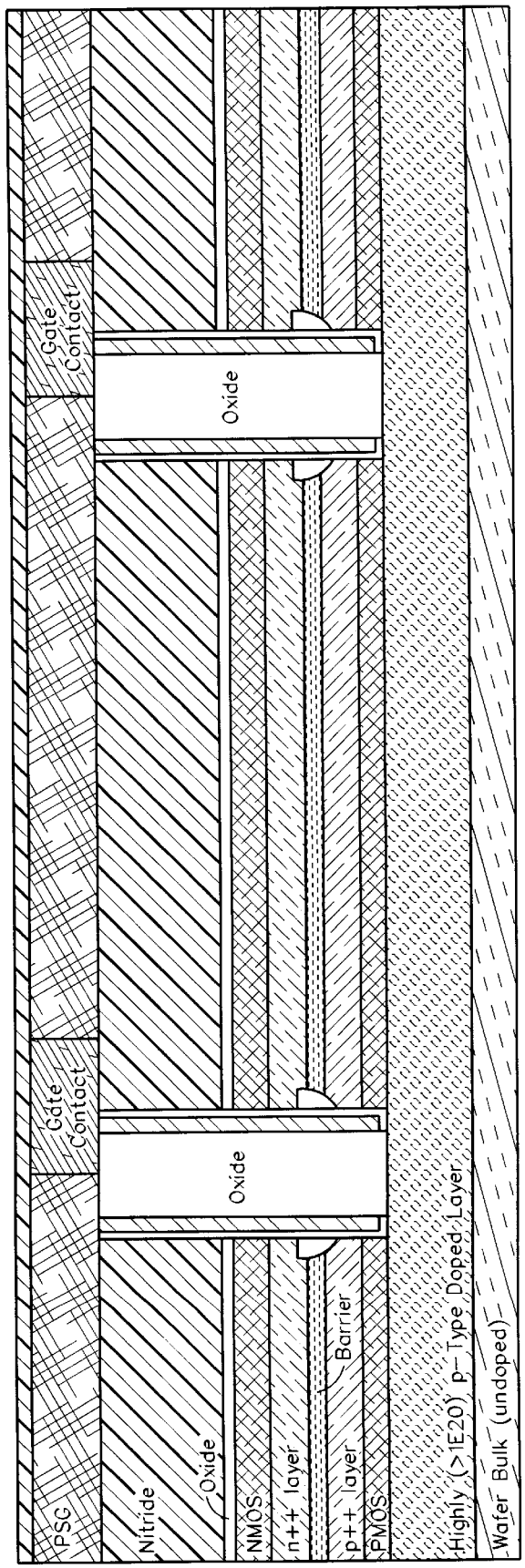
FIG. 8.2

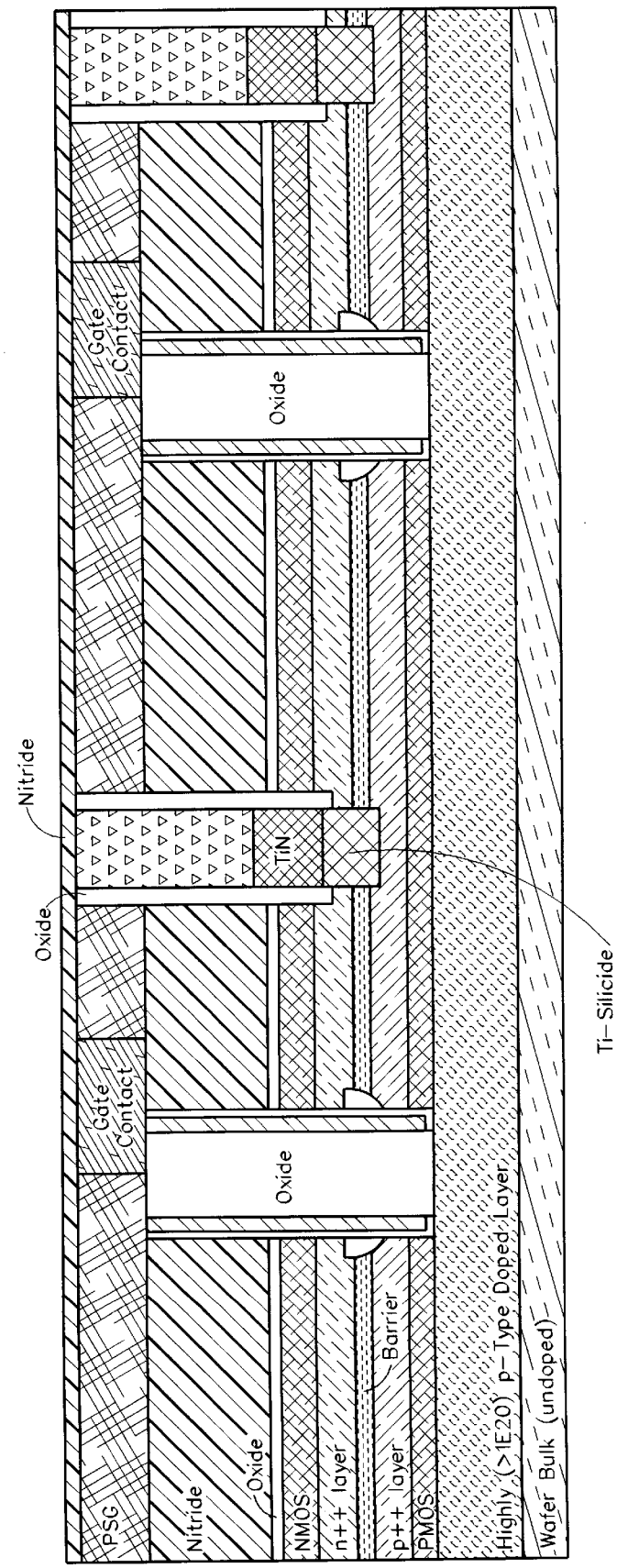
FIG. 8.3

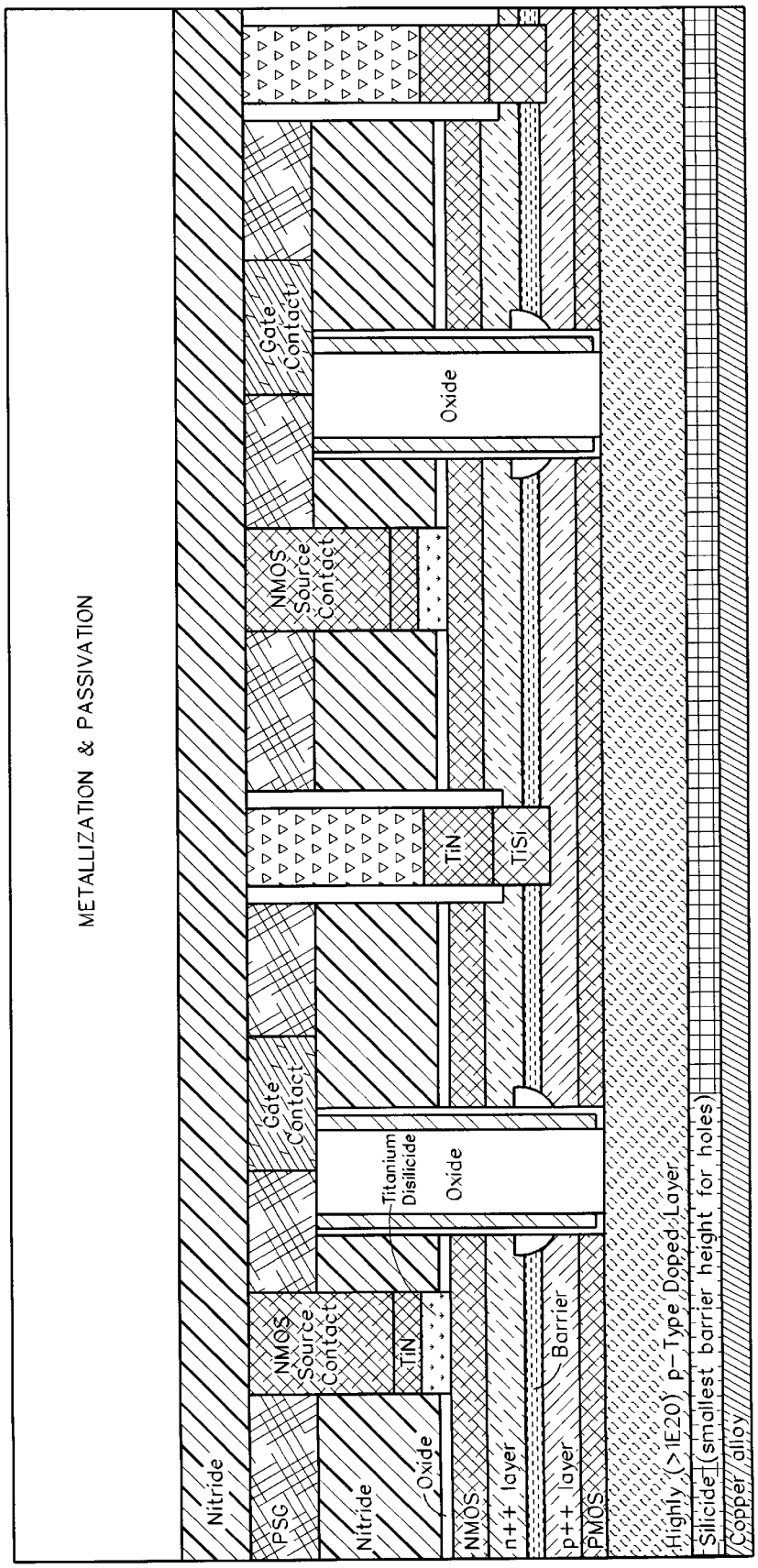
FIG. 8.4

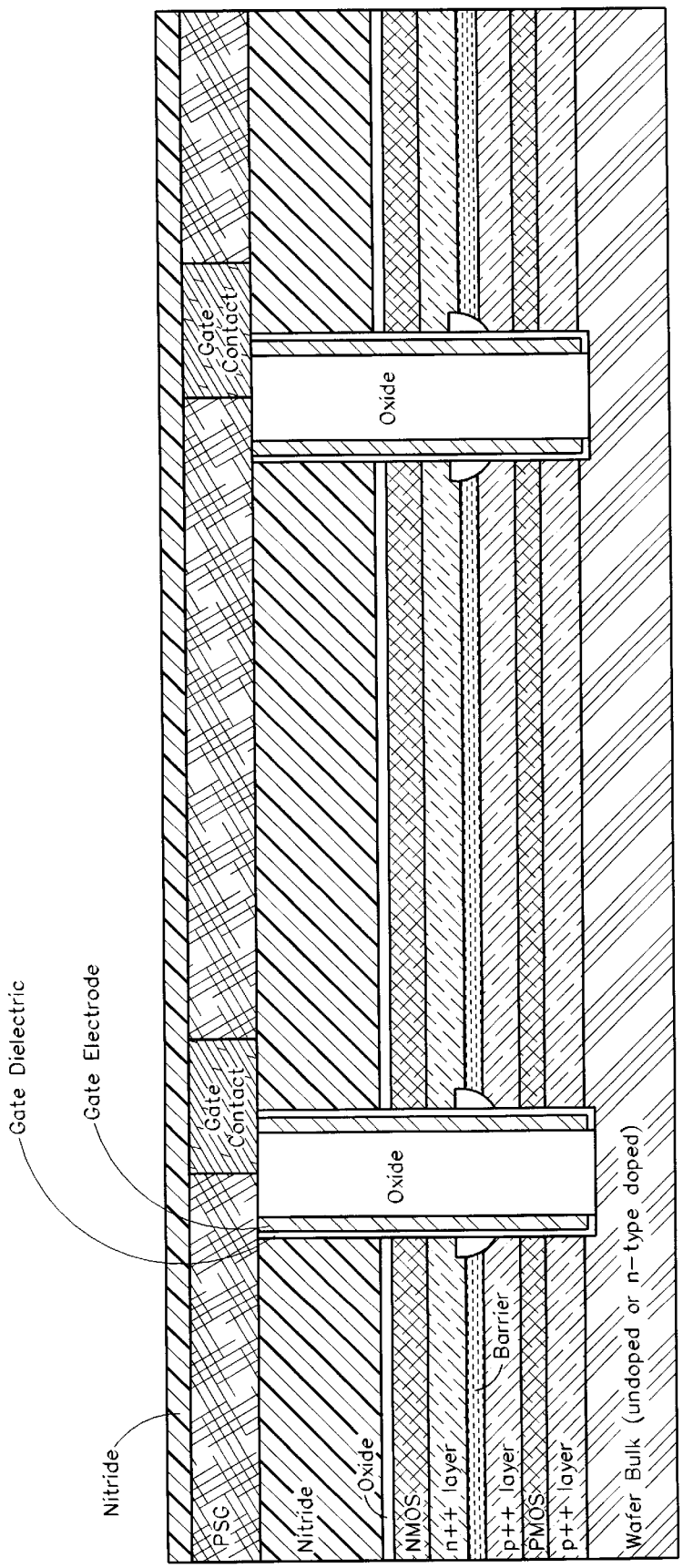
FIG. 9.1

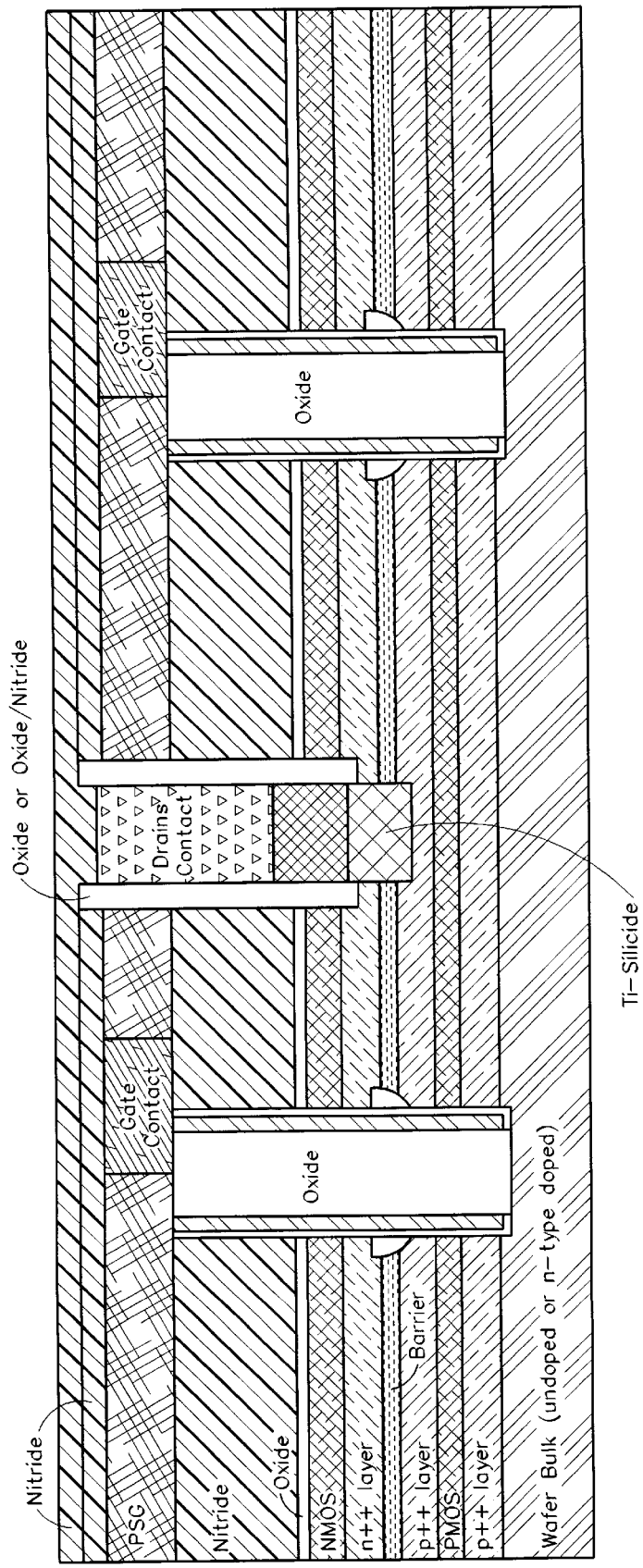
FIG. 9.2

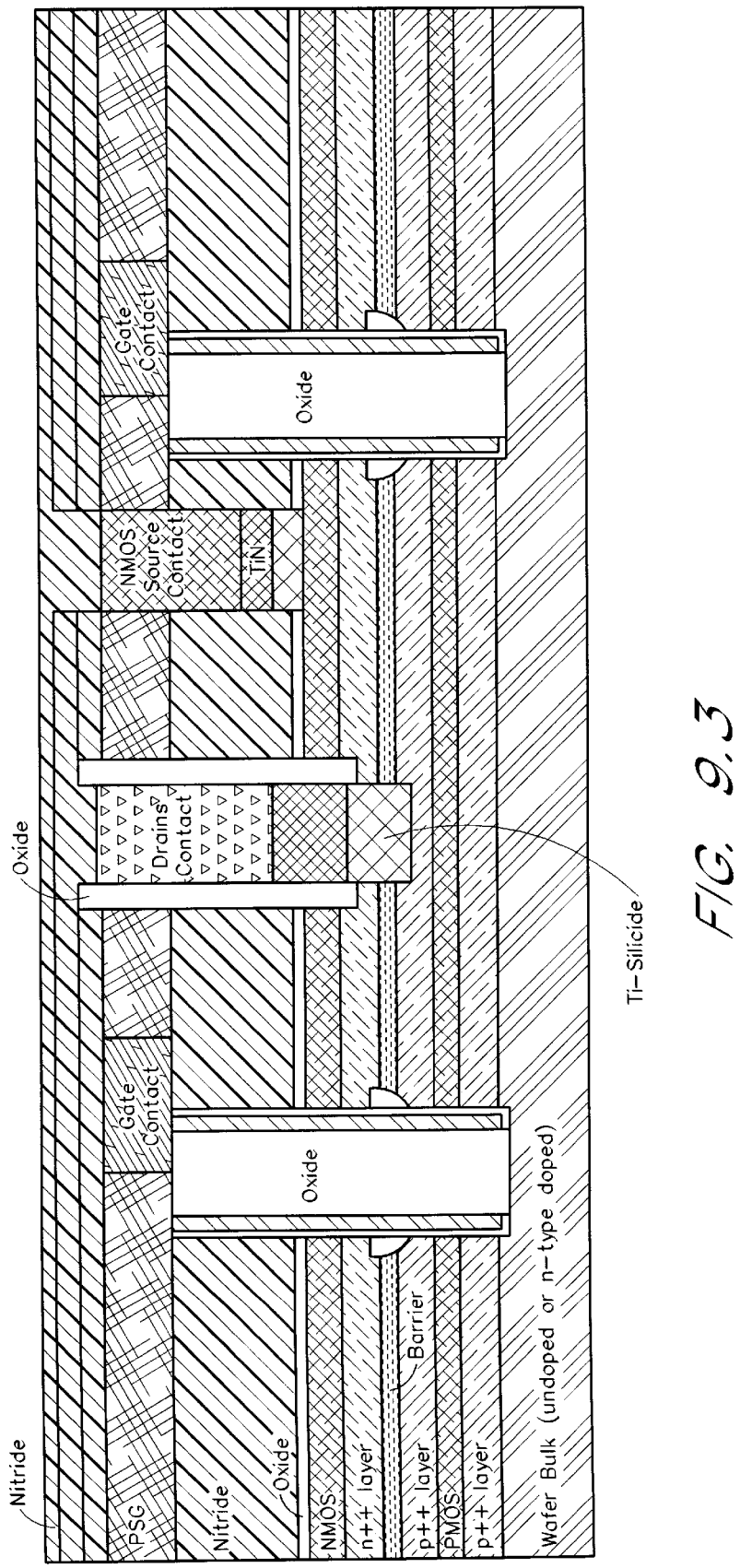
FIG. 9.3

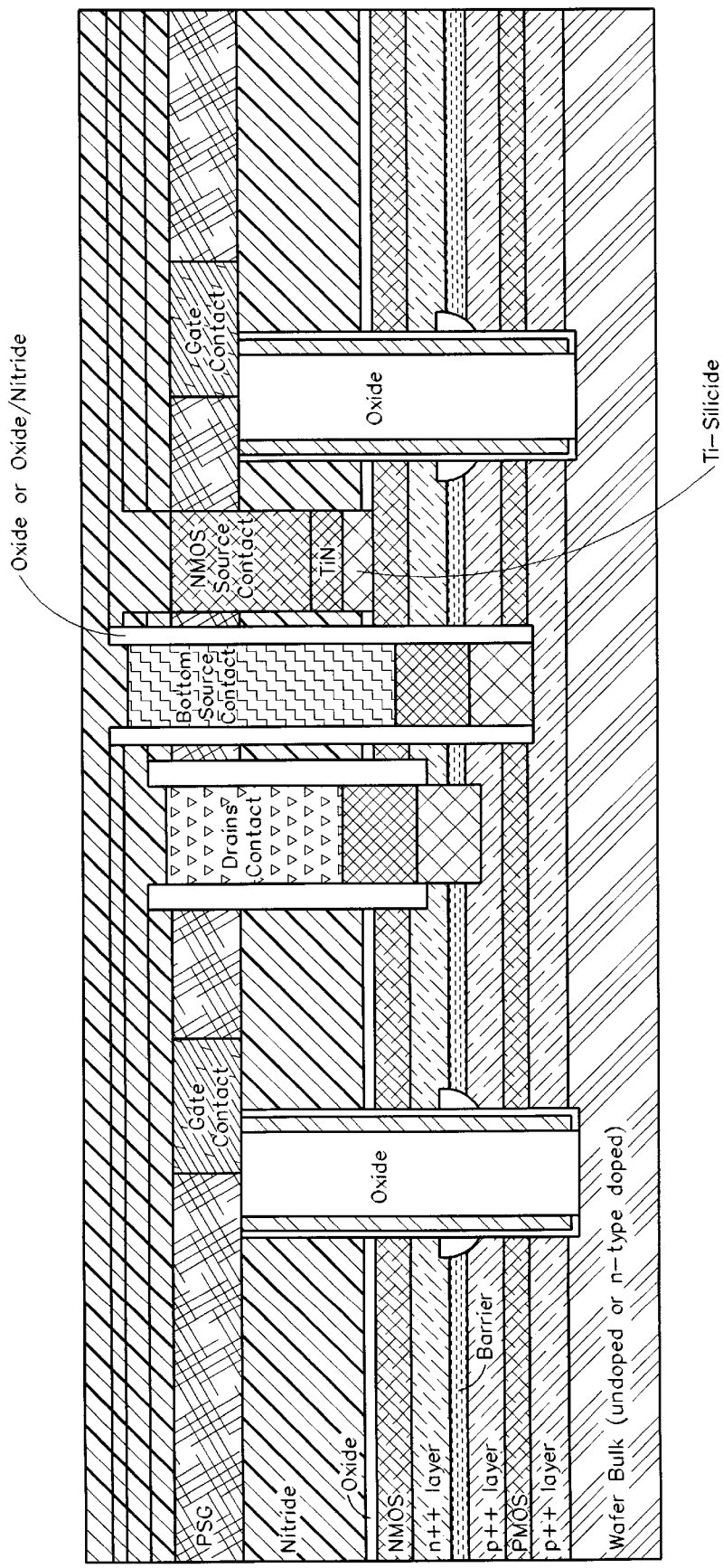
FIG. 9.4

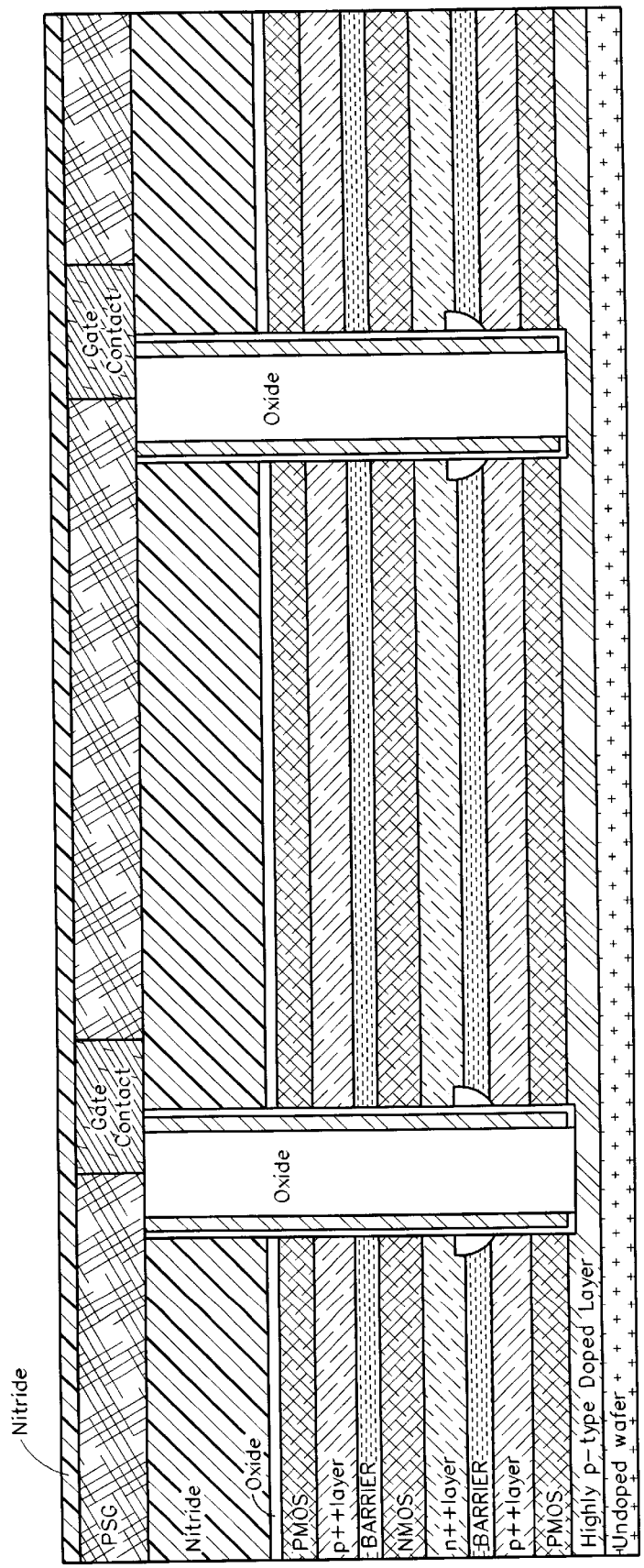
FIG. 10.1

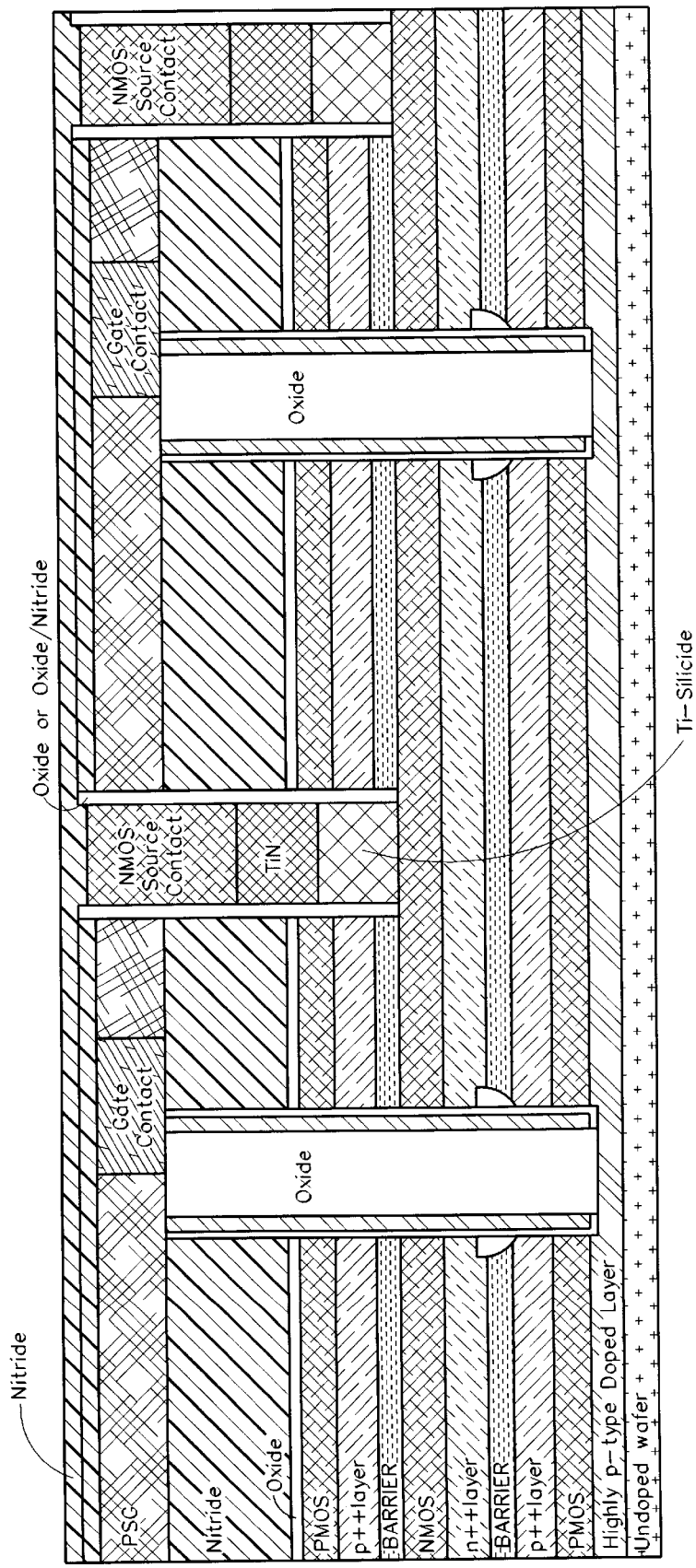
FIG. 10.2

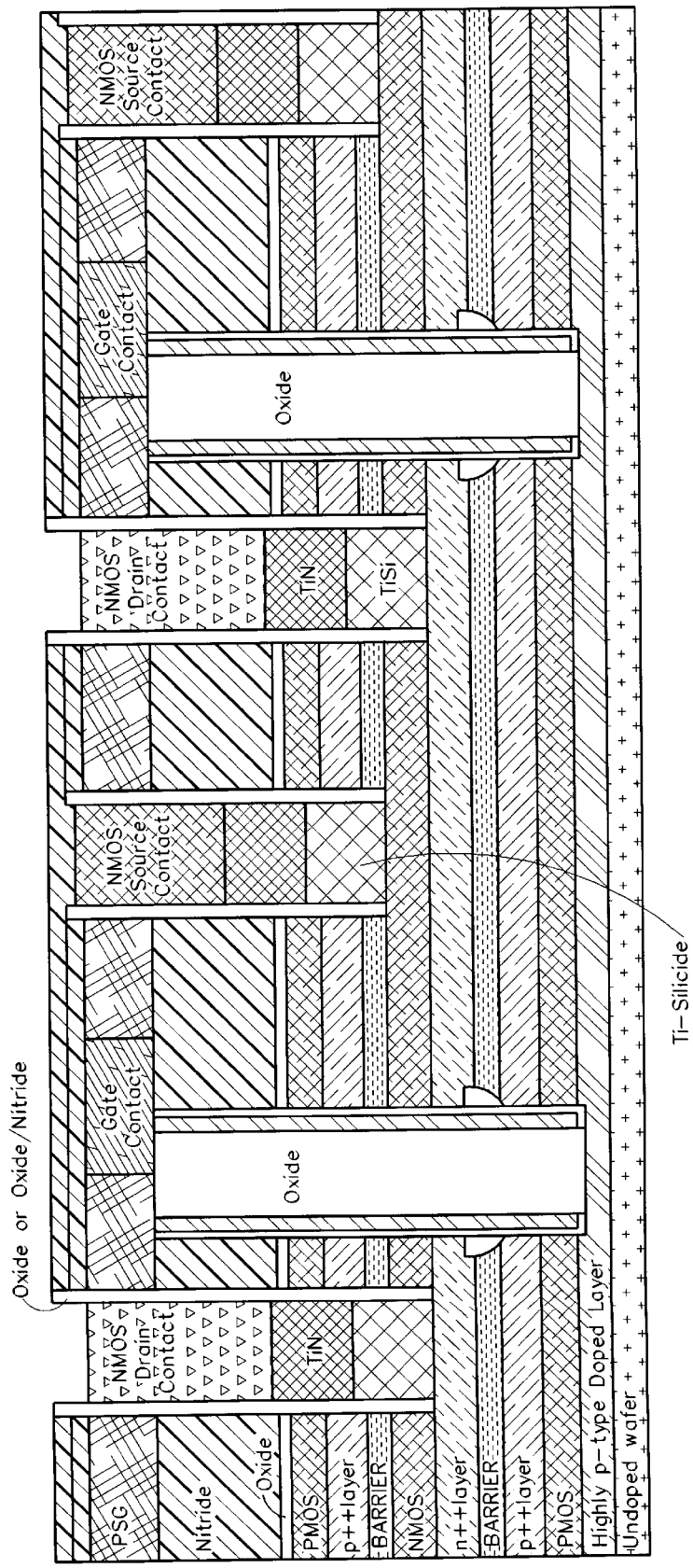
FIG. 10.3

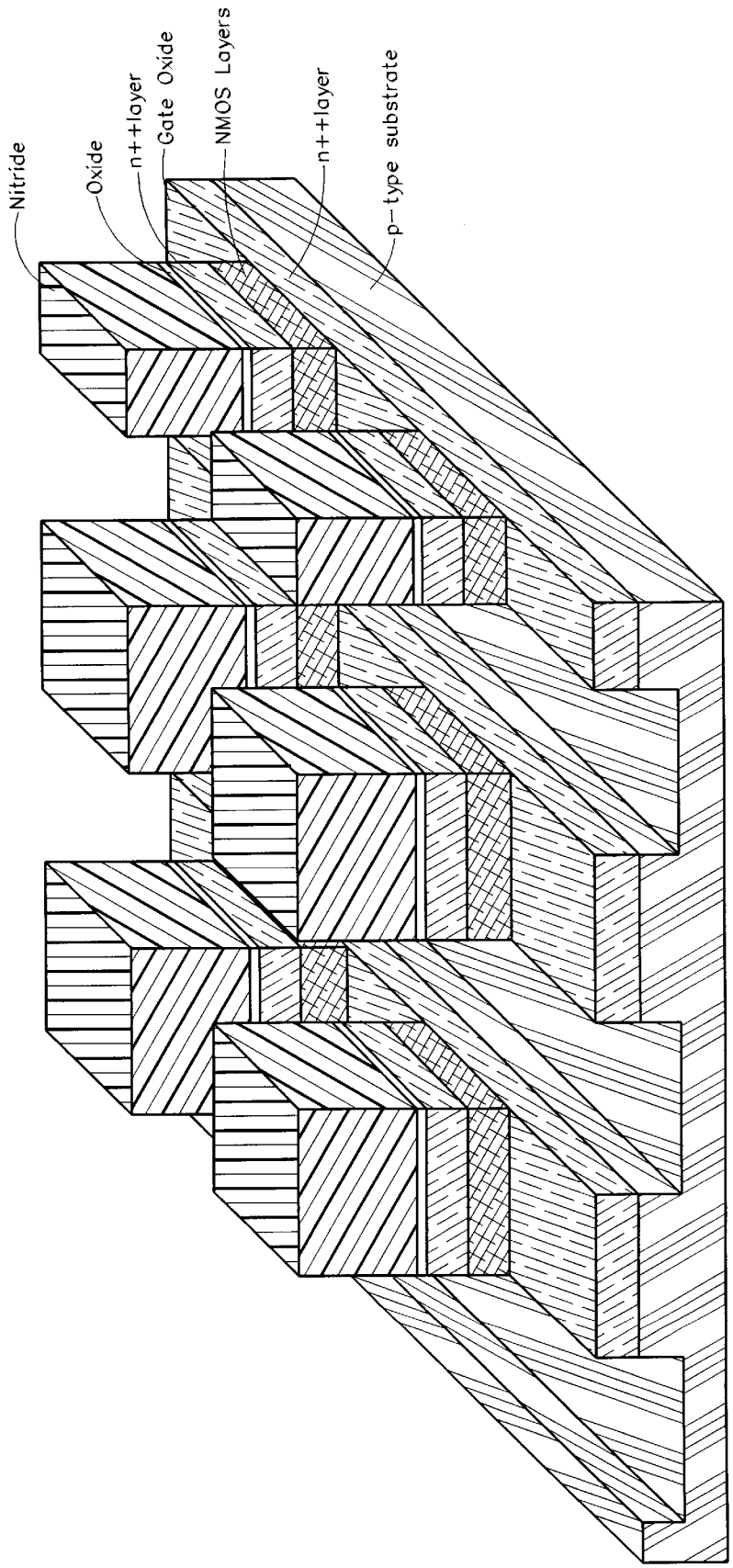
FIG. 12.1

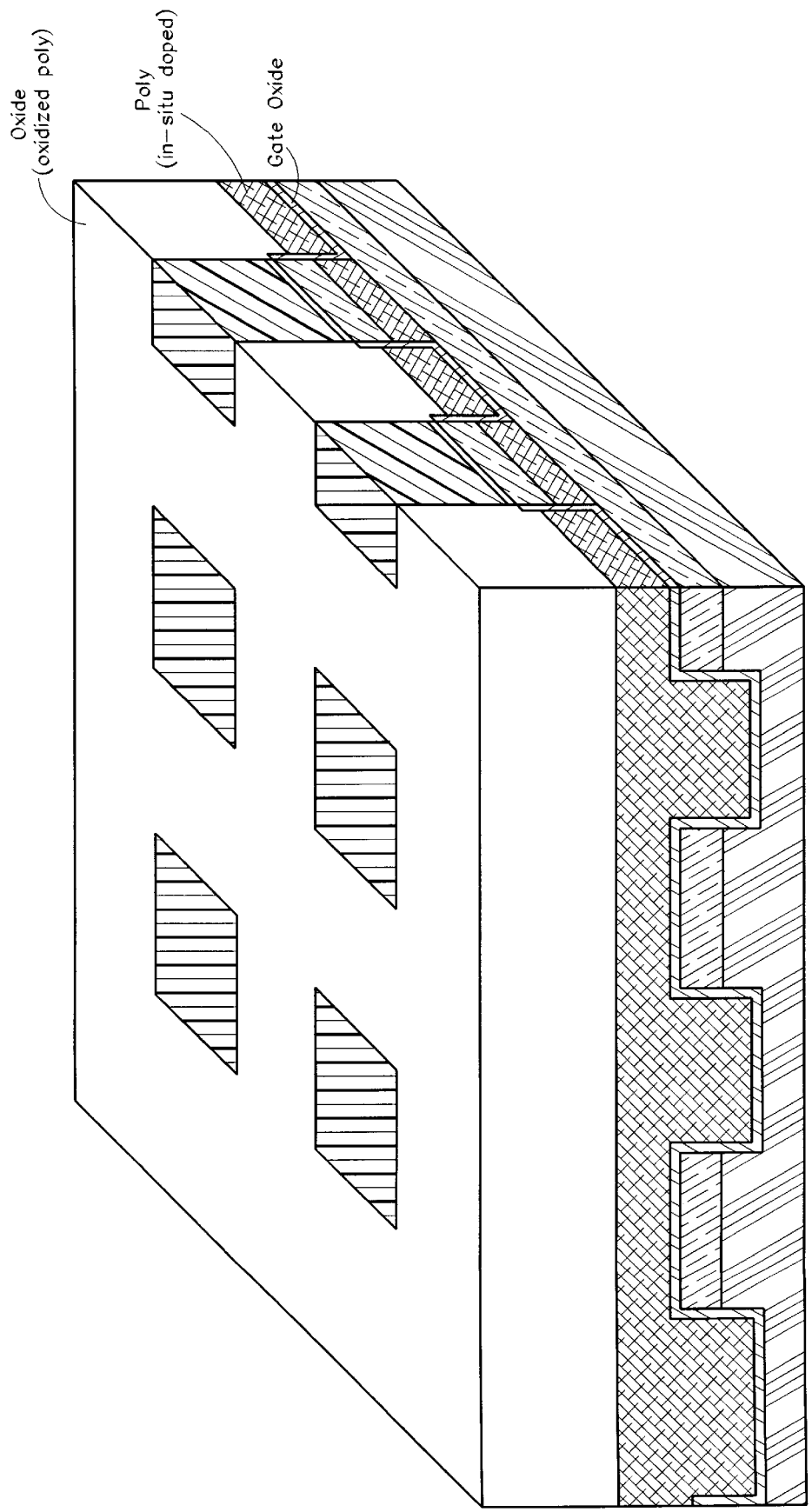
FIG. 12.2

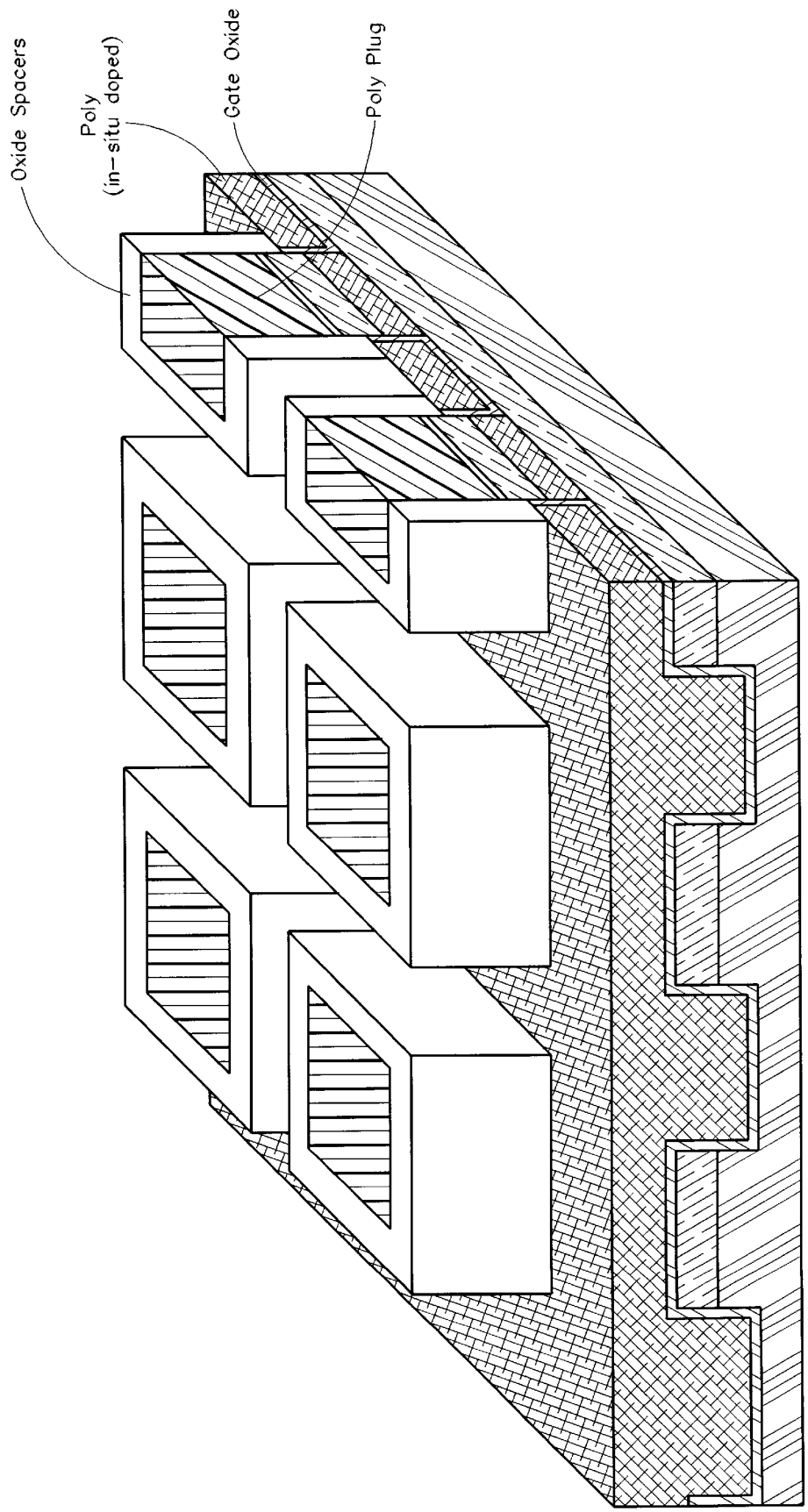
FIG. 12.3

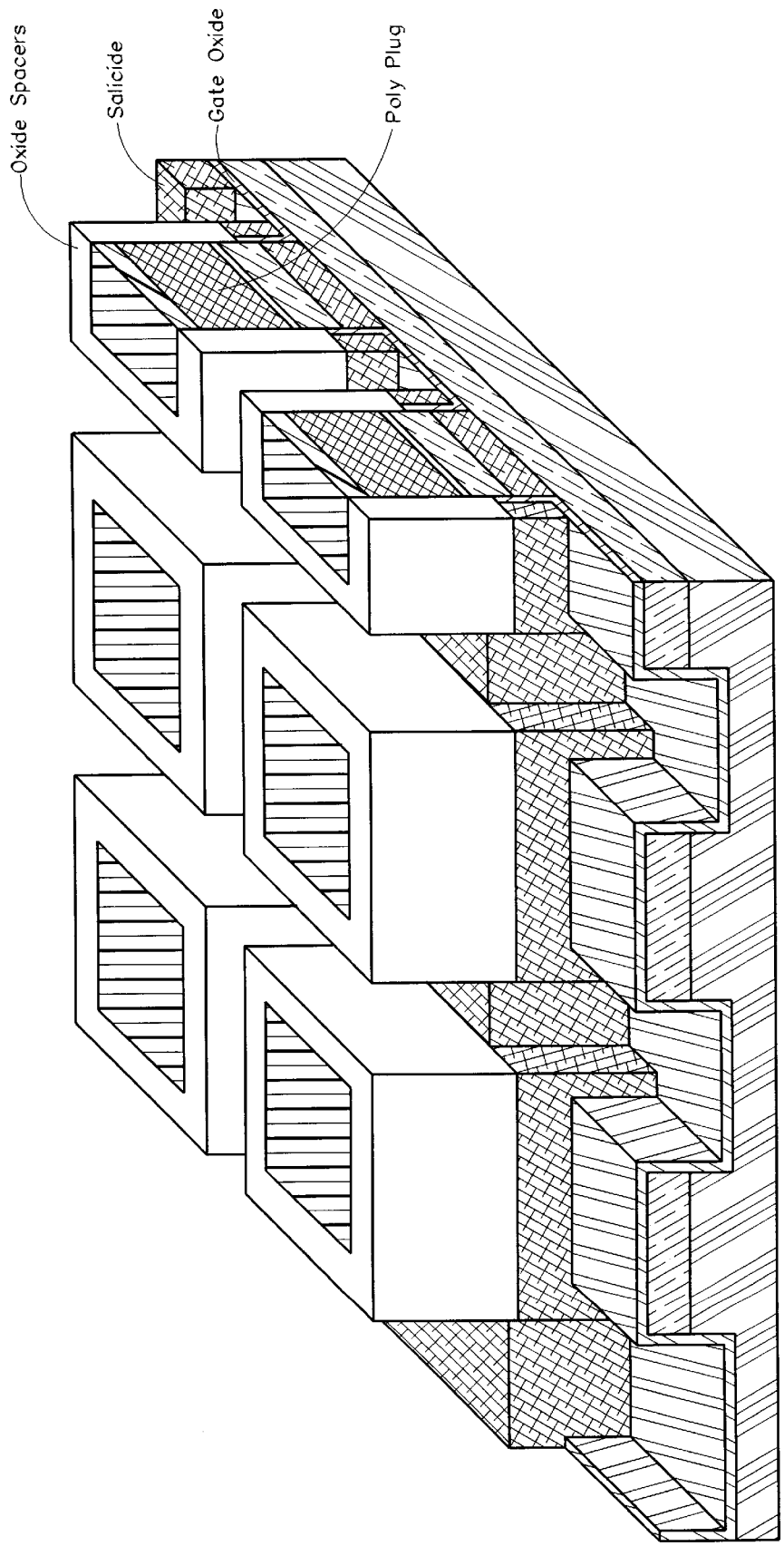
FIG. 12.4

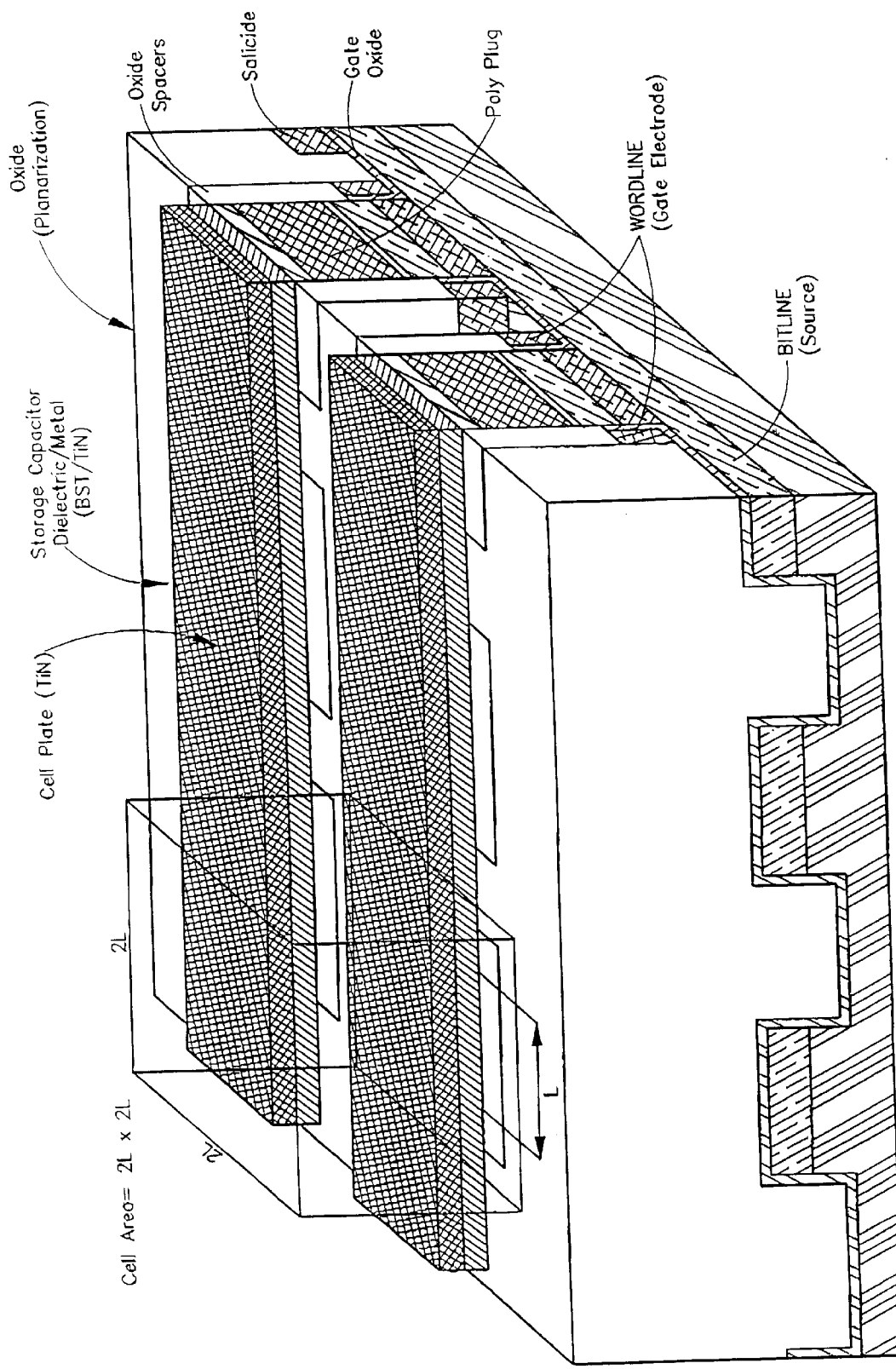
FIG. 12.5

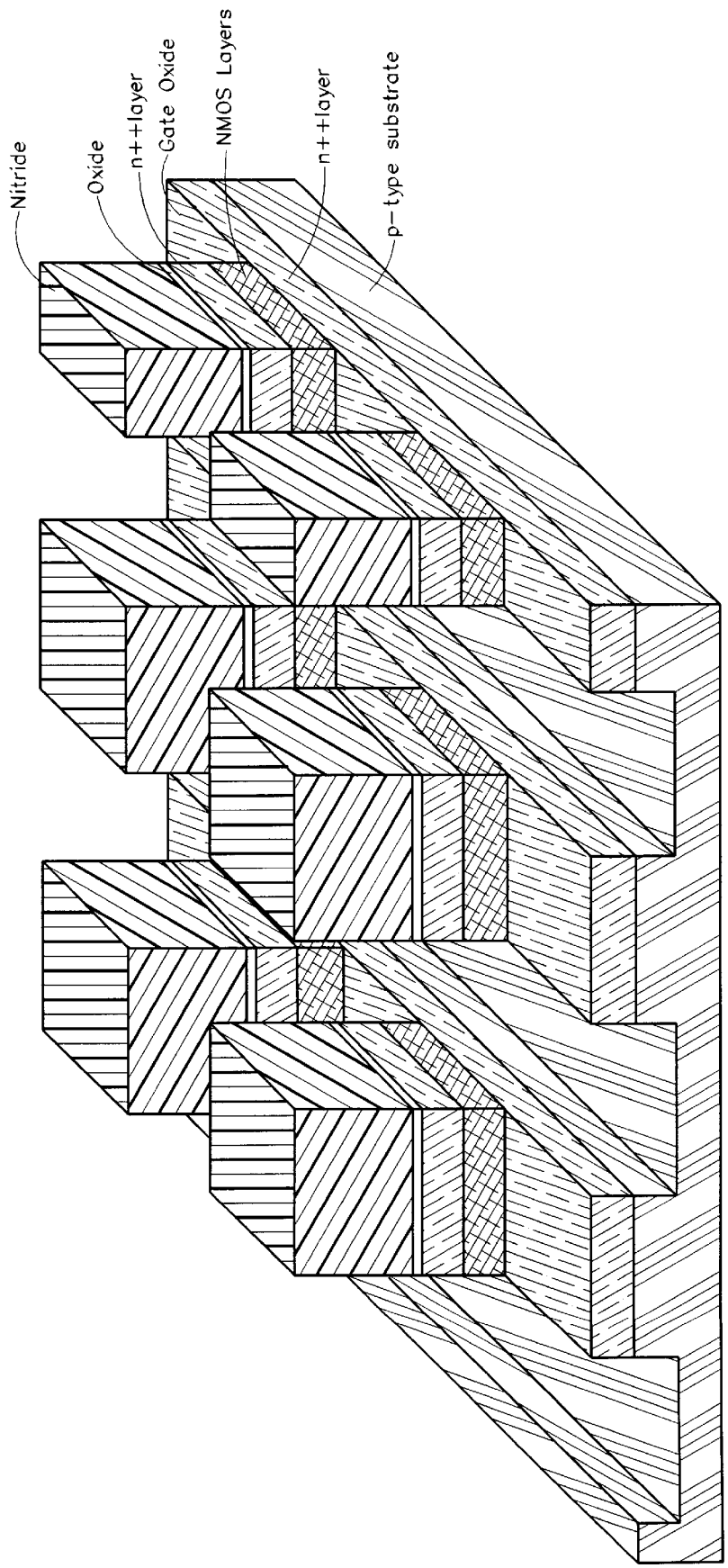
FIG. 13.1

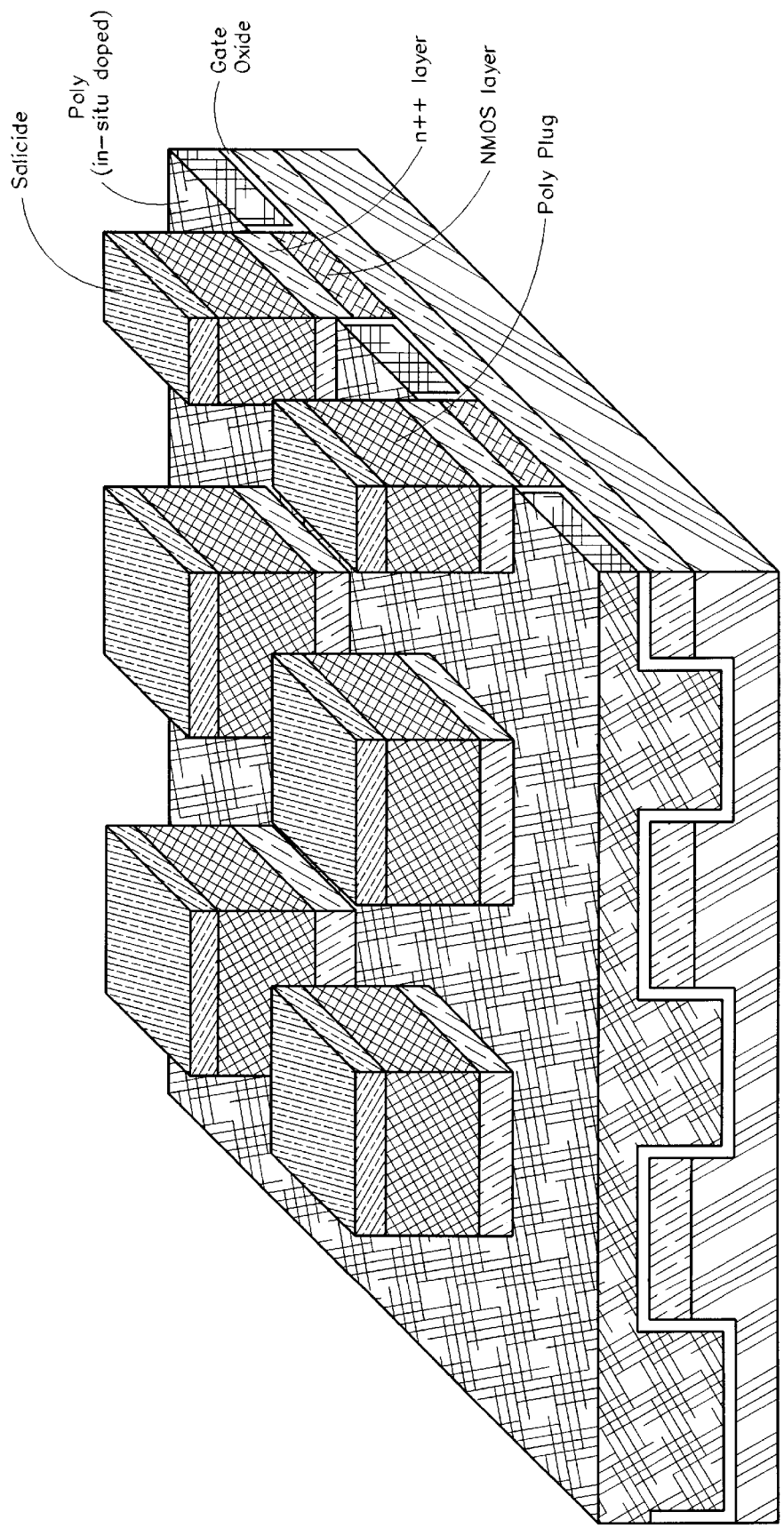
FIG. 13.2

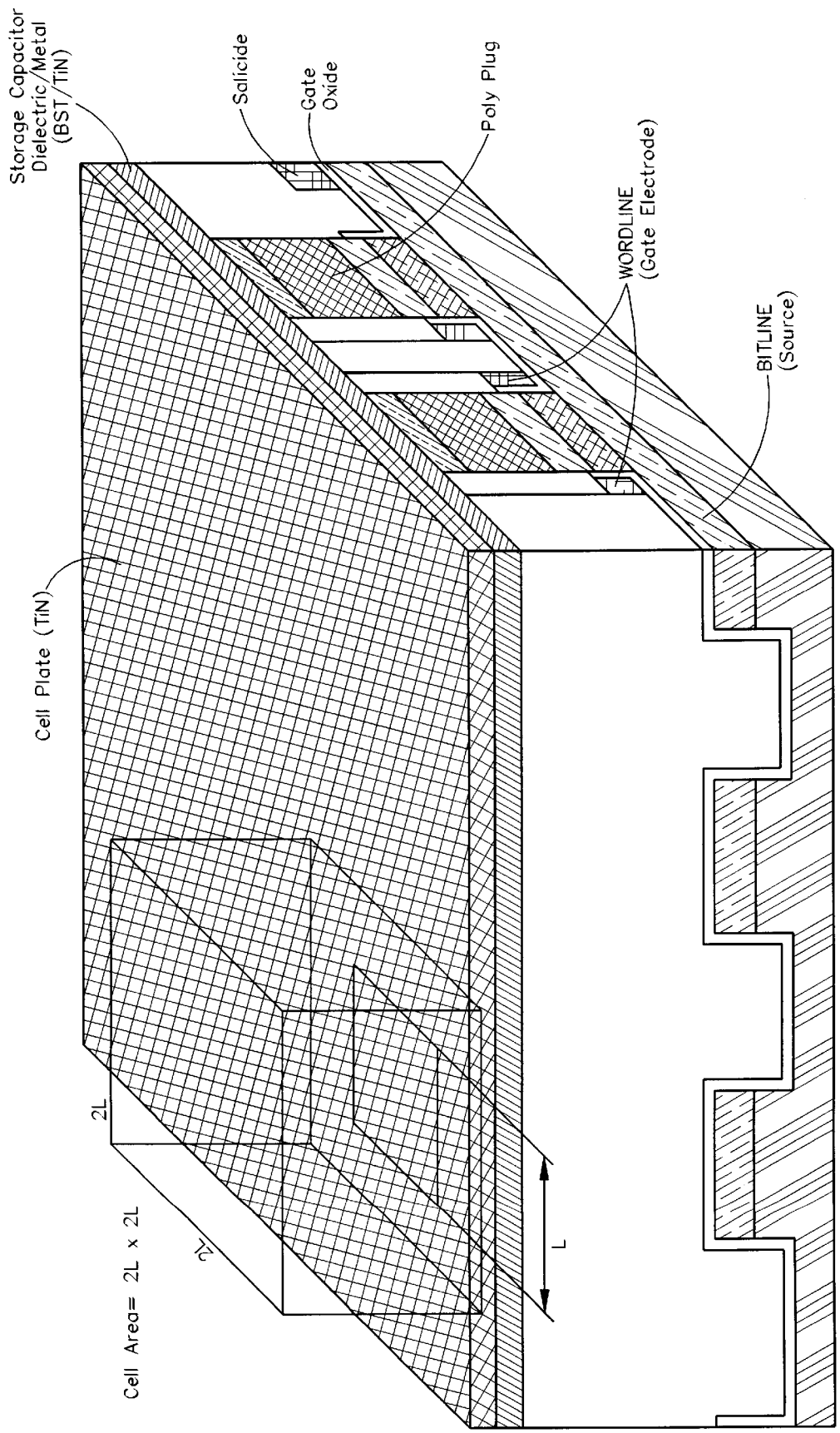
FIG. 13.3

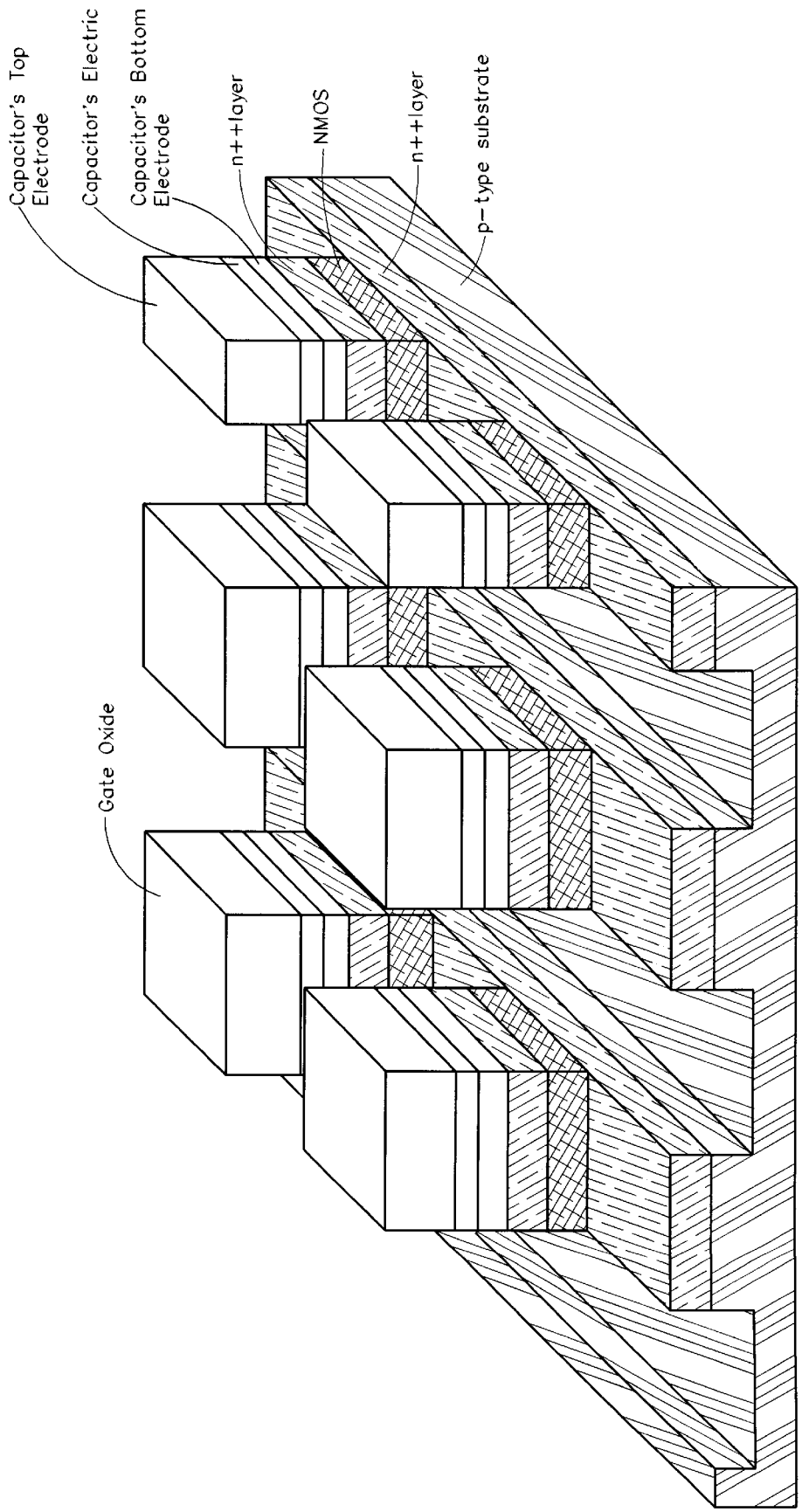
FIG. 14.1

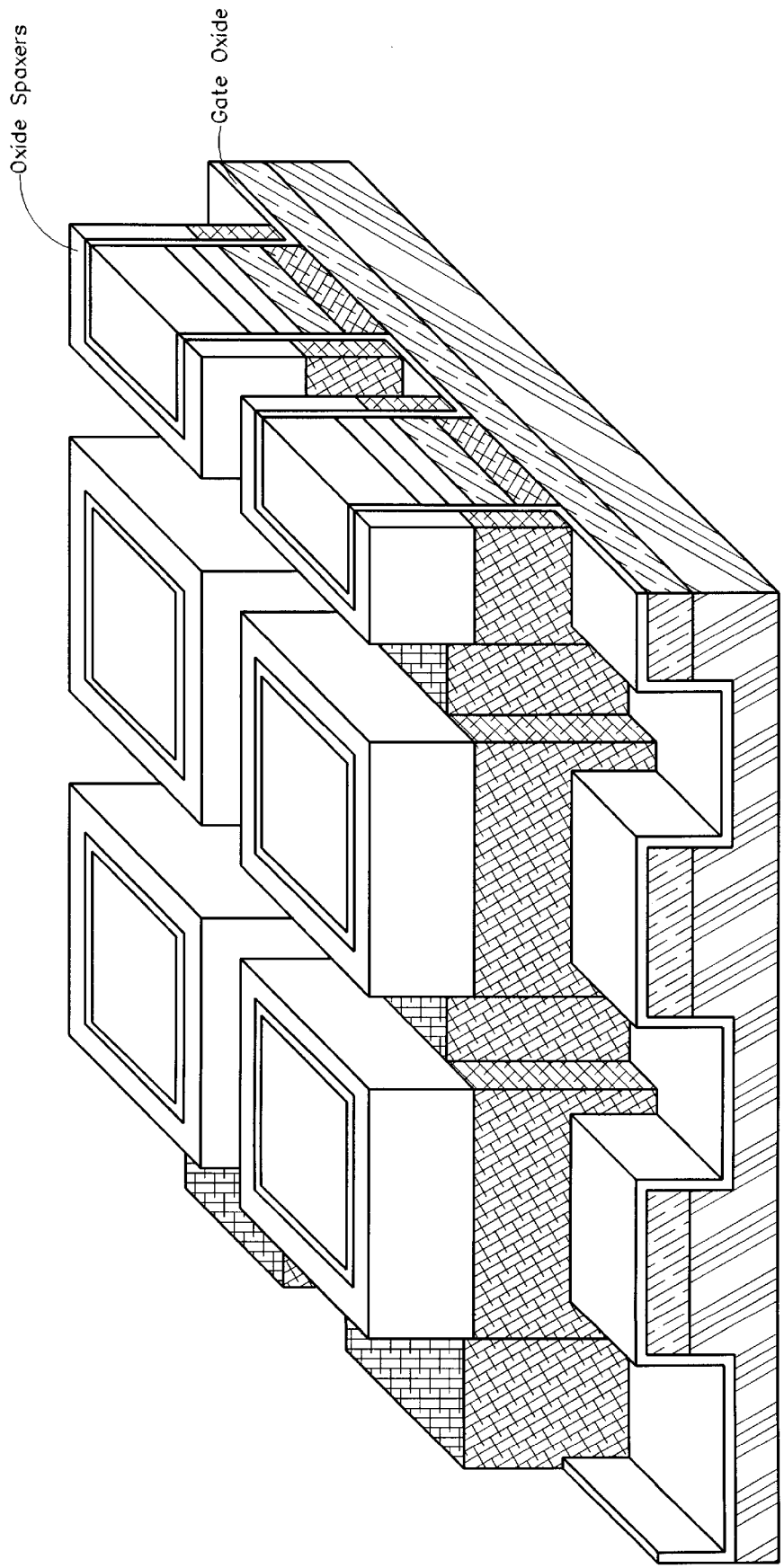
FIG. 14.2

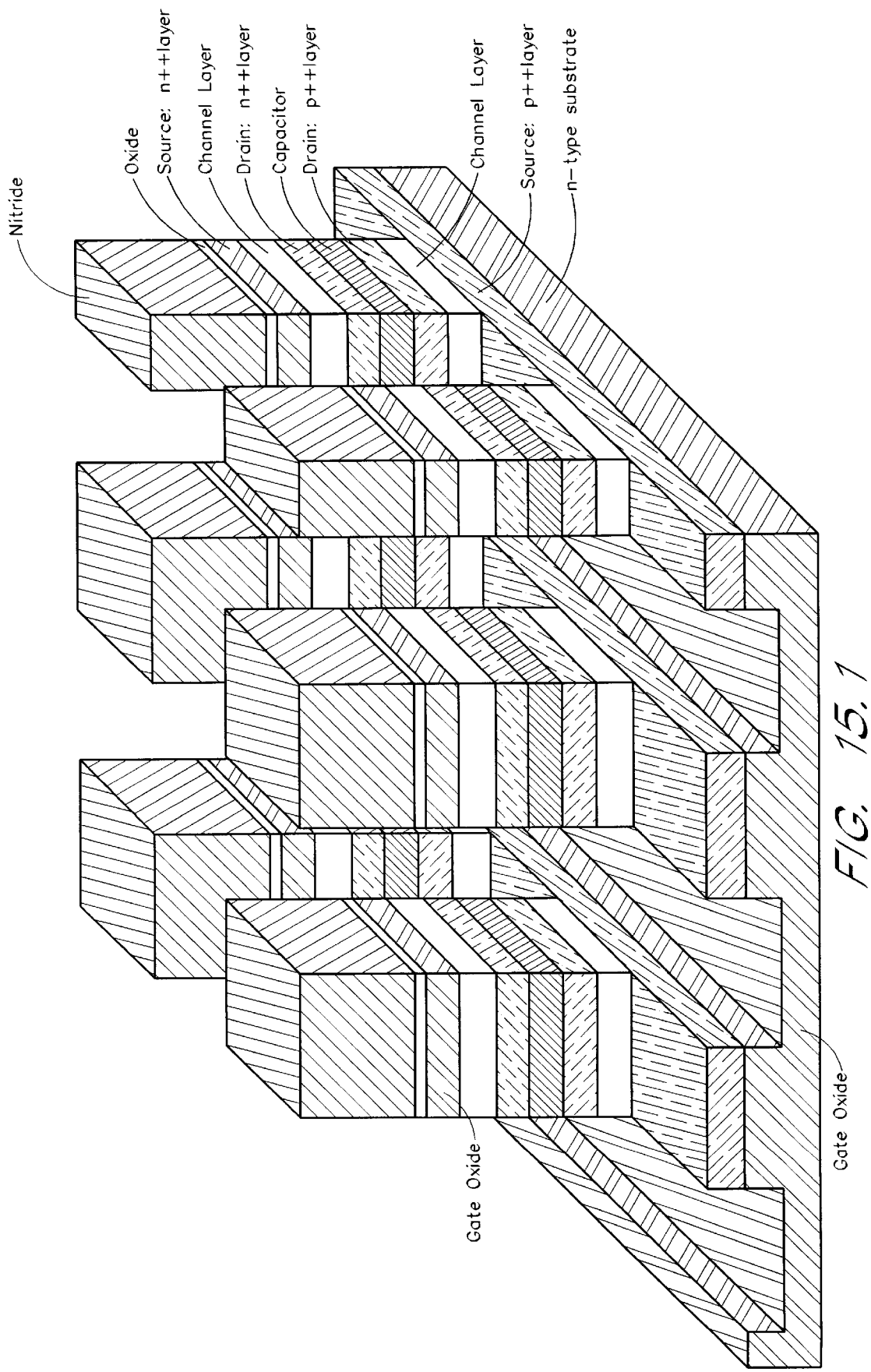
FIG. 15.1

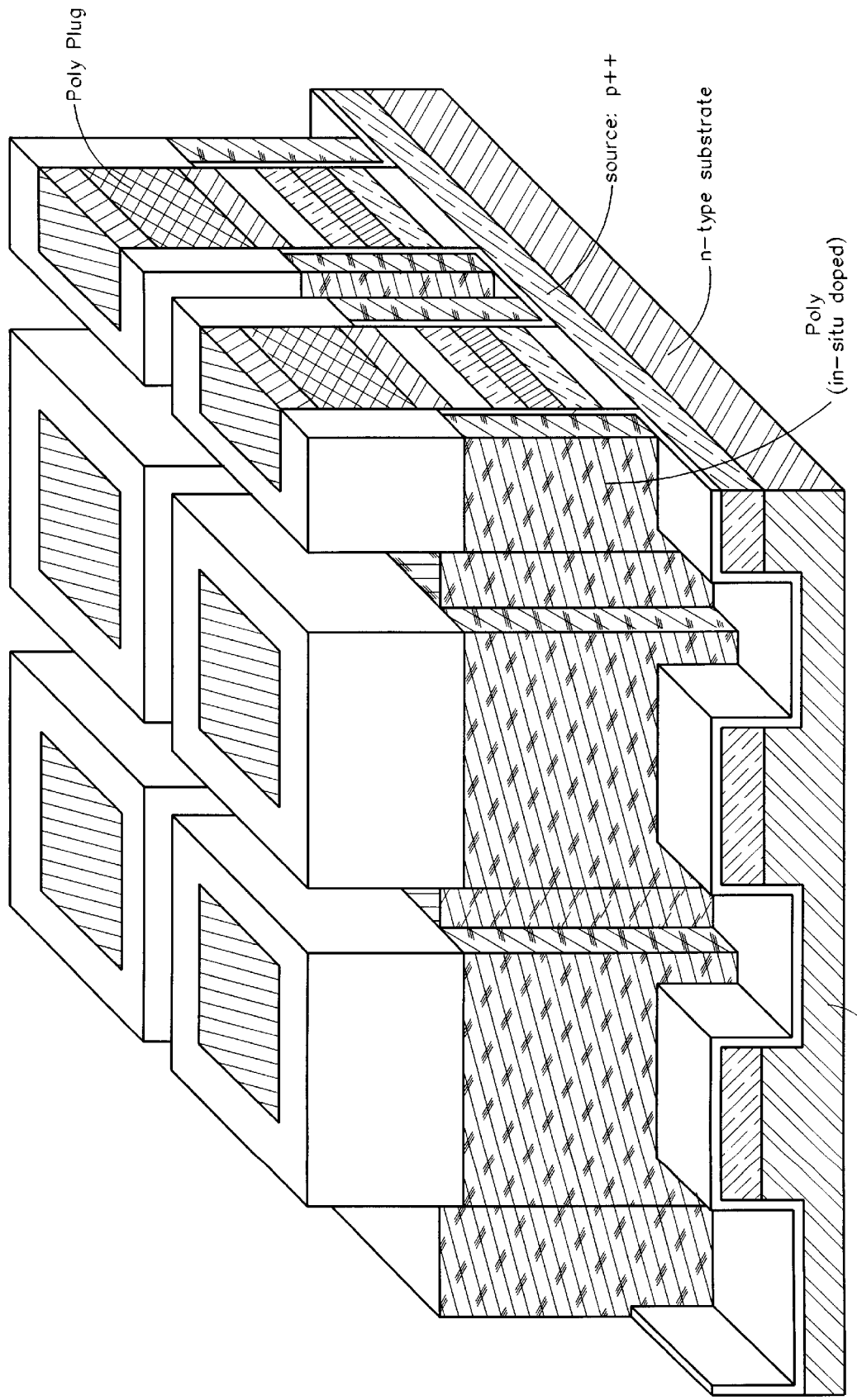
FIG. 15.2

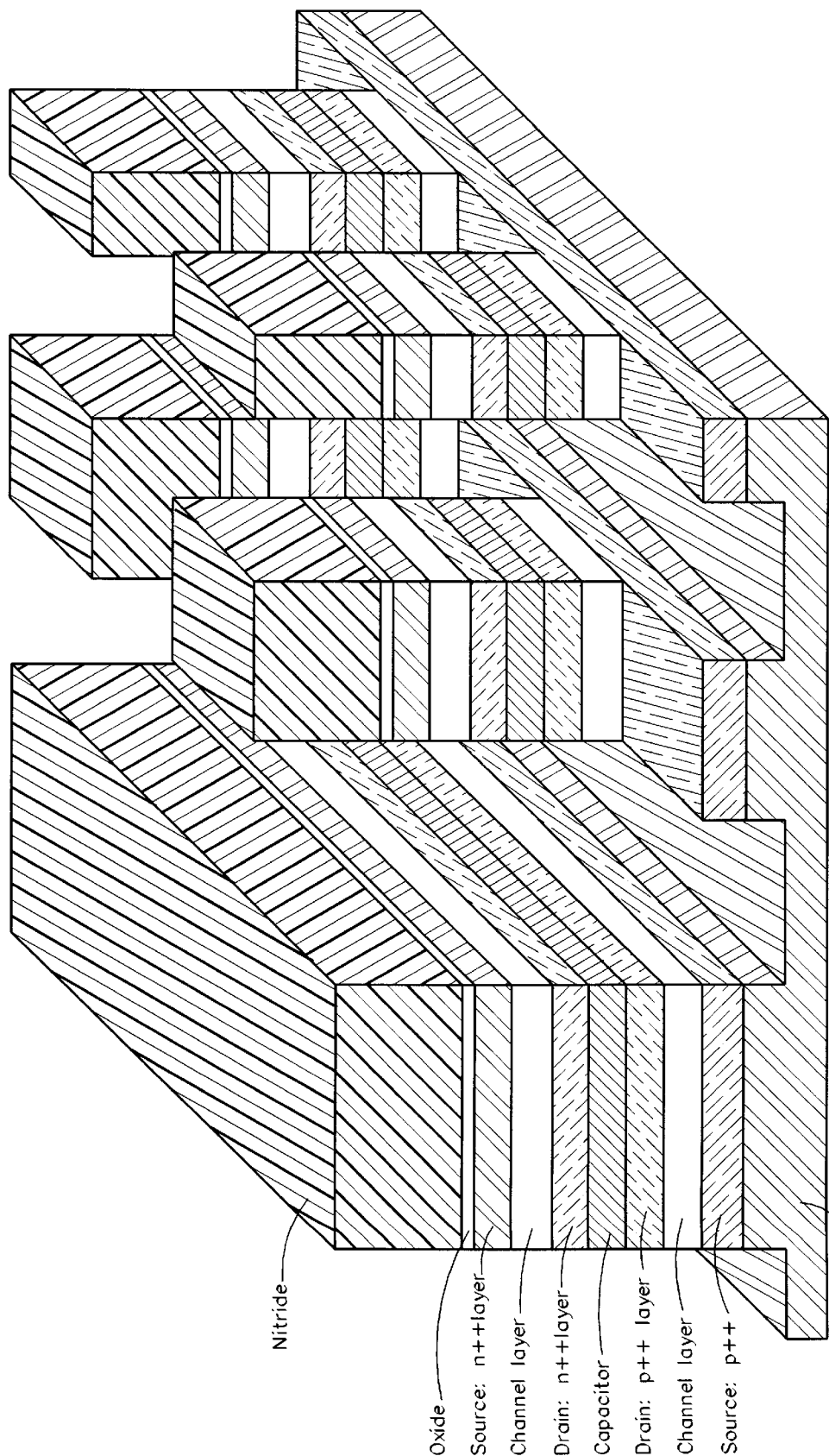
FIG. 16.1

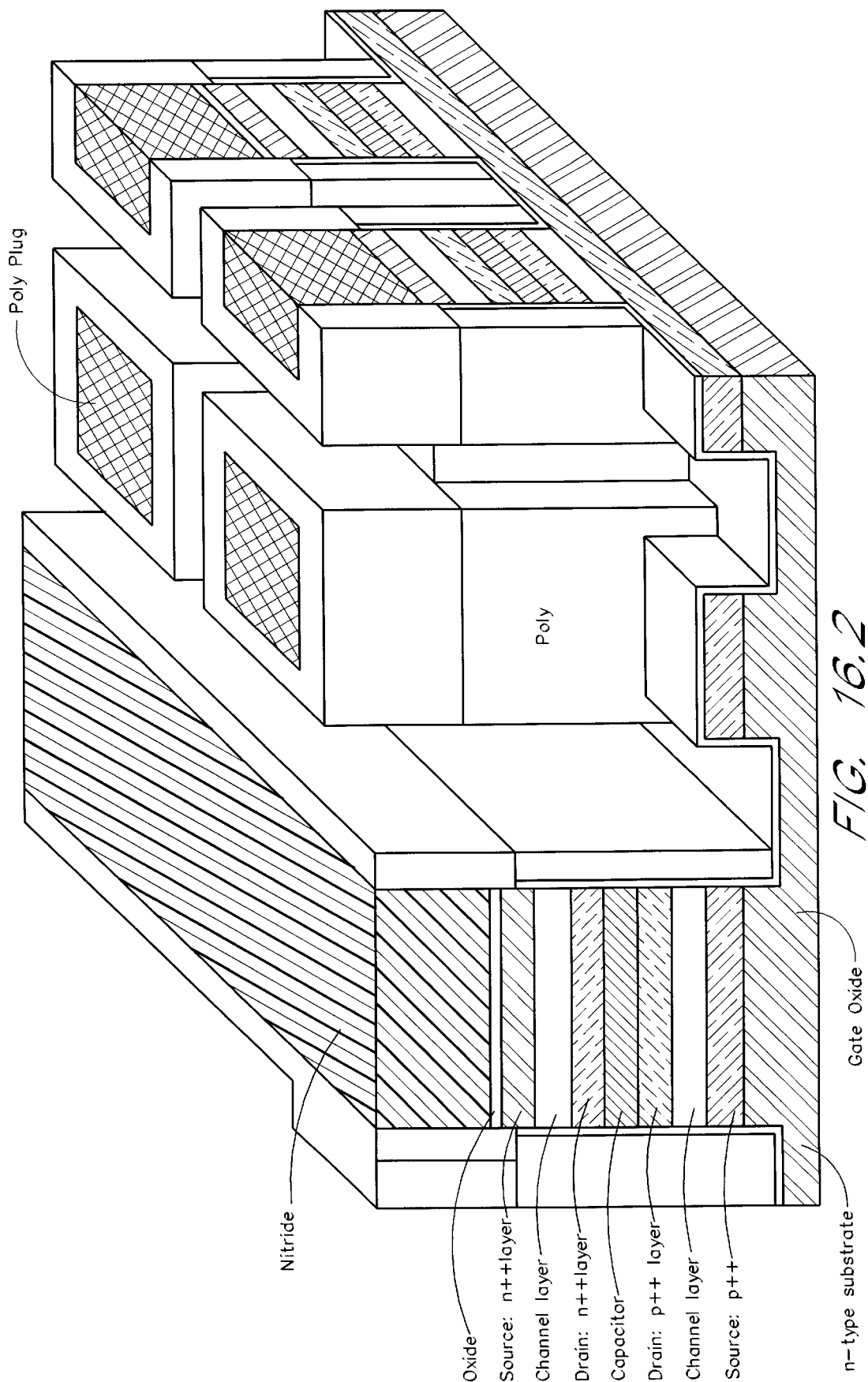
FIG. 16.2

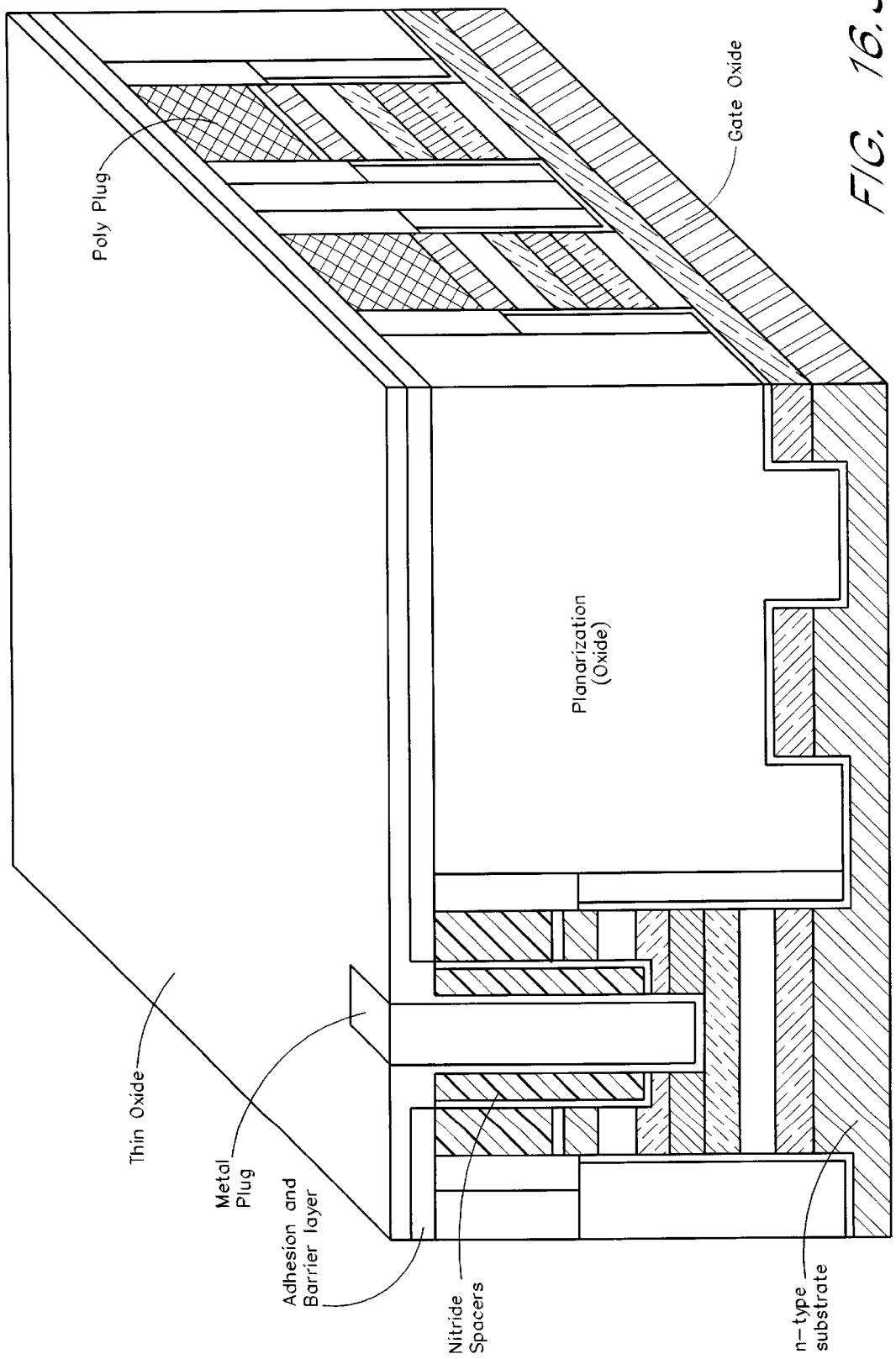
FIG. 16.3

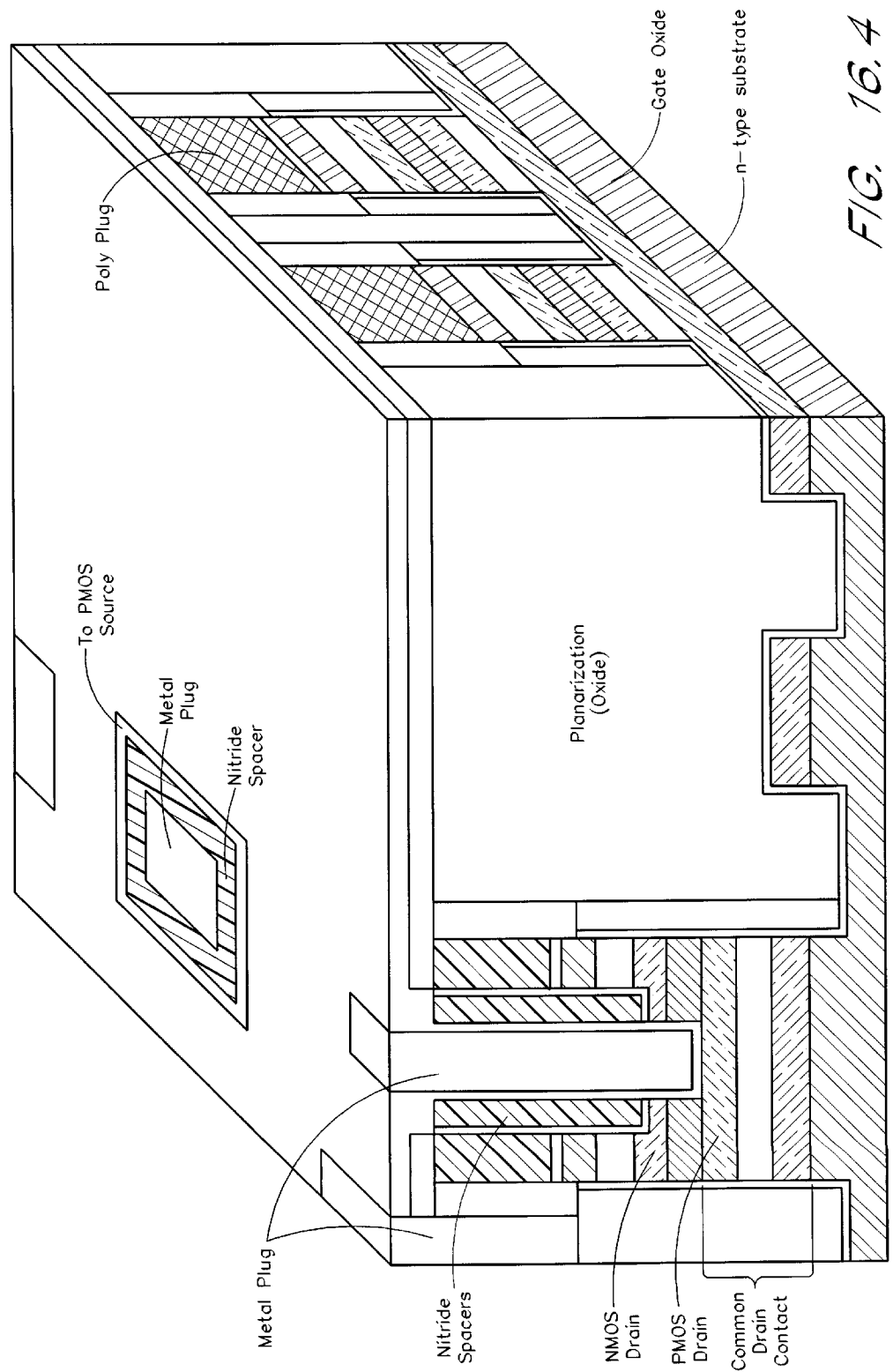
FIG. 16.4

CM OS INTEGRATION PROCESS HAVING VERTICAL CHANNEL

RELATED APPLICATIONS

The present application claims priority from European application EP 95870071.8 filed Jun. 16, 1995, U.S. Provisional Application No. 60/001,022 filed Jul. 11, 1995, and U.S. Provisional Application No. 60/010,476 filed Jan. 23, 1996.

BACKGROUND OF THE INVENTION

The microelectronics industry, owes its success to the relentless technological progress of the micro-fabrication processes. These fabrication processes have allowed the critical dimensions of electronic devices be decreased to the deep submicrometer levels. In this size range, the MISFET (Metal-Insulator-Semiconductor-Field Effect Transistor) and preferably the MOSFET (Metal-Oxide Semiconductor-Field-Effect-Transistor) device is the preferred type of device, because it offers the best compromise between speed, size, power dissipation, and production cost.

Lithography has been the technology driver of all other processing steps. In fact, it has been the limitation for making smaller transistors, because the other process steps could easily be scaled to smaller dimensions.

The advantages of patterning smaller features are twofold: smaller design rules, for a given area, mean more devices, and smaller devices are faster and dissipate less power.

Up to now, very small planar transistors are fabricated with experimental techniques which are not suitable for production. It is not yet clear if they will ever be. There are also device physics problems for their operation at room temperature. Because the issues being faced now are of unprecedented difficulty, the evolutionary approach (or incremental engineering) seems unable to deliver solutions for at least some of the problems. These problems are of different natures: device physics, new fabrication techniques demanding new types of processing equipment, and economics.

Making Si MISFET devices with short gates (e.g. less than 0.12 $\mu$m), presents (in 1995) two very obvious problems: device physics and fabrication technology.

The first problem is known as Drain Induced Barrier Lowering (DIBL), which, for very short channels exists even without drain bias. This effect, results in undesirable high off-state currents, which will have a major contribution to serious power dissipation problems. It also degrades the switching properties (sub threshold current slope) of the devices.

Lithography and shallow junction formation are the most prominent fabrication technologies. Although, from the technical point of view, several proposed solutions seem to work, they imply different fabrication techniques, using new types of equipment. For some of these techniques, it is not yet clear if they will ever be economically feasible. This is clearly the case with lithography technologies for dimensions below 0.12 $\mu$m.

To solve the technological problems, Vertical MISFET devices have been proposed. In this way, the lithographic steps define the cross section of the transistor, and the gate/channel length will be defined by epitaxial techniques (at low temperatures).

In fact, Planar Delta Doped Vertical MISFET devices having a homojunction are known.

However, the DIBL effect remains for these devices, thereby imposing a minimum channel length. This results from the fact that potential barriers built by doping suffer from charge redistribution when a bias is applied, and their maximum value is limited by the band-gap of Si. Also, very short distances between source/drain and the delta doped barrier results in a strong field, enhancing band to band tunnelling beyond acceptable levels.

U.S. Pat. No. 4,740,826 describes a Vertical Complementary Metal Oxide Semiconductor (CMOS) inverter fabricated by forming a layer of P-type material on the surface of an N+-type substrate followed by formation of an N+ layer, a P+ layer, an N-layer and a P+ layer. A trench is then etched along one side of the stack thus formed and a connector is formed to the middle P+ and N+ layers. In addition, another trench is formed to create a gate insulator and a- gate. There is only homojunction between the several layers.

Transistors having a heterojunction have been described as "Fabrication of Three-terminal Resonant Tunnelling Devices in Silicon-based Material" of A. Zaslavsky, K. R. Milkove, Y. H. Lee, K. K. Chan, F. Stern, D. A. Gr ützmacher, S. A. Rishton, C. Stanis, and T. O. Sedgwick: Appl. Phys. Lett. 64 (13),28 Mar. 1994.

This reference describes the fabrication of a silicon-based device having a double SiGe barrier for which the physical principle of operation is resonant tunnelling.

U.S. Pat. No. 4,550,489 describes a Vertical Field Effect Transistor wherein the layer structure is formed epitaxially and wherein the gate is formed by a Schottky junction between a metal electrode and the channel semiconductor material. The current control mechanism is barrier thinning to enhance tunnelling across the channel material.

U.S. Pat. No. 4,236,166 describes a Vertical Field Effect Transistor which includes a relatively wide bandgap, lowly doped active layer epitaxially grown on, and substantially lattice matched to, an underlying semiconductor body portion. A mesa of lower bandgap material is epitaxially grown on and substantially lattice matched to the active layer. A source electrode is formed on a bottom major surface of the semiconductor body portion, a drain electrode is formed on the top of the mesa, and a pair of gate electrode stipes are formed on the active layer adjacent both sides of the mesa.

This transistor is normally on and needs the application of a gate voltage to turn off. This turn-off mechanism works through the depletion of channel material to stop current which imposes, in the present case, constraints on the lateral to vertical dimension ratio.

The "GEC Journal of Research, 10 (1993) no. 3, pp. 645, Chelmsford, Essex, GB, describes very well known technique used for epitaxially grown Si and $Si_{1-x}Ge_x$ heterostructure. However, there is no mention of vertical MISFET transistors in this document.

Currently CMOS process integration using Vertical MISFETs faces four main problems:

a) Requirements of multiple epitaxial runs to make complementary transistors. In process architectures where complementary transistors are made sequentially, at least two epi-runs (SEGs even), have to be performed. This implies process complexity, low temperature cleans and cures, very selective etches, etc.

b) Parasitic capacitances coming from extensive gate overlap of highly doped regions. The gate fully overlaps the source and drain (which is something that doesn't happen with planar transistors). This capacitance can be significative since "thick" source and drain layers should be provided for minimization of the series resistance.

c) Extensive gate overlap. When gate electrode definition is made by lithography and dry etch, there are even more extensive regions overlapped by the gate electrode: on top of the transistor itself, and on the highly doped layer where the vertical transistor was defined. The latter is unavoidable if the contact to that layer is made outside the perimeter defined by the gate.

d) Low integration density resulting from the necessity of separately contacting layers on different levels. In the age of self-aligned planar MOSFETs, one patterning step results in the contacts for all the terminals of the transistors. With vertical transistors where contacts have to be made with 2 or 3 patterning steps, area has to be provided for the inaccuracy of the alignments from one layer to the other. These built-in tolerances can cause a large area penalty (lithography tools have a non-zero alignment accuracy).

Historically, Dynamic Random Access Memory (DRAM) has been the product driving the advances in microfabrication.

DRAMs have got more bits per die, due to the combined effects of ever smaller lateral features, and to ever larger dies. Even these two factors are by no means certain to work in the future. It is uncertain what kind of lithography equipment will provide resolution below 0.1 $\mu$m. Since die size is dependent on the lithography tool used, the answer to the first question will also provide the answer to the second.

In any case, it seems that the factors of progress which worked so well in the past, will fail to do so for the Gigabit age. New approaches are needed to continue the accelerated pace of the past, into the future.

A Random Access Memory (RAM) cell, needs at least one transistor and one charge storage capacitor. Therefore, it is dependent on how small the transistor (usually a MOSFET) can be made. The planar MOSFET, when reducing the lateral dimensions, needs to have very shallow junctions, with low leakage currents. This is a difficult problem, as the 0.12 $\mu$m generation is approached. This is very important, because the charge retention in the capacitor is dependent on the leakage current of the transistor. The larger the leakage, the higher the refreshment rate the capacitor needs to be, in order to preserve the stored information.

The capacitor itself is also a concern. As the lateral dimensions of the capacitor are reduced, so is the total capacitance. Also, operating voltages need to be reduced, but there is a minimum of charge that must be stored, because noise is determined by KT, which is a fixed value. The solution for this problem has been to increase the capacitance per area by thinning the silicon dioxide between the capacitor plates, and by fabricating three dimensional capacitor structures. However, the silicon dioxide cannot be scaled beyond the value at which leakage current becomes prohibitive. Three dimensional capacitor structures can increase the effective capacitor area, without increasing the footprint of the cell, but introduce important process complexities, which in turn, tend to decrease the yield. It seems that the future of capacitors lies with planar structures using dielectric materials with large permeability values.

If SOI substrates were used, MISFET leakage current would be strongly reduced. However, SOI requires costly substrates.

SUMMARY OF THE INVENTION

One aspect of the present invention is a silicon germanium-based Vertical MISFET device short enough to allow ballistic operation and to simultaneously solve the DIBL problem. Preferably, the device is a silicon germanium based vertical MOSFET.

More particularly, the present invention relates to P-channel Metal Oxide Semiconductor (PMOS) and N-channel Metal Oxide Semiconductor (NMOS) transistors having these advantages.

Another aspect of the present invention is a manufacturable Vertical CMOS process integration capable of replacing the planar CMOS process integration. By manufacturable, is meant that the individual process steps, their complexity, their number and sequence, is such that a high fabrication yield is obtained.

Other aspects of the present invention are DRAM cells and/or circuits having memory cells based on silicon Vertical MISFET devices having a very high integration density.

Many other advantages of the devices and the process integration thereof will be described hereunder.

One embodiment of the present invention is a silicongermanium based Vertical MISFET device comprising in a stack of several layers including at least a source layer, a channel layer, and a drain layer.

The device has the following characteristics:

a) The channel layer is undoped or lowly doped;

b) A heterojunction is formed between the source, and the channel with an undoped or lowly doped region in the source near the source/channel interface, and c) A gate is overlapping, preferably essentially at a right angle, at least partially the source, the channel and the drain layers with an insulate layer therebetween.

In the case of a PMOS device, the drain is made of a highly p-type doped material which is preferably the same material as the channel material. In this embodiment, the channel is an undoped material and the source comprises at least a double layer consisting of an undoped or lowly p-type doped region and a highly p-type doped region, both made of a second material which has a valence band edge with a lower potential energy than the valence band edge of the channel material.

The present PMOS type device has the following characteristics:

a) The drain comprises a highly doped p++ layer preferably Si layer.

b) The channel is an undoped layer (preferably Si).

c) The source comprises at least a double layer consisting of an undoped or lowly doped $Si_{1-x}Ge_x$ layer and a highly doped p++ possibly graded SiGe layer.

The present invention also relates to NMOS devices. In this embodiment, the drain is made of a highly n-doped material preferably the same material as the channel material, the channel is an undoped material, and the source comprises at least a double layer consisting of an undoped or lowly n-type doped region and a highly n-type doped region, both made of a second material which has a conduction band edge with a lower potential energy than the conduction band edge of the channel material.

In a first preferred embodiment, the device of the NMOS type is characterized by the following:

a) The drain comprises a highly doped n++ layer preferably Si layer.

b) The channel is an undoped layer (preferably Si).

c) The source comprises at least a double layer consisting of an undoped or lowly doped $Si_{1-x-y}Ge_xC_y$ or $Si_{1-y}C_y$ layer and a highly doped n++ possibly graded $Si_{1-x-y}Ge_xC_y$ or $Si_{1-y}C_y$ layer.

Another preferred embodiment comprises an NMOS device in which:

a) The drain comprises a highly doped n++ layer (preferably Ge).
b) The channel is an undoped layer (preferably Ge).
c) The source comprises at least a double layer consisting of an undoped or lowly doped $Si_{1-y}Ge_y$ layer and a highly doped n++ possibly graded SiGe layer.

Several preferred embodiments of PMOS and NMOS devices will be described more in detail hereunder in connection with the description of the drawings.

Using silicon epitaxial compatible materials, the PMOS device has the following configuration: the drain comprises a p++ silicon layer; the channel comprises an undoped silicon layer, the source comprises undoped silicon-germanium layer and a p++ silicon-germanium layer.

Using the same material, the NMOS device is less straightforward due to the small conduction band off-set of SiGe layers drained to Si wafer. Such can be circumvented by the use of a $Si_{0.5}Ge_{0.5}$ virtual substrate. In this case, the NMOS has the following configuration: the drain comprises an n++ Ge layer; the channel comprises an undoped Ge layer; the source comprises undoped or lightly n-type doped SiGe layer and an n++ SiGe layer.

It will be appreciated that several variations on the above material systems will also achieve the desired band structures for the above devices. For example, $Si_{1-y}C_y$ random alloys strained to Si wafer may be used to obtain conduction band off-sets which might render unnecessary the use of a SiGe virtual substrate. These devices can also be made in other materials systems such as GaAs and related alloys.

Since silicon based materials are the most economically feasible, these materials will be used in the description of the invention. Since SiGe is by far the best developed technology for band-gap engineering using the production facilities of conventional IC manufacturing, the several devices of the present invention will be presented as to be manufactured on $Si_{1-x}Ge_x$ virtual substrate.

The present invention is also relates to complementary devices wherein, devices of the PMOS or of the NMOS type are grown on the top of the devices of the NMOS type or of the PMOS type. The three possible configurations for complimentary devices are the CMOS inverter, the PMOS pass transistor, and the NMOS pass transistor.

According to a preferred embodiment, stacks having either PMOS/NMOS/PMOS devices stacked one upon the other or NMOS/PMOS/NMOS devices stacked one upon the other are also possible.

In the case of a CMOS inverter, the PMOS source is grounded, NMOS source is at -VSS, Input signal is put at the common gate contact, and Output signal is taken at the common drain contact.

For pass transistors, a Control signal is put at the gate of a single MOS, to allow or forbid the access of the drain to the signal at the source. Quite often the control signal is a clock. So, for pass transistors, the terminal of the PMOS must be fully independent of the terminals of the NMOS and vice-versa.

According to the present invention, a surrounding gate is provided common to the whole stack of the several devices. Preferably such stack of devices also has a drain contact common to all the stacked devices. Preferably the drain contact is made inside the perimeter of the stack of the device.

The source contact can either be only provided to the bottom or to the top device, preferably made inside the perimeter of the stacked devices or be common to all the devices made on the whole substrate or wafer wherein the several stacks of devices are defined through a unpatterned wafer backside.

The present invention also relates to a process integration for Vertical MISFET devices, each of the MISFET devices comprising a stack of several layers including at least a source layer, a channel layer and a drain layer and having a surrounding gate and insulator overlapping at least partially the several layers of the MISFET device wherein:

a) one epitaxial deposition sequence on a silicon substrate is used for defining the several layers of each Vertical MISFET device possibly stacked,
b) a patterning step consisting of a lithographic/etch step is used to create the surrounding gate around the possibly stacked device(s), and
c) other patterning steps are used to make contact to the source and to the drain of each Vertical MISFET device possibly stacked.

Preferably, the patterning step used in order to make the contact to the drain of the devices is performed in order to have said drain common to several stacked devices made inside the perimeter of the stacked device(s).

Preferably, the stacked devices are also defined by a single uninterrupted epitaxial deposition in order to create stacks of NMOS/PMOS or PMOS/NMOS or NMOS/PMOS/NMOS or PMOS/NMOS/PMOS devices.

Preferably, the epitaxial deposition sequence uses a virtual $Si_{1-x}Ge_x$ substrate in order to create a heterojunction in each of the PMOS or NMOS device(s). Heterojunction can also be done by incorporating group IV elements and appropriate dopants in order to create significant energy barriers.

According to a preferred embodiment, the present invention comprises a CMOS process integration for Vertical Heterojunction MISFET devices comprising at least the following steps:

a) Epitaxy of Several Layers of a Vertical MISFET device;
b) Deposition of the Insulator(s);
c) Mask 1: Definition of Configuration units (MESAS) each corresponding to one stack;
d) Formation of Gate Electrode on Mesas Sidewalls;
e) Gate Electrode Etchback (Spacer-like Electrode);
f) Planarization: Filling of Spaces Between Mesas;
g) Mask 2: Formation of Gate Contact Pad;
h) Mask 3: (Common) Drain Contact Holes
i) Formation of Spacers at least Partially on the Internal Side Walls of the Top/Bottom Device;
j) Contact Hole Filling with Silicide & Metal;
k) Mask 4: Contact Hole to Source of Top Device;
l) Contact Hole Filling with Silicide & Metal;
m) Metallization.

The present invention also relates to RAM circuits comprising memory cells and a logic circuitry. According to a first preferred embodiment, each of the memory cells comprises at least one Vertical MISFET device having itself a stack of several layers comprising a source layer, a channel layer and a drain layer and a capacitor on the top of the stack of several layers of the Vertical MISFET device.

According to a second preferred embodiment, each of the memory cells comprises at least two Vertical MISFET devices on the top of each other and having a capacitor therebetween.

Preferably, the Vertical MISFET devices are monocrystalline Vertical MISFET devices.

According to a preferred embodiment, the Vertical MISFET devices are Vertical Heterojunction MISFET devices comprising:

a) a channel layer which is undoped or lowly doped;
b) a heterojunction which is formed between the source and the channel with a presence of an undoped or lowly doped region in the source near the source/channel interface, and
c) a gate which is overlapping, preferably essentially at right angle, at least partially the source, the channel, and the drain layers with an insulate layer there between.

The on-chip logic circuitry in these RAM circuits can be realized either with planar transistor(s) or with Vertical MISFET device(s). Preferably, Vertical Heterojunction MISFET device(s) are used.

Figure 1A:
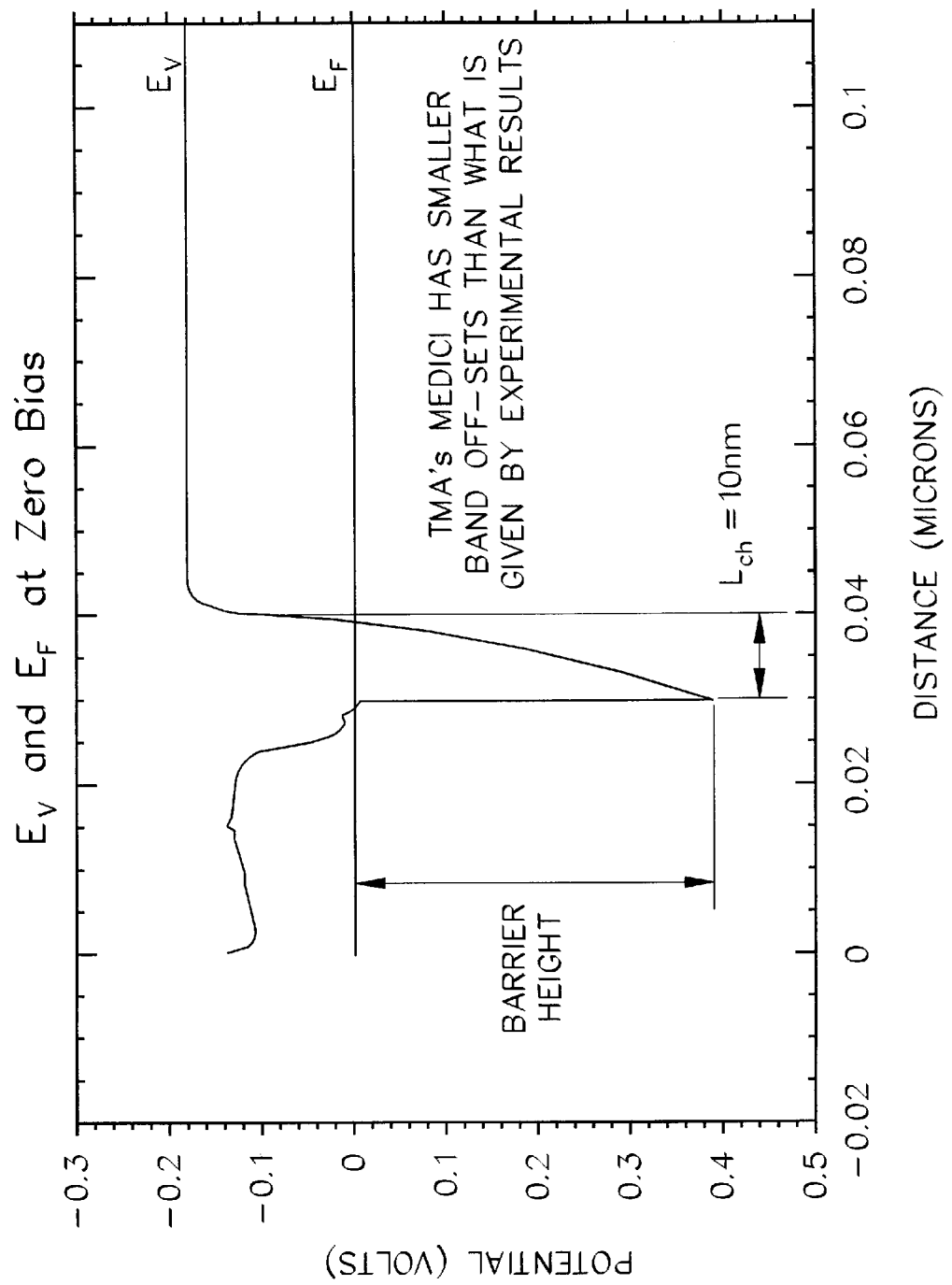
FIG. 1 represents the band structure and the electrochemical potential in function of the distance (from the source to the drain) for a PMOS device according to the present invention under the three following bias conditions.
Figure 1B:
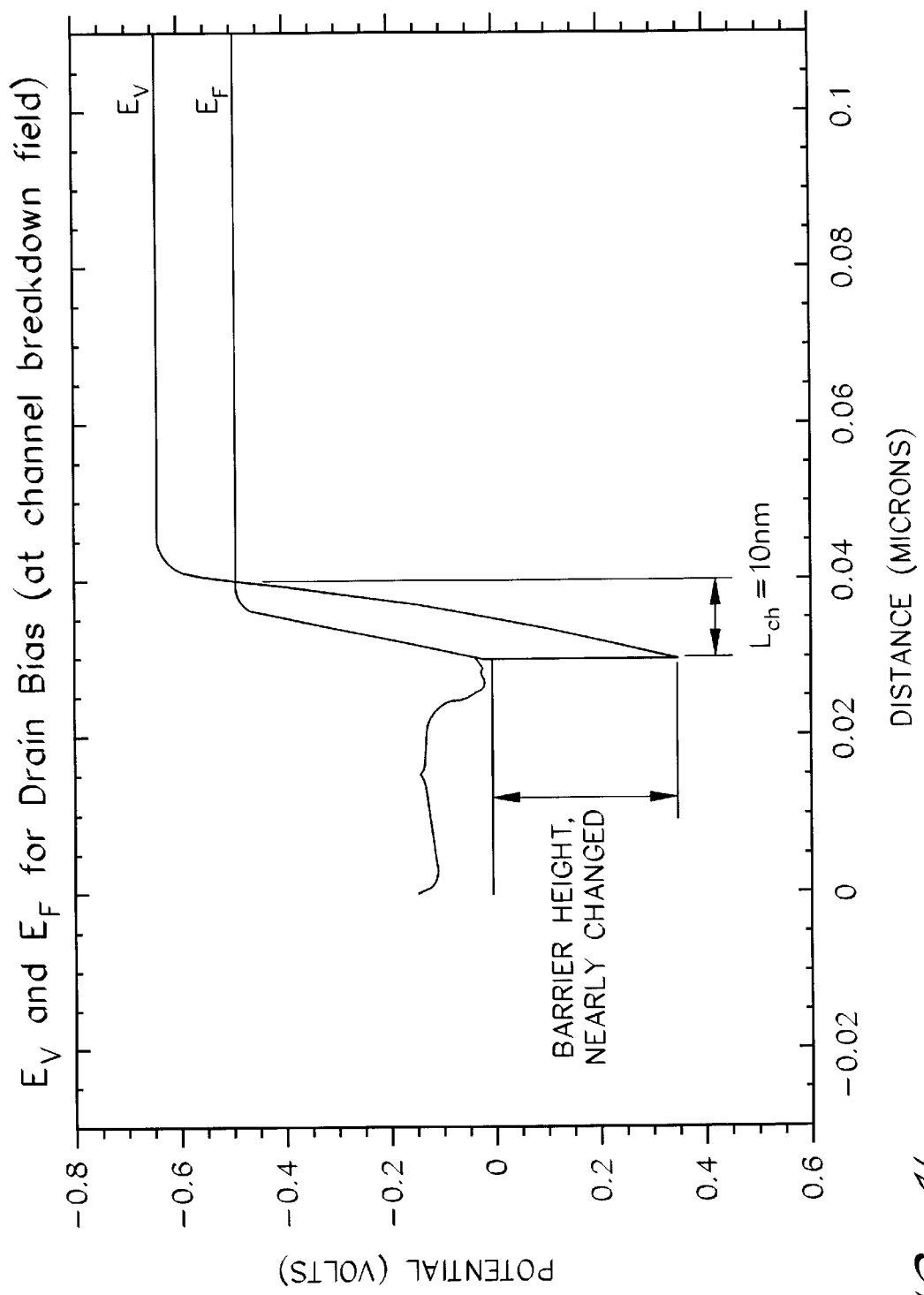
Figure 1C:
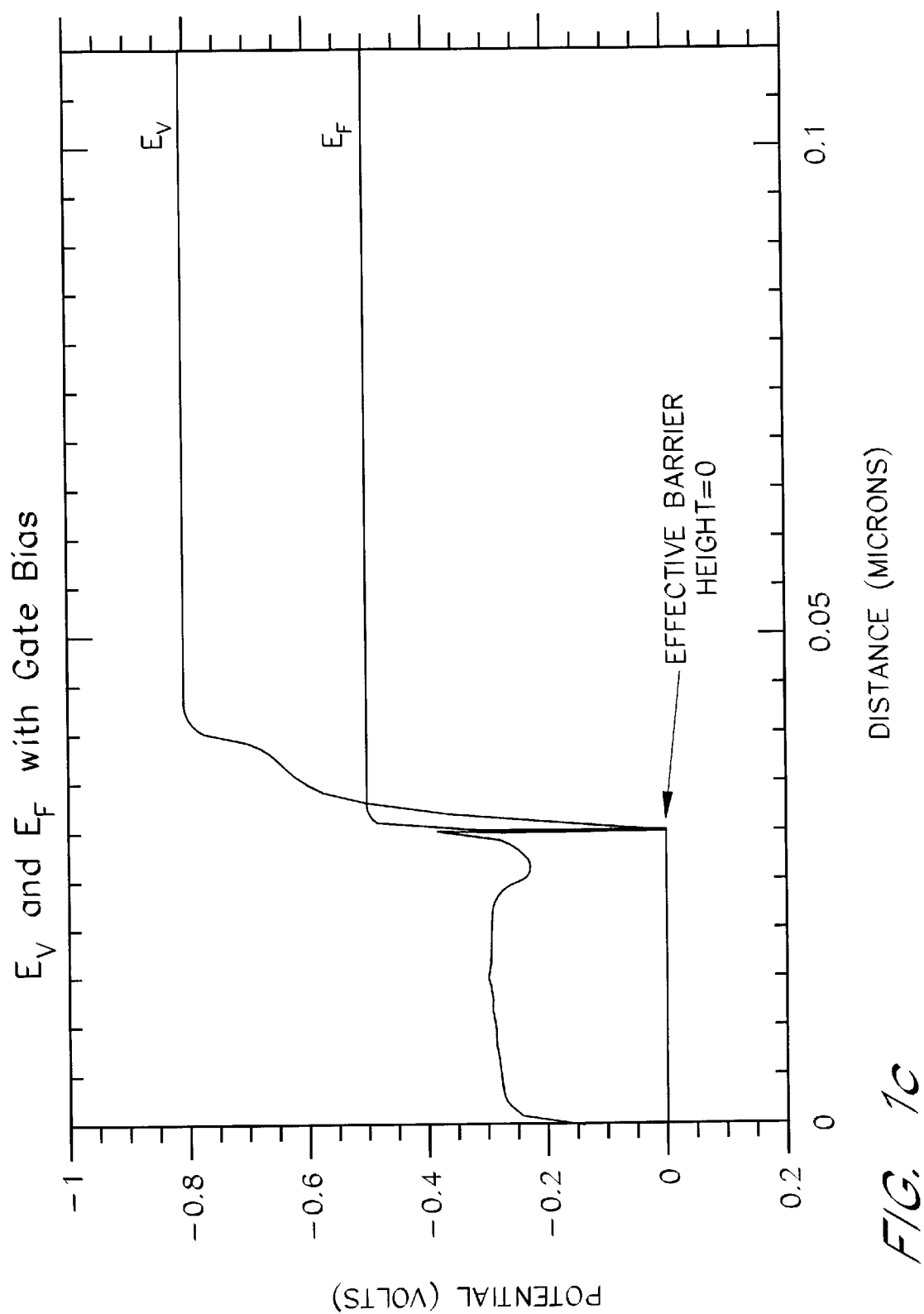

no bias (FIG. 1a), drain bias (FIG. 1b), drain and gate bias (FIG. 1c).

Figure 2A:
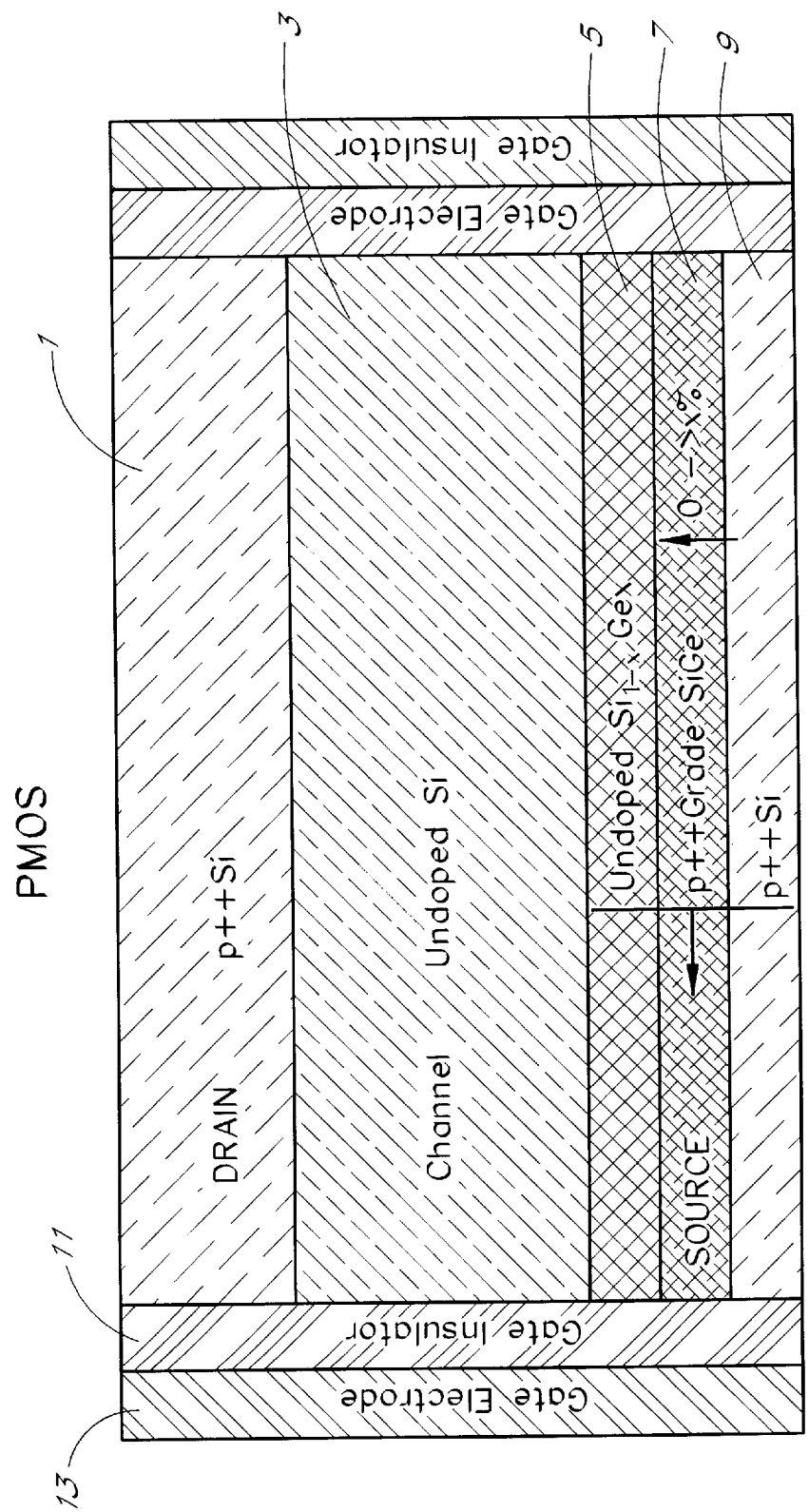
Figure 2B:
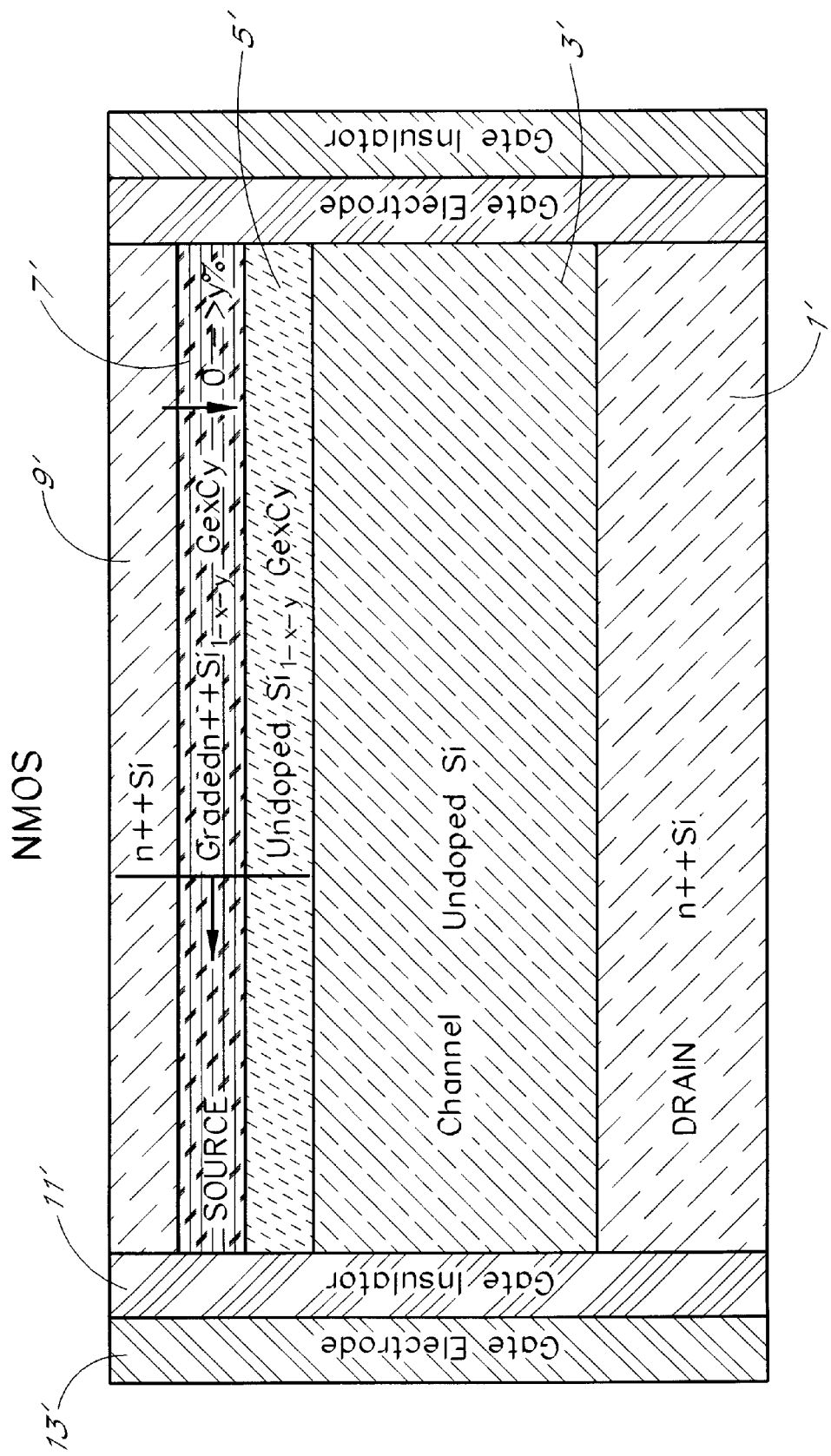

FIGS. 2 represent schematic view of a PMOS device (FIG. 2a) and a NMOS device (FIG. 2b) respectively according to a first preferred embodiment of the present invention, wherein these devices are strained to a Si wafer.

Figure 3:
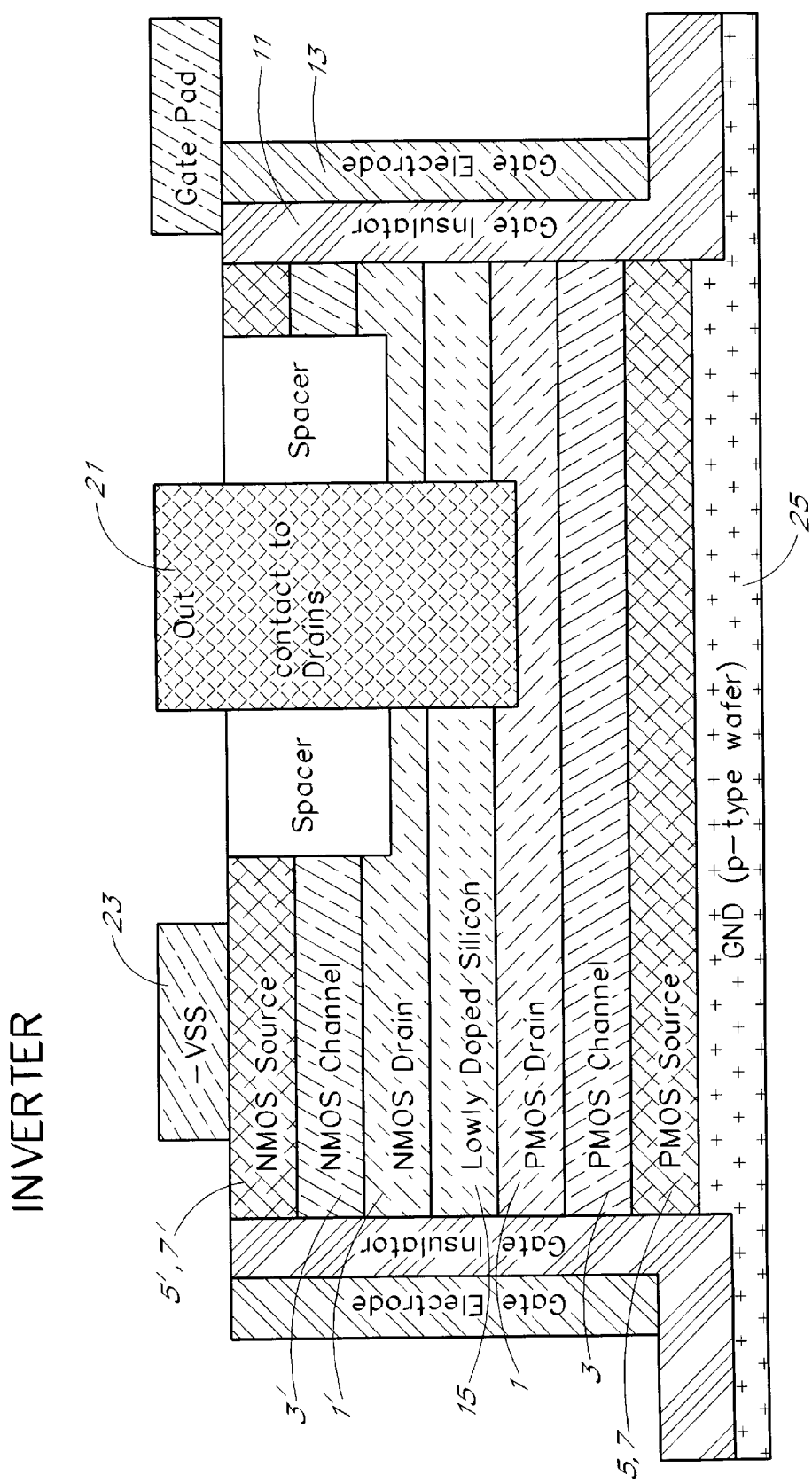

FIG. 3 represents a schematic view of a Vertical CMOS inverter which is manufactured according to the CMOS process integration of the present invention.

Figure 4:
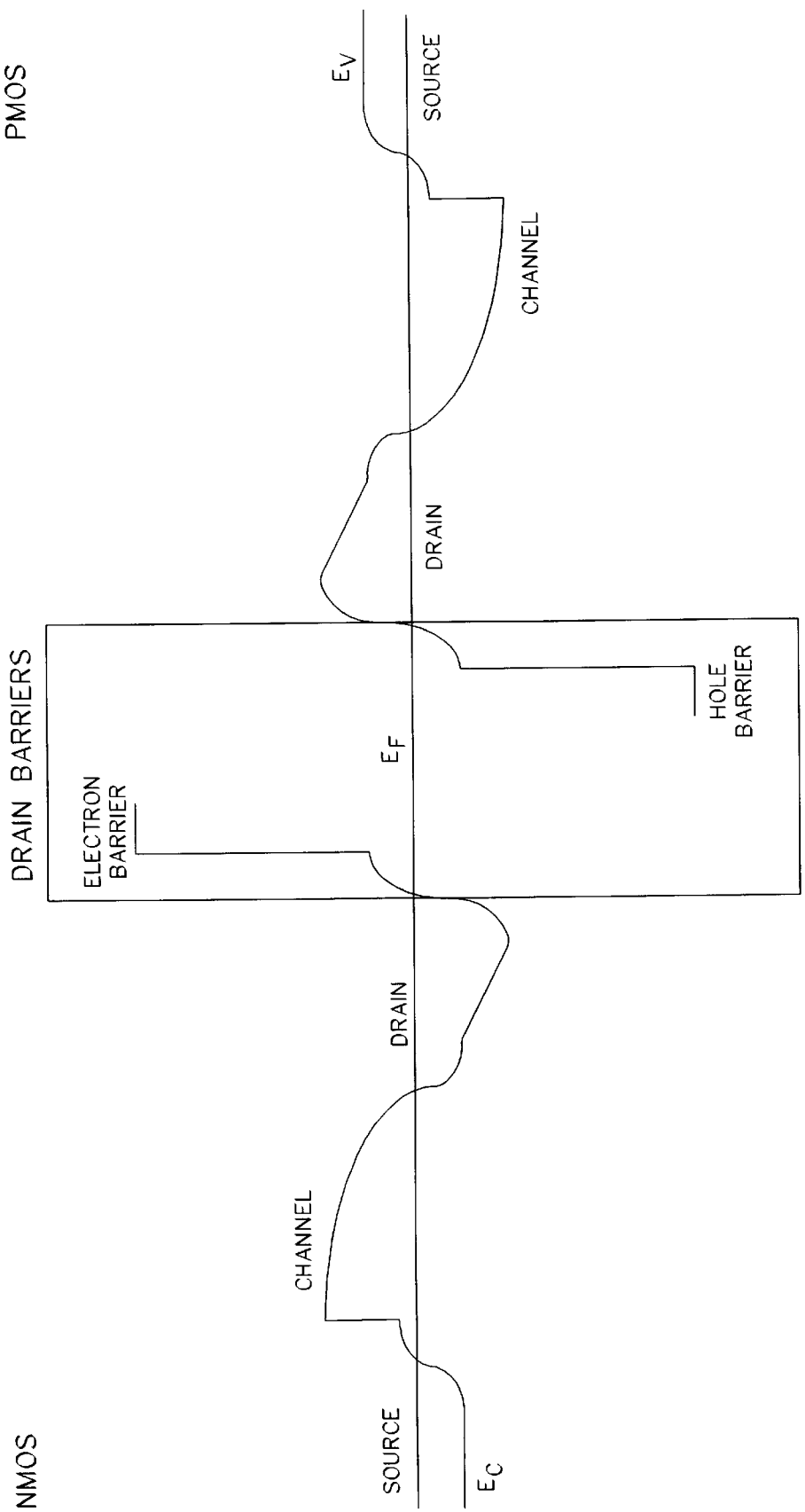

FIG. 4 represents schematically the band structure in the case of no bias applied for a CMOS inverter as described in FIG. 3.

Figure 5:
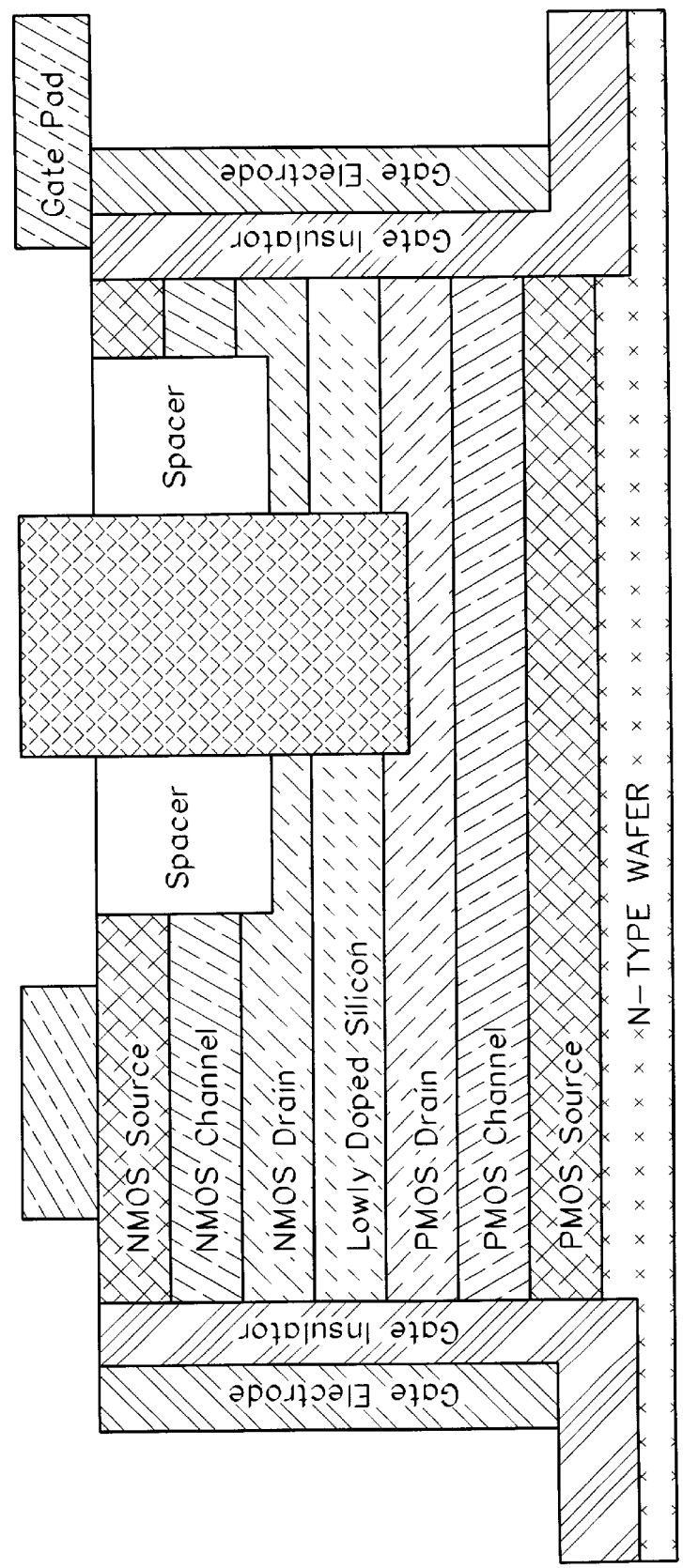
Figure 6:
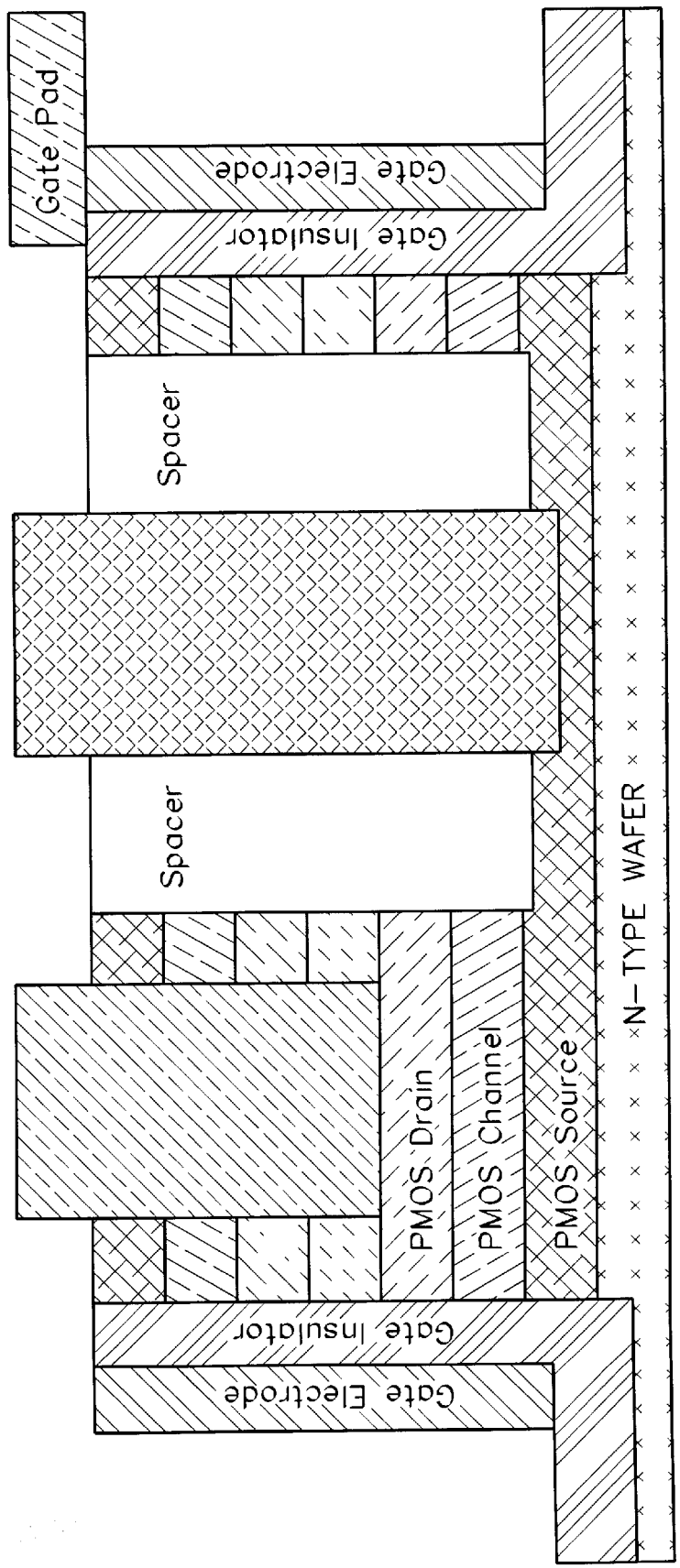

FIGS. 5 and 6 represent a schematic view of a Vertical NMOS and PMOS transistors respectively.

FIGS. 7.1–7.7, 8.1–8.4, 9.1–9.4, 10.1–10.3 represent several embodiments of process flow used as CMOS process integration.

Figure 11:
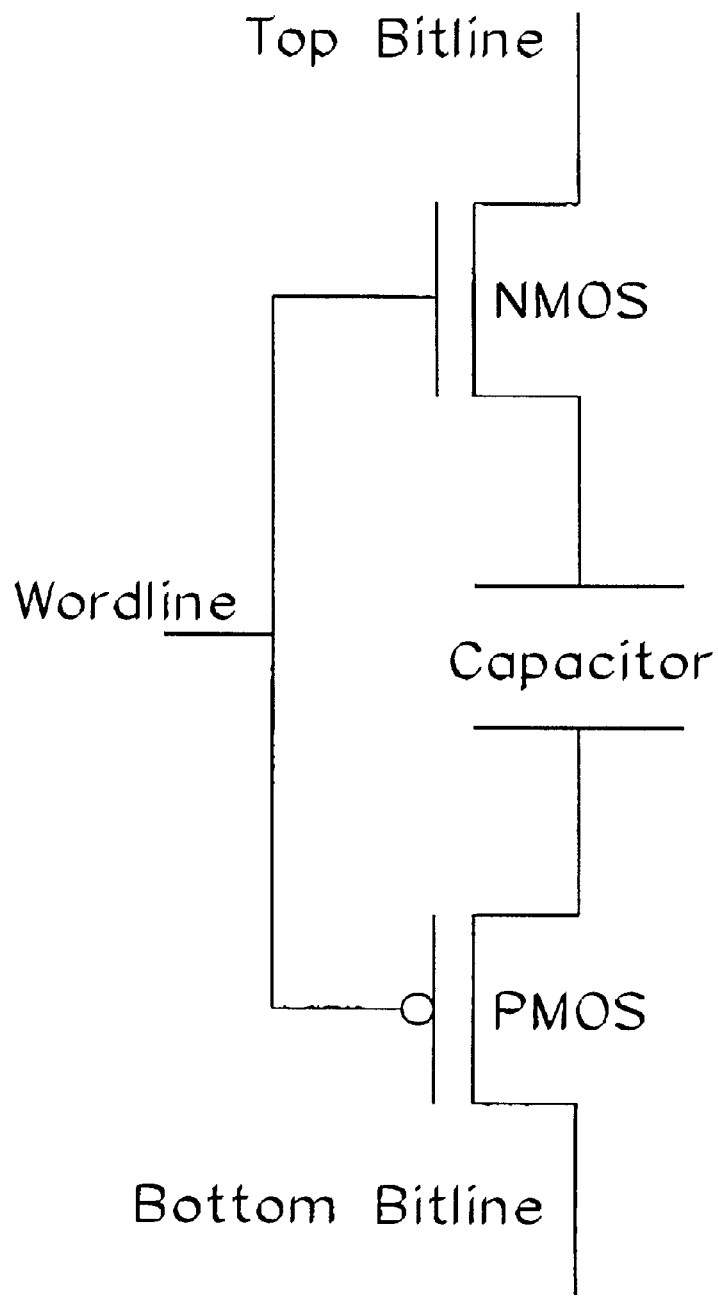

FIG. 11 represents a schematic view of a RAM cell according to the second preferred embodiment of the present invention.

FIGS. 12.1–12.5, 13.1–13.3, 14.1–14.2, 15.1–15.2 and 16.1–16.4 represent several embodiments of process flow intended for manufacturing RAM cells or circuits according to several preferred embodiments of the present invention.

DETAILED DESCRIPTION OF THE PREFERRED EMBODIMENT

One aspect of the present invention is related to a silicon-based vertical MISFET, preferably a MOSFET device, having a heterojunction which does not suffer from the DIBL problem and for which it is possible to allow the transfer across the heterojunction.

FIG. 1 represents the band structure and the electrochemical potential as functions of distance (from source to drain) for a PMOS device. The plots were obtained with a commercial device simulator (TMA's Medici with heterojunction module).

FIGS. 1a, 1b, 1c show three possible bias conditions: no bias, drain bias only, drain and gate bias respectively.

If one looks at the Source as a thermalized carrier reservoir, the fraction of those carriers with energies higher than the barrier height is given by the Fermi-Dirac Distribution. Already for around 10 KT barrier height, the distribution is very close to zero. For devices with channel lengths smaller than the carriers mean free path, the current is solely determined by the barrier height, and is independent of the channel length. In this case the off-state current is given by the thermionic emission over the barrier provided tunnelling is suppressed (see FIG. 1a).

The devices according to the present invention are the first to make possible the lowering of an heterobarrier by an insulated-gate action. These devices demonstrate that with the appropriate source engineering, drift-diffusion or ballistic transport (depending on temperature and channel length) can also take place across heterojunctions.

The band discontinuities, the difference between two band edges among two different materials depends on whether they are pseudomorphic and how much strain there is. Once a layer configuration is in place, the band off-sets cannot be changed, because they result from the interfacing of the two different materials or alloys.

The effective barrier height seen by a carrier in the lower potential energy material (source), depends on its energetic position inside the band, that is, the distance between its energy level, and the band edge. For a thermalized carrier, this difference depends on the availability of the lower energy states. If the carrier can occupy an energy state at the edge of the band, then the barrier height is equal to the band discontinuity.

When the electrochemical potential is inside the band (it can then be called Fermi-Level) of the source material, the states between the edge of the band and the Fermi-Level are occupied, and therefore are no longer available for an incoming particle.

If the lowest energy states available to an incoming particle are only those at the Fermni-Level, the effective energy barrier that the particle will "see" will no longer be the difference between the band edges of source and channel, but the difference between the band edge of the channel and the Fermi-Level of the source.

For semiconductors with low doping levels, the relative position between electrochemical potential and band edge can be significantly modulated (in this device is accumulation) by field effect in a MIS structure.

By modulating the relative position (to the Source Fermi-Level) of the source band edge, the barrier height "seen" by a particle travelling from source to drain, can then be modulated. In this particular case, it is desirable to achieve this modulation through the field effect of a Gate.

When the Gate is "off" (FIG. 1b), one wishes to have the minimum (thermionic) current possible flowing from source to drain (even with drain bias already applied). Therefore the barrier height should be maximum, that is, the full amount of band discontinuity should be seen by all carriers at the source. Thus the electrochemical potential (at the source) should be in the gap, or at least at the band edge.

As can be seen in the plots, tunnelling will not take place because the width of the barrier at the concerned energy levels is too large.

In the off-state with applied drain bias, the potential drop between the highly doped regions of source and drain is distributed unevenly over the channel and the undoped region of the source. In order to minimize DIBL, the potential drop (band bending) in the undoped part of the source, should also be minimized. This is possible by making that region the smallest possible. Simulations show that 5 or 10 nm are enough for the mechanism of barrier lowering to work. In the off-state, only thermionic current flows from source to drain.

When the Gate is "on" (FIG. 1b), one wants to have a zero barrier height (<1 KT). This means that in the source, all energy states up to the level of the channel band edge, are occupied. That is to say, the Fermi-Level (in the source) should match the band edge level of the channel (actually to the level of the first bound state of the quantum well in the channel).

To achieve this behavior, it is necessary to be able to bend the band at the source just before the channel, that is, just before the heterojunction. Accordingly, a lowly doped region is provided in the source near the channel interface. This is also the reason why a metallic or degenerately doped semiconductor source can not work. This turn-on mechanism and the asymmetric structure, make a clear the distinction between this device and others suggesting the use of heterojunctions in Field Effect Transistors.

The channel is defined as the region where the potential drop occurs in the on-state.

The undoped region just before the heterojunction is considered a part of the source (and not of the channel) because, in the on-state, there is no potential drop in that region. In the on-state, the Fermi Level is well inside the band throughout entire source region until the heterojunction.

The drain is defined as the region after the channel, where the Fermi level is inside the band (the semiconductor is degenerate), and there is no potential drop.

It has to be kept in mind that, this barrier lowering occurs by the action of a MIS structure overlapping source and drain. Therefore it is obvious that devices based on the Schottky gate concept cannot reproduce this effect, and are governed by a completely different mechanism (barrier thinning to enable tunnelling).

It has been indicated how to produce large barrier heights for the off-state, of MISFETs with channel lengths less than 20 nm. It has also been established a new mechanism to make the barrier become zero, for the on-state. With such short channel lengths, ballistic operation can be expected, at room temperature.

A recent publication, "Ballistic Metal-Oxide-Semiconductor Field Effect Transistors" of Kenji Natori, J. Appl. Phys. 76(8), Oct. 15, 1994, concerning the modelling of ballistic homojunction MISFETs can be applied to the present devices. Since this device has a MOS gate-induced barrier lowering, it is irrelevant if the barrier is made with homojunctions or heterojunctions. What is important is the ability to modulate its height with a MOS gate.

The devices according to the present invention can be implemented in any materials system, provided that a heterojunction and a MIS structure are possible. Due to the dominant position of the silicon technology in the microelectronics industry, the silicon based materials are the most attractive one for the implementation of this device concept.

In order to make the PMOS devices, valence band off-sets are needed, and to make the NMOS devices, conduction band discontinuities are necessary.

The simplest way two obtain valence band off-sets, is to have coherently grown $Si_{1-x}Ge_x$ films on Si wafers. It is known that in SiGe layers the valence band goes up without any significant effect on the conduction band.

Conduction band off-sets are less straightforward to obtain. At present, two alternatives seem possible. The first is to grow pseudomorphic $Si_{1-y}C_y$ or $Si_{1-x-y}Ge_xC_y$ alloys on Si wafers. There is a strong indication that the incorporation of carbon in the films, causes a lowering of the conduction band. In this case, complementary devices can be grown directly on a silicon wafer.

The second is to arrange a SiGe substrate, and grow strained SiGe films with a Ge content different from that of the substrate (higher Ge contents make a barrier for electrons). In this case, the PMOS could also be made by growing SiGe films with Si content different from that of the substrate (higher Si contents make a barrier for holes).

The actual composition of the PMOS and NMOS layers in terms of Ge and/or C percentages, depends on the band off-sets sought, which in turn are a function of the offstate current one wishes to have.

FIG. 2 represent several embodiments of PMOS and NMOS devices which are Vertical Heterojunction MISFET (VHMISFET) according to the present invention.

More particularly, FIGS. 2a and 2b represent a PMOS and an NMOS device respectively which are strained to a Si substrate and which are manufactured with conventional epitaxial growth techniques.

FIG. 2a represents a PMOS device wherein the drain (1) comprises at least a very highly doped p++ Si layer, the channel (3) comprises an undoped or lowly doped Si layer and the source comprises at least a double layer comprising an undoped or lowly doped $Si_{1-x}Ge_x$ layer (5) and a very highly doped p++ graded SiGe layer (7). The source of the PMOS device is strained to a highly doped p++ Si wafer (9).

FIG. 2b represents more particularly an NMOS device wherein the drain (1') comprises at least a very highly doped n++ Si layer, the channel (3') comprises an undoped or lowly doped Si layer, and the source comprises at least a double layer comprising an undoped or lowly doped $Si_{1-x-y}Ge_xCy$ (5') and a very highly doped n++ graded $Si_{1-x-y}Ge_xCy$ layer (7'). The source of thr NMOS device is strained to a highly doped n++ Si wafer (9').

In both devices represented in FIGS. 2a and 2b, the gate dielectrics (11 or 11') and the gate electrodes (13 or 13') are overlapping essentially vertically at least partially the source, the channel and the drain layers. Both devices have three terminals and are completely surrounded by the gate.

From the fabrication point of view, it is preferable to have all layers strained to a Si wafer instead of buffer layers.

There are also device physics reasons to prefer this approach. For both transistors the channel is made of the same material, pure silicon, which has a higher breakdown voltage than Ge-rich alloys, allowing a higher $V_{DS}$ (and therefore $V_{GS}$) value for the CMOS circuit. Also, Ge-rich alloys have a considerably smaller band-gap, which increases thermal generation of carriers which might hinder high temperature operation.

In any case, both configurations are possible for room temperature. Low temperature operation solves all sorts of objections for the use of Ge-rich alloys as the channel material.

If a SiGe substrate is preferred to the epitaxy of $Si_{1-x-y}Ge_xC_y$ or $Si_{1-y}C_y$ alloys on Si substrates, then the device can be modified as described below, which represent a PMOS and NMOS device respectively strained to a SiGe substrate.

In the case of the PMOS device, the source is strained to a highly doped p++ $Si_{0.5}Ge_{0.5}$ layer when a SiGe substrate is used.

In the case of an NMOS device, the source is strained to a highly doped n++ $Si_{0.5}Ge_{0.5}$ layer when an SiGe substrate is used.

Due to strain considerations, the drain layer structure can also be changed into the following layer structure.

In the case of the PMOS device, the drain comprises a highly doped p++ graded SiGe layer and a highly doped p++ $Si_{0.5}Ge_{0.5}$ layer.

In the case of an NMOS device, the drain comprises a highly doped n++ (graded) SiGe layer and a highly doped n++ $Si_{0.5}Ge_{0.5}$ layer.

In the case of SiGe substrate, using pure Si and pure Ge for the channels materials is preferable because it avoids alloy scattering. But, because strain imposes a limit on the film thickness, this will only be possible for very thin films (very short channels).

The progress in the epitaxy of group IV elements and low temperature processing may one day allow the use of carbon, silicon, germanium and tin heterostructures grown on silicon wafers or buffer layers and provide more possibilities for the band edge engineering. With the possibility of using all those elements, some of the layer compositions here proposed, might be somewhat different.

There are three possible configurations for complementary devices: CMOS inverter, PMOS pass transistor, and NMOS pass transistor. In a CMOS inverter, the PMOS source is grounded, the NMOS source is at -VSS, the input signal is put at the common gate contact, and output signal is taken at the common drain contact. For pass transistors, a control signal is put at the gate of a single MOS, to allow or forbid the access of the drain to the signal at the source. Quite often the control signal is a clock. For pass transistors, the terminal of the PMOS must be fully independent of the terminals of the NMOS and vice-versa.

FIG. 3 represents a preferred embodiment of a CMOS inverter according to the present invention made with Vertical Heterojunction MISFET wherein an NMOS transistor is grown on the top of the PMOS transistor their drains, n++ and p++ layers (1'and 1) facing each other. The drains of the PMOS and the NMOS transistors are separated by a drain barrier (15) which should comprise a barrier layer for electrons for the NMOS transistor and a barrier layer for holes of the PMOS transistor.

To make the CMOS inverter an ohmic contact (21) to both drains (1 and 1') is necessary while an ohmic contact (23) to the source (5') of the NMOS transistor and an ohmic contact (25) to the source (5) of the PMOS transistor are made separately one on the front surface and the other back surface of the CMOS inverter.

Of course, the opposite, a PMOS transistor grown on the top of an NMOS transistor, is another possible alternative to built a CMOS inverter.

FIG. 4 shows schematically the band structure when no bias is applied for a CMOS inverter as described in FIG. 3. The barriers made with semiconductor heterojunctions, are smoothly integrated in the middle of the epitaxial stack to be grown. This is also true for transistors making use of homojunctions only. These heterobarriers are useful in the sense that they can minimize the inverter area.

If the heterobarriers were not possible to include, then the bottom sources could not have a common contact through the backside of the wafer, and would need individual contacts through the front side. In this way, a contact shunting the PMOS source and drain, biased to the supply voltage of the top transistors would eliminate the PIN diode action. The only advantage of having front side individual contacts to the sources of the bottom transistors is that it is straightforward to make pass-transistors also of the bottom kind. But the extra contact from the front-side, would mean more area per CMOS stack.

FIGS. 5 and 6 depict NMOS and PMOS pass transistors respectively made with Vertical Heterojunction MISFET devices according to the present invention.

Assuming that insulating or semi-insulating barriers can be included in the epitaxial stack, there is another architecture where CMOS, NMOS and PMOS pass transistors can co-exist without area penalty compared with the simple CMOS. In this architecture, three transistor layers are formed where the layers of the bottom transistor are repeated on top of what was the top transistor, which now becomes the middle one. In this new stack, PMOS/NMOS/PMOS, the bottom PMOS will have all sources connected together to the ground. These PMOS and NMOS will be used for the CMOS inverter. Whenever a PMOS pass transistor is needed, the top PMOS will be used. The NMOS can be used as a pass transistor or as a part of the CMOS. In this case there will be no area penalty, and no processing complexity, other than forming the PMOS layers for a second time.

A second object of the present invention is to suggest a new type of integration architecture for Vertical MISFET devices which will solve the four main problems mentioned hereinabove which can occur in CMOS process integration using conventional vertical devices.

A single epitaxial growth step on an unpatterned wafer, where the layers of one type of transistor (say NMOS) are grown sequentially on top of the layers of the other type of transistor (say PMOS), at the beginning of the fabrication process eliminates the requirement for multiple epitaxial runs.

Reducing the gate to drain capacitance comes at a price, which is either higher series resistance, or process complexity, and more critical steps. A "thick" oxide can be grown on the drain areas which are more distant from the channel, while only a thin dielectric is formed on the source, channel and immediate regions of drains. This eliminates the problem of parasitic capacitances resulting from extensive gate overlap of highly doped regions. Naturally, a higher process complexity, is the drawback of such scheme.

A solution for the third problem is the formation of the gate electrode, which if deposited as a fairly thin film, and etched-back (spacer-like) provides a very low overlap on the bottom and top layers (sources of PMOS and NMOS).

The fourth problem will be addressed through a very high degree of self alignment, which results in only 3 or 4 masks (plus the marker layers), to make the entire front end of the CMOS circuit. This is achieved by the careful arrangement of materials, thereby obtaining high etch selectivities, which in turn make possible the high degree of self-alignment.

A general process flow for a vertical CMOS process integration comprises at least the following steps:

Epitaxy of Device Layers,

Deposition of Insulator(s);

Mask 1: Definition of Mesas(which corresponds to the configuration units);

Formation of Gate Stack on Mesas Sidewalls;

Gate Electrode Etchback (Spacers-like Electrode);

Planarization: Filling of Spaces Between Mesas;

Mask 2: Formation of Gate Contact Pad;

Mask 3: (Common) Drain Contact Holes

Formation of Spacers at least Partially on the Internal Side Walls of the Top/Bottom Device;

Contact Hole Filling with Silicide & Metal;

Mask 4: Contact Hole to Source of Top Device;

Contact Hole Filling with Silicide & Metal;

Metallization

For process simplicity, except for contacts, all the rest of processing should be the same for any kind of configuration.

With this scheme, very compact CMOS inverters can be made. For NMOS pass transistors (not depicted), individual contacts to the NMOS source and drain have to be made. But this is not enough, because the gate also overlaps the PMOS layers. Every time the gate switches there is a forward biased PIN diode (with the same cross section of the devices), thereby making the circuit leaky.

Ideally, an insulator should exist between the PMOS and NMOS drains. Considering that the epitaxy of semiconductor/ insulator/ semiconductor, is not developed at the level of the epitaxy of semiconductors only, large semiconductor heterobarriers can provide a semi-insulation and keep the processing compatibility.

A very large heterobarrier for electrons should be placed under the NMOS drain, and one for holes on top of the PMOS drain. This way, injection of holes beyond the PMOS drain and injection of electrons beyond the NMOS drain are blocked. Throughout the cross section of the devices, these drain barriers need not be larger than the transistor's barrier. Because at the gate interface the barriers are lowered, the only way to completely block the current there is to have barriers with roughly two times the height of the transistor's barriers. Unfortunately, the barrier heights obtainable with heteroepitaxy of SiGe on Si may not be enough. Other group IV elements may provide the desired magnitude of band discontinuities.

To cover the several possible architectures, a few process flows are described hereunder more in detail:

For the process flows that follow, several advanced process steps are included. Some of these steps could also be done with less advanced techniques, but that increases the number of steps and sometimes their criticality. Although some of the included steps are not yet commonly used by the microelectronics industry, they might soon be. Others are based on the scientific demonstration of a given process for which there was no obvious application by the industry at large scale. In any case every step which is included in these process flows has been already clearly demonstrated, and is used here for the construction of a completely new CMOS process integration.

The vertical sidewall fomniation, by dry etch and the low temperature arrangement of the gate dielectric and electrode on that surface are important for the fabrication of vertical transistors.

In fabricating heterojunction vertical transistors, the existence of different materials must be taken into account, in cases like the ohmic contacts, where the deposition (selective if possible) of a silicide is preferable because it does not depend on the substrate composition. Highly selective dry etch of PSG over an undoped oxide helps in the self-alignment of some fabrication steps.

For practical reasons, some choices had to be made on what to depict in the drawings. These choices however do not detract from the generality of the invention. For example, the ordering of which transistor is on the bottom or on the top is flexible. Another example is the arrangement of ohmic contacts through selective deposition of suicides and metals. These could, of course, be made in a more conventional way, by deposition and etchback. The silicides could be replaced by germanides for example. Again, the specification of materials or of particular ways to achieve a certain result are given as examples, not as exclusive ways of conducting them.

Also optional, is the removal of the wafer bulk in some flows. The contact to all PMOS sources can be made with or without removing the wafer bulk. This removal can be usefuil for very high frequency circuits, where the wafer bulk could introduce parasitic interferences in the circuits. In some of the flows this optional removal is shown.

Process Flow

Flows 1 and 2 present different processing possibilities to implement CMOS architectures where NMOS pass transistors are possible provided that drain barriers can be implemented, or provided that the leakage current, in the absence of drain barriers, is tolerable. More particularly, flow 2 shows a process sequence slightly different from flow 1 at the point of the formation of the gate contact pad and thereafter. This alternative way seems to provide less critical processing steps. As an example, FIGS. 7.1–7.7 and 8.1–8.4 represent the manufacturing of a CMOS inverter according to these process flows 1 and 2.

Flow 3, shows one possible architecture for the fabrication of complementary pass-transistors. This is achieved by not having all the bottom transistor sources connected together. There is some area penalty (compared to flows 1 and 2) to make inverters due to the need of providing contact to the bottom source for every single bottom transistor. As an example, a CMOS process flow is shown in FIGS. 9.1–9.4.

In Flow 4, another integration architecture is shown that makes complementary pass-transistors possible, without area penalty. In this flow, the layers of the bottom transistor are again deposited on top, thereby arranging a triple transistor stack. All the sources of the bottom transistors are connected together for the CMOS inverters, and the same kind of transistor can also be used as a pass-transistor by using the third layer stack on top. This scheme offers all the advantages of flows 1, 2 and 3 without the drawbacks of flow 3 (in terms of integration integrity), and allow all possible circuit designs (impossible with flows 1 and 2). As an example, a NMOS (middle transistor layers) pass-transistor process is shown in the flow.

One circuit application of flow 4, is the 6-transistor (6T) Static Random Access Memory (SCRAM) Cell. That cell is made of 2 pass-transistors and 2 CMOS inverters. With the present invention, the area of the 6T Cell can be reduced by at least 30% compared to the standard implementation with planar technologies. That is achieved because of the reduced area taken by the CMOS inverter, when NMOS and PMOS are stacked upon each other instead of side by side. An example is shown in FIGS. 10.1–10.3.

In all flows, drain barriers are shown in the drawings. In case they are not possible to make because of insufficient band-offsets, or if they are just not desired, they can be omitted, without detracting from the general concept of the present invention. Ideally, the barriers are made of an insulator, epitaxially compatible with silicon. Quite a few of these materials exist and are applied in Silicon on Insulator (SOI) planar technologies. A short list of those materials includes:

1) $Al_2O_3$ (Sapphire=Aluminium Oxide)
2) CaF (Calcium Fluoride)
3) $CeO_2$ (Cerium Dioxide)
4) AlN (Aluminium Nitride)
5) SrO (Strontium Oxide)
6) $SrTiO_3$ (Strontium Titanate)
7) $BaTiO_3$ (Barrium Titanate)
8) $SrVO_3$ (Strontium Vanadium Oxide)

Wafer bonding is between silicon wafers with VH-PMOS, and Ge wafer with VH-NMOS. Naturally, there is an oxide between them, and therefore there is no need for extra barriers.

Flow 1
  The starting material is an undoped <100>Si Cz wafer.
  Zero markers can be made before or after the epitaxial growth. For simplicity, it is assumed that they are made before the epitaxial growth is performed.
1) Pre-epitaxy clean
2) Epitaxial deposition of transistor layers
3) Deposition (RT-CVD for example) of silicon-dioxide
4) Deposition (RT-CVD for example) of silicon-nitride
5) Lithography: Mask 1 (definition of gates)
6) Dry etch nitride, stopping on oxide (resist is not shown)
7) Resist strip (and possibly a clean)
8) Removal of oxide (HF vapor or dip, for example)
9) Damageless etch (dry or wet) of epi stack, into the Si wafer
10) Formation (growth or deposition) of gate dielectric
11) Deposition (RT-CVD for example) of gate electrode
12) Etchback of gate electrode (this might also remove partially or totally the gate dielectric)
FIG. 7.1
13) Deposition (PE-CVD for example) of oxide
14) Etchback of oxide, to planarize, and slightly recess the oxide
15) Deposition (RT or PE-CVD for example) of TiN
16) Deposition (PE-CVD for example) of oxide
17) Lithography—Mask 2: Gate Isolation & Top Contact
18) Dry etch of the top oxide layer forming a pattern (resist is not shown)
19) Dry etch of the TiN (selective against oxide)
20) Dry etch of nitride (selective against oxide)
FIG. 7.2
21) Resist-strip and possibly a clean
22) Deposition (RT-CVD for example) of nitride
FIG. 7.3
23) Etchback (spacers) of nitride (selective against oxide)
24) Oxide removal (HF dip or vapor for example)
25) Selective CVD of TiSi$_2$
26) Selective CVD of TiN
FIG. 7.4
27) Deposition (CVD for example) of oxide
28) Lithography: Mask 3: Output Contact
29) Dry etch of oxide, stopping on nitride and TiN (resist is not shown)
FIG. 7.5
30) Etch, wet or dry, (can be isotropic) of TiN selective against nitride
31) Resist strip and possibly a clean
32) Dry etch of nitride (selective against oxide)
33) Oxide removal (HF dip or vapor for example) in the output contact area
34) Damageless dry etch of Si, stopping on top drain
FIG. 7.6
35) Deposition (RT-CVD for example) of oxide
36) Deposition (RT-CVD for example) of nitride
37) Etchback of nitride (spacers), stopping on oxide
38) Oxide removal (HF dip or vapor for example)
39) Damageless dry etch of Si, stopping on the top bottom drain
40) Selective CVD of TiSi$_2$
41) Selective CVD of TiN
42) Deposition (CVD for example) of oxide (gap-filling—planarizing)
FIG. 7.7
  Metalization & Passivation (BACK-END) FIG. 29 KOH etch of the undoped wafer's backside, stopping on the highly boron doped buffer Deposition of thick metal layer onto the backside of the wafer. Dicing and Packaging.

Flow 2
  Wafer in—The starting material is an undoped <100>Si Cz wafer.
  Zero markers can be made before or after the epitaxial growth. For simplicity, it is assumed that they are made before the epitaxial growth is performed.
1) Pre-epitaxy clean
2) Epitaxial deposition of the transistor layers.
3) Deposition (CVD for example) of silicon-dioxide
4) Deposition (CVD for example) of silicon-nitride
5) Lithography: Mask 1 (definition of gates)
6) Dry etch nitride, stopping on oxide (resist is not shown)
7) Resist strip and possibly a clean
8) Removal of oxide (HF vapor or dip, for example)
  In a simpler process flow, the next step, damageless etch of the epitaxial layers, would be done through the entire stack at once. The process would proceed by an immediate formation of the gate dielectric.
  These extra steps are a possible route for the minimization of parasitic capacitances caused by the gate to source and drain overlapping. With these steps, a thick oxide is formed between the gate electrode and the extended regions of source and drain.
9) Damageless etch (dry or wet) of epi stack, stopping in the drain layer of the top transistor
10) Deposition (RT-CVD for example) of thin oxide (20 nm for example)
11) Deposition (RT-CVD for example) of thin nitride (30 nm for example)
12) Nitride etchback, stopping on oxide
13) Low temperature oxidation
FIG. 8.1
14) Isotropic etch of nitride, selective against oxide
15) Removal of the spacer oxide (HF vapor for example)
16) Anisotropic etch of oxide formed by the low temperature oxidation, stopping on epi layer
17) Damageless etch of the remaining of the epi stack, into the Si wafer
18) Formation (growth or deposition) of gate dielectric
19) Deposition (RT-CVD for example) of gate electrode
20) Etchback of gate electrode
21) Deposition of oxide
22) Etchback of oxide, to planarize
23) Deposition (RT-CVD for example) of PSG.
24) Lithography: Mask 2 (contact to the gate electrode)
25) Selective dry etch of PSG. PSG can be dry etched with large selectivities against oxide, nitride and TiN
26) Resist strip
27) Selective deposition (CVD for example) of metal (TiN for example), in order to make the gate contact pads. It could also be done through a more conventional technique, like CVD and etchback.
28) Deposition of a thin nitride layer.
FIG. 8.2
29) Lithography: Mask 3 (contact to the drains)
30) Dry etch of nitride, PSG, nitride, stopping on oxide
31) Resist strip.
32) Oxide removal (HF dip or vapor for example).
33) Damageless etch (wet or dry) of epitaxial layers until the drain of the top transistor is reached.
34) Spacer formation by CVD and etchback of oxide (or oxide/nitride combination).
35) Damageless etch (wet or dry) of epitaxial layers until the bottom drain is reached.
36) Selective deposition (CVD for example) of Ti-silicide.
37) Selective deposition (CVD for example) of TiN, and possibly a more conductive metal (copper for example).

38) Deposition (CVD for example) of a thin nitride layer.
FIG. 8.3
39) Lithography: Mask 4 (contact to the drains).
40) Dry etch of nitride, PSG, nitride, stopping on oxide.
41) Resist strip.
42) Oxide removal (HF vapor or dip for example)
43) Selective deposition (CVD for example) of Titanium-disilicide
44) Selective deposition (CVD for example) of TiN, and possibly a more conductive metal (copper for example).
45) Deposition (RT-CVD for example) of nitride Metallization & Passivation (BACK-END) KOH etch of the undoped wafer's backside, stopping on the highly p-type (boron for example) doped layer. Deposition of siuicide and metal (copper alloy for example) onto the backside of the wafer.
FIG. 8.4

Dicing and Packaging.
Flow 3

Wafer in—The starting material is an undoped <100> Si Cz wafer. Zero markers can be made before or after the epitaxial growth. For simplicity, it is assumed that they are made before the epitaxial growth is performed.
1) Pre-epitaxy clean
2) Epitaxial deposition of the transistor layers (possibly a n-type layer prior to the PMOS, or a p-type layer if the NMOS was put under the PMOS)
3) Deposition (CVD for example) of silicon-dioxide
4) Deposition (CVD for example) of silicon-nitride
5) Lithography: Mask 1 (definition of gates)
6) Dry etch nitride, stopping on oxide
7) Resist strip and possibly a clean
8) Removal of oxide (HF vapor or dip, for example)

In a simpler process flow, the next step, damageless etch of the epitaxial layers, would be done through the entire stack at once. The process would proceed by an immediate formation of the gate dielectric.

These extra steps are a possible route for the minimization of parasitic capacitances caused by the gate to source and drain overlapping. With these steps, a thick oxide is formed between the gate electrode and the extended regions of source and drain.
9) Damageless etch (dry or wet) of epi stack, stopping in the drain layer of the top transistor
10) Deposition (RT-CVD for example) of thin oxide (20 nm for example)
11) Deposition (RT-CVD for example) of thin nitride (30 nm for example)
12) Nitride etchback, stopping on oxide
13) Low temperature oxidation
14) Isotropic etch of nitride, selective against oxide
15) Removal of the spacer oxide (HF vapor for example)
16) Anisotropic etch of oxide, stopping on epi layer
17) Damageless etch (wet or dry) of the remaining of the epi stack, into the Si wafer
18) Formation (growth or deposition) of gate dielectric
19) Deposition (RT-CVD for example) of gate electrode
20) Etchback of gate electrode
21) Deposition of oxide
22) Etchback of oxide, to planarize
23) Deposition (RT-CVD for example) of PSG.
24) Lithography: Mask 2 (contact to the gate electrode)
25) Selective dry etch of PSG. PSG can be dry etched with large selectivities against oxide, nitride and TiN.
26) Resist strip
27) Selective deposition (CVD for example) of metal (TiN for example), in order to make the gate contact pads. It could also be done through a more conventional technique, like CVD and etchback.
28) Deposition of a thin nitride layer.
FIG. 9.1
29) Lithography: Mask 3 (contact to the drains)
30) Dry etch of nitride, PSG, nitride, stopping on oxide
31) Resist strip.
32) Oxide removal (HF dip or vapor for example).
33) Damageless etch (wet or dry) of epitaxial layers until the drain of the top transistor is reached. For a PMOS pass-transistor, this etch would continue down to the drain of the PMOS, followed by the spacer formation.
34) Spacer formation by CVD and etchback of oxide (or oxide/nitride combination).
35) Damageless etch (wet or dry) of epitaxial layers until the bottom drain is reached.
36) Selective deposition (CVD for example) of Ti-silicide
37) Selective deposition (CVD for example) of TiN, and possibly a more conductive metal (copper for example).
38) Deposition (CVD for example) of a thin nitride layer.
FIG. 9.2
39) Lithography: Mask 3 (contact to the drains).
40) Dry etch of nitride, PSG, nitride, stopping on oxide.
41) Resist strip.
42) Oxide removal (HF vapor or dip for example)
43) Selective CVD of Titanium-disilicide
44) Selective CVD of TiN, and possibly a more conductive metal (copper for example), and deposition (CVD for example) a thin nitride layer.
FIG. 9.3
45) Lithography: Mask 4 (contact to the drains).
46) Dry etch of nitride, PSG, nitride, stopping on oxide.
47) Resist strip.
48) Oxide removal (HF dip or vapor for example).
49) Damageless etch (wet or dry) of epitaxial layers until the source of the bottom transistor is reached.
50) Spacer formation by CVD and etchback of oxide (or oxide/nitride combination).
51) Selective deposition (CVD for example) of Titanium-disilicide
52) Selective deposition (CVD for example) of TiN, and possibly a more conductive metal (copper for example).
53) Deposition (RT-CVD for example) of nitride
FIG. 9.4

Metallization & Passivation (BACK-END) Dicing and Packaging.
Flow 4

Wafer in—The starting material is an undoped <100> Si Cz wafer.

Zero markers can be made before or after the epitaxial growth. For simplicity, it is assumed that they are made before the epitaxial growth is performed.
1) Pre-epitaxy clean
2) Epitaxial deposition of the transistor layers
3) Deposition (CVD for example) of silicon-dioxide
4) Deposition (CVD for example) of silicon-nitride
5) Lithography: Mask 1 (definition of gates)
6) Dry etch nitride, stopping on oxide
7) Resist strip and possibly a clean
8) Removal of oxide (HF vapor or dip, for example)

In a simpler process flow, the next step, damageless etch of the epitaxial layers, would be done through the entire stack at once. The process would proceed by an irmnediate formation of the gate dielectric.

These extra steps are a possible route for the minimization of parasitic capacitances caused by the gate to source and drain overlapping. With these steps, a thick oxide is formed between the gate electrode and the extended regions of source and drain.

9) Damageless etch (dry or wet) of epi stack, stopping in the drain of the middle transistor
10) Deposition (RT-CVD for example) of thin oxide (20 nm for example)
11) Deposition (RT-CVD for example) of thin nitride (30 nm for example)
12) Nitride etchback, stopping on oxide
13) Low temperature oxidation

FIG. 10.1

14) Isotropic etch of nitride, selective against oxide
15) Removal of the spacer oxide (HF vapor for example)
16) Anisotropic etch of oxide, stopping on epi layer
17) Damageless etch of the remaining of the epi stack, into the Si wafer
18) Formation (growth or deposition) of gate dielectric
19) Deposition (RT-CVD for example) of gate electrode
20) Etchback of gate electrode
21) Deposition of oxide
22) Etchback of oxide, to planarize
23) Deposition (RT-CVD for example) of PSG.
24) Lithography: Mask 2 (contact to the gate electrode)
25) Selective dry etch of PSG. PSG can be dry etched with large selectivities against oxide, nitride and TiN.
26) Resist strip
27) Selective deposition (CVD for example) of metal (TiN for example), in order to make the gate contact pads. It could also be done through a more conventional technique, like CVD and etchback.
28) Deposition of a thin nitride layer.

FIG. 10.2

29) Lithography: Mask 3 (contact to the chosen drain or drains)
30) Dry etch of nitride, PSG, nitride, stopping on oxide
31) Resist strip.
32) Oxide removal (HF dip or vapor for example).
33) Damageless etch (wet or dry) of epitaxial layers until the source of the middle transistor is reached.
34) Spacer formation by CVD and etchback of oxide (or oxide/nitride combination).
35) Damageless etch (wet or dry) of epitaxial layers until the other drain is reached.
36) Selective deposition (CVD for example) of Ti-silicide.
37) Selective deposition (CVD for example) of TiN, and possibly a more conductive metal (copper for example).
38) Deposition (CVD for example) of a thin nitride layer.

FIG. 10.3

39) Lithography: Mask 3 (contact to the drains).
40) Dry etch of nitride, PSG, nitride, stopping on oxide.
41) Resist strip.
42) Oxide removal (HF vapor or dip for example)
43) Selective deposition (CVD for example) of Titanium-disilicide
44) Selective deposition (CVD for example) of TiN, and possibly a more conductive metal (copper for example).
45) Deposition (RT-CVD for example) of nitride Metallization & Passivation (BACK-END) KOH etch of the undoped wafer's backside, stopping on the highly p-type (boron for example) doped layer.

Deposition of silicide and metal (copper alloy for example) onto the backside of the wafer.

Dicing and Packaging.

Another aspect of the present invention relates to DRAM circuits having memory cells using Vertical MISFET devices which allow significant reductions in cells area compared to planar MISFETs. The area gains come solely from the fact that, in vertical transistors, the source, drain and channel are stacked upon each other and there are no well contacts because vertical MOSFETs have the gate dielectric all around the pillar structure.

The use of Vertical MISFETs permits significant gains in the number of stored bits per unit area (bit density) by making use of another spatial direction and fabricating three dimensional structures.

New architectures and fabrication process flows of memory circuits using Vertical MISFETs have been devised and are now presented. These new architectures and processes can be adjusted to the particular configuration to be implemented, such as Dynamic RAM, Non Volatile RAM, Multiple Value RAM, etc.

Yet another improvement in memory fabrication technology brought by vertical transistors is the possibility of simultaneous front-end fabrication of the CMOS logic and memory cell transistors. The fabrication is simultaneous and without any duplication of process steps. Additional process steps come only when contacts to several junction layers have to be made. Because contacts in different layers need different patterning steps, different device/circuit configurations increase the number of those steps.

Several preferred embodiments for DRAM cells according to the present invention are described more in detail hereunder with reference to specific process flows.

1. One transistor and one capacitor (1T+1C) cell

Standard DRAM cells are made of one transistor and one capacitor. The future trend seems to be for "wide bit" systems, that is several bits are written or read simultaneously. This trend is absolutely natural in view of the fact that the largest application of DRAMs is in microprocessor based systems like PCs.

In such cells, the gates of the "wide bit" all work in parallel, and therefore can share the same contact. For planar technology, this feature does not bring any particular benefit. For Vertical MOSFETs, that feature causes a dramatic improvement in integration density. The cell area is down to 2L by 2L, L being the minimal feature size (see also flows 5, 6, and 7 detailed hereunder).

The new cell takes advantage of the fact that the footprint of a vertical MOSFET (without contact) can be much smaller than the footprint of planar MOSFETs. In vertical MOSFETs, the regions of source, channel and drain are stacked upon each other, effectively having the footprint of one. This is true as long as individual contacts to the regions of each MOSFET in the circuit are not required.

If the RAM architecture required individual contacts to the source, drain and gate of each transistor, there would be no area advantage of vertical over planar MOSFETs. With a "wide bit" arrangement, Wordline contact is made simultaneously to several transistors, and that is what gives the advantage to vertical MOSFETs. The "wider" the bit, the larger the advantage.

It is also very important to emphasize the fact that these are D-Gate All Around MOSFETs, which have no leakage (substrate) currents. Having extremely small leakage currents is a very important advantage over planar bulk MOSFETs.

To a certain extent, the area does not depend on the overlay accuracy of the lithography equipment. The first masking step consists of dense lines and spaces, and the second masking step consists also of dense lines and spaces, but perpendicular to mask 1. For these two steps, there are no critical alignment requirements. For the third lithography step, which involves the separation between gates (Worldlines) of different cells, alignment is critical if area penalty is to be avoided. The tolerances for misalignments are provided by the spacers around the individual vertical MOSFETs. If the stepper's overlay inaccuracy is less than the spacer thickness, then there is no area penalty, and the cell can be constructed with the minimum dimensions allowed by lithography.

This architecture can also be used for Multiple Value (MV) DRAM. Here again, it provides advantages over planage technology due to the fact that the vertical MOSFETs can have very short channels, and therefore much improved electrical characteristics. For example, using 0.35 µm design rules, for planar transistors this means that the shortest gate length possible to print is indeed 0.35 µm. For vertical MOSFETs, this means that the cross section of the MOSFET is 0.35 µm, while the channel length, if defined by epitaxy, can be 0.1 µm or smaller.

A general process flow for manufacturing Vertical MISFET memory cells according to this first embodiment of the present invention comprises at least the following steps:

Epitaxy of Cell Transistor Layers;
Deposition of Insulator(s);
Formation of 1st Trenches;
Formation of 2nd Trenches (perpendicular to 1st ones);
Formation of Surrounding Gate Insulator;
Deposition & Etchback of Gate Electrode;
Oxidation of Gate Electrode below the top Epi-Layer;
Removal of $Si_3N_4$ 1 $SiO_2$ from the EPI-MESAS;
Formation of Poly-Plug on the Epi-MESAS;
Removal of Oxidised Poly from the Gate Electrode;
Formation of $SiO_2$ Spacers around Poly-Plugs;
Patterning of Gate Electrode;
Planarization;
Formation of Capacitor: Consisting in Insulator & Electrode The following flows: flow 5, flow 6, and flow 7 related to FIGS. 12.1–12.5, 13.1–13.3 and 14.1–14.2 respectively are examples of manufactured (1T+1C) cells.

Flow 5
1) Undoped substrate.
2) Full Clean.
3) Epi-growth of the vertical transistor.
4) CVD of thin (~20 nm) oxide/ thick (>200 nm) nitride.
5) Litho (MASK 1: lines and spaces with minimum dimensions).
6) Dry etch of nitride, stopping on the oxide.
7) HF-dip (or vapor) to remove exposed oxide.
8) Damageless (dry or wet) etch of crystalline silicon layers (Drain & Channel), stopping on the bottom highly doped n++ layer (Source).

In order to obtain some selectivity (>40:1 for dry etch, and much larger for wet etch), it is possible to have SiGe strained layers in the Source region.

9) Resist strip.
10) Litho (MASK2 lines and spaces perpendicular to the first ones).
11) Dry etch of nitride, stopping on the oxide.
12) HF-dip (or vapor) to remove exposed oxide.
13) Damageless (dry or wet) etch of the full epi-stack into the undoped substrate.
14) Resist strip.
15) Full Clean.
16) Gate oxidation.

FIG. 12.1
17) CVD of a "thick" layer of in-situ doped poly SiGe (or just Ge).
18) Poly etchback, stopping on the nitride level of the squares defined by the double trenching.
19) Low temperature, (PE ?) oxidation of the poly SiGe (or just Ge).

At least for furnace wet oxidation, below 700° C., poly SiGe oxidizes much faster than just poly Si. Experimental results show that with just 30 % Ge, there is an order of magnitude improvement in the oxidation rate at 700° C. For larger Ge content or even just Ge poly, it is reasonable to expect even larger differences in oxidation rates.

FIG. 12.2
{The interface between poly-SiGe and oxidized-poly-SiGe must be below the thin oxide deposited at the beginning of the flow. This constraint can be relaxed a bit by performing step 21.}
20) Selective (against oxide) etch (dry or wet), of the nitride.
21) Low temperature (PE ?) poly (SiGe or just Ge) oxidation. This creates an oxide on the poly side walls thereby preventing a short with the contact to the top of the transistor.

Due to the large difference in oxidation rates between poly SiGe (or just Ge) and crystalline silicon, a negligible oxide will grow under the thin deposited one at the beginning of the process.

This removes any possible problems due inhomogeneities in steps 18 and 19.

22) Oxide (Spacer etch process) etchback to remove the thin PE-oxide layer, removing the least oxidized poly possible (which is much thicker than the deposited thin oxide).
23) In-situ doped poly plug by selective growth, or blanket deposition and etchback.
24) HF to remove the oxidized poly.
25) Low temperature (PE ?) oxidation, to form a thin (<5 nm) film.
26) CVD and etchback of oxide, to make spacers. This thickness, being larger than the stepper's overlay accuracy, will define the width of the trench between the gates of the different cells.

FIG. 12.3
27) Litho (MASK4: Resist lines to protect the BITLINES).
28) Selective dry etch of poly (against oxide spacers).
29) Resist strip.

FIG. 12.4
30) Cobalt (or Nickel) salicidation of the poly gate electrode and of the top of the poly plugs. These silicides can be formed at low temperature (300° C. for Ni), and cannot be dry etched. It might be difficult to remove the unreacted metal from the bottom of the trenches. It should also react on the side walls of the poly, which is under the oxide spacers.
31) Planarization by oxide deposition (and/or SOG), and etchback.

Prior to SOG deposition, it may be advantageous to grow (PE ?) a thicker oxide on the bottom, in order to better protect the gate area.

32) Deposition of the capacitor stack (for example, CVD of BaSrTiO (BST)/ TiN). Given a large enough capacitance through the use of the verv strong dielectric (>500), a small capacitance loss due to possible misalignment of the cell plate patterning to the salicided plugs, is admissible.

By eliminating the deposition of bottom electrode (on the salicided plugs, under the strong dielectric), process complexities and tolerance constraints are greatly reduced for the patterning of the cell plate.

Selective growth of a metal on the salicided plugs (thereby putting the distance between individual capacitors to a minimum) may further minimize the capacitance loss.

33) Litho (Mask5: definition of the cell plate)
34) Dry etch of the cell plate (TiN), stopping on the strong dielectric film.
35) Resist strip.

FIG. 12.5
Flow 6
1) P-type substrate, for NMOS cell transistor (n-type substrate and PMOS cell transistor could also be used).
2) Pre-epitaxy clean.
3) Epi-growth of the vertical transistor.
4) CVD of thin (20 nm for example) oxide/ thick (>200 nm for example) nitride.

5) Litho (MASK1: lines and spaces with minimum dimensions).
6) Dry etch of nitride, stopping on the oxide. (resist is not shown)
7) Oxide removal (HF dip or vapor for example). (resist is not shown)
8) Damageless (dry or wet) etch of crystalline silicon layers (Drain & Channel), stopping on the bottom highly doped n++ layer (Source). Strained SiGe layers can be incorporated in the source region, to provide an etch marker layer (selectivities >40:1 for dry etch, and much larger for wet etch).
9) Resist strip.
10) Clean.
11) Low temperature (plasma assisted for example) thin oxide film growth, for protection of the semiconductor areas, against nitride etch.
12) Litho (MASK2 lines and spaces perpendicular to the first ones).
13) Dry etch of nitride, stopping on the oxide.
14) Oxide removal (HF dip or vapor for example).
15) Damageless (dry or wet) etch of the full epi-stack into the undoped substrate.
16) Resist strip.
17) Clean.
18) Gate dielectric formation (growth or deposition). Oxide growth is shown.

FIG. 13.1
19) Deposition (CVD for example) of in-situ doped poly SiGe (Ge content can be from 0 to 100%).
20) Poly etchback, stopping on the nitride level of the squares defined by the double trenching.
21) Low temperature, (plasma assisted for example) oxidation of the poly. The interface between oxidized and non-oxidized poly should be below the thin oxide deposited at the beginning of the flow.
22) Selective (against oxide) etch (dry or wet), of the nitride.
23) Removal of thin oxide film from the bottom of the hole.
24) In-situ doped poly plug by selective growth, or blanket deposition and etchback.
25) Formation of a salicide (Ni or Co for example) on the top of the poly plugs, or selective deposition of a conductive material (TiN for example). The material which is arranged on top of the plugs, should be a good mask against dry etch poly. (a silicide is shown)
26) Oxidised poly removal against the material on top of the poly plugs. (HF dip or vapor for example).

FIG. 13.2
27) Deposition (CVD for example) and etchback of oxide, to make spacers. This thickness, being larger than the stepper's overlay accuracy, will define the width of the trench between the gates of the different cells. It also makes possible a surrounding gate for the vertical MOSFETs.
28) Litho (MASK4: Resist lines to protect the BITLINES).
29) Selective dry etch of poly (against oxide spacers and gate dielectric).
30) Resist strip.
31) Optional (Cobalt or Nickel) silicidation of the poly gate electrode and of the top of the poly plugs. These suicides can be formed at low temperature (350° C. for Ni).
32) Planarization. It can be done by oxide deposition, and etchback; and/or SOG.
29) Deposition of the capacitor stack. For example, the dielectric can be BST (BaSrTiO) and the cell plate can be TiN.

FIG. 13.3
Contacts to the bitlines and word lines can be etched through the cell plate. Appropriate care must be taken to avoid a short between the cell plate and those contacts. Such is possible through the formation of spacers inside the contact holes, prior to the formation of the conductive plug. This way, the patterning of the cell plate is not necessary.
Flow 7
1) P-type substrate, for NMOS cell transistor (n-type substrate and PMOS cell transistor could also be used).
2) Pre-Epitaxial Clean.
3) Epi-growth of the vertical transistor.
4) Deposition of capacitor's bottom electrode.
5) Deposition of capacitor's dielectric.
6) Deposition of capacitor's top electrode (one or more films of pure or alloyed metals).
7) Litho (MASK1: lines and spaces with minimum dimensions).
8) Dry etch of the capacitor layers (top electrode, dielectric and bottom electrode).
9) Dry etch of crystalline silicon layers (Drain & Channel), stopping on the bottom highly doped layer (Source).
In order to obtain some selectivity (>40:1 for dry etch, and much larger for wet etch), it is possible to have SiGe strained layers in the Source region.
10) Resist strip.
11) Litho (MASK2 lines and spaces perpendicular to the first ones).
12) Dry etch of the capacitor layers (top electrode, dielectric and bottom electrode).
13) Damageless (dry or wet) etch of the fill epi-stack into the undoped substrate.
14) Resist strip.
15) Clean.
16) Deposition of gate dielectric.

FIG. 14.1 (a deposited oxide is shown)
17) Deposition of a gate electrode [poly SiGe (Ge % can be from 0 to 100%) or metal].
18) Etchback of gate electrode, stopping on the gate dielectric on top of capacitor.
19) Controlled recess of the gate electrode. If the gate electrode is poly Si or SiGe (or even just Ge), low temperature, (PE ?) oxidation can be used. If the gate electrode was a metal (W for example), then a simple etchback could be used.
The recess should go below the bottom capacitor electrode.
20) If the gate electrode recess was done through poly oxidation, then this oxide must be removed (HF dip or vapor for example)
21) CVD and etchback of oxide, to make spacers. This thickness, being larger than the stepper's overlay accuracy, will define the width of the trench between the gates of the different cells. It also makes possible the gate all around.
22) Litho (MASK4: Resist lines to protect the BITLINES).
23) Selective dry etch of gate electrode (against oxide spacers).
24) Resist strip.

FIG. 14.2
25) Planarization by oxide deposition (and/or SOG), and etchback.
26) Deposition of metal (cell plate) Cell plate common to all capacitors
Contacts to the bitlines and word lines can be etched through the cell plate. Appropriate care must be taken to avoid a short between the cell plate and those contacts. This is possible through the formation of spacers inside the contact holes, prior to the formation of the conductive plug such that the patterning of the cell plate is not necessary.

2. Two transistors and one capacitor (2T+1C) new cell

Also, a new design has been developed with two (complementary) transistors and one capacitor (2T cells). Such a cell allows the doubling of the dynamic range of the applied bias at the capacitor's plates. With planar technologies, the second transistor in the cell would create an area penalty, which might not be justifiable. With vertical transistors (PMOS and NMOS) stacked upon each other, and with the capacitor (insulator) in-between them, there is no area penalty, and the fabrication of the cell is highly self-aligned.

FIG. 11 shows the schematic of the cell, which in fact is very suitable for storing analogue signals. The operation of this cell is as follows:

Write operation:

Btl1 (Source of the Top Transistor—NMOS) =value to be written

Btl2 (Source of the Bottom Transistor—PMOS) =value to be written

Wordline (Gate)=0→1 to turn the NMOS on and bring the Btl 1 value to the capacitor top plate (while PMOS is off and therefore the bottom plate is isolated from Btl2)

Wordline (Gate)=0→1 to turn the PMOS on and bring the Btl2 value to the capacitor bottom plate (while NMOS is off and therefore the top plate is isolated from Btl1)

Read operation.

Btl1 (Source of Top Transistor—NMOS)=read mode

Btl2 (Source of Bottom Transistor–PMOS)=read mode

Wordline (Gate)=0→1 brings Btl 1 to the potential of top plate (bottom plate is isolated from Btl2) Wordline (Gate)=0→1 brings Btl2 to the potential of bottom plate (top plate is isolated from Btl1)

The new T2 cell will also markedly improve performance of Multiple Value (MV) RAMs. The reason for this increase is that the dual transistor cell doubles the voltage across the capacitor by providing both polarities, and therefore the number of multiple voltage levels can also be doubled.

Furthermore, if the capacitor's insulator has ferroelectric properties, there is no need for changes in the flow in order to have a Ferroelectric Random Access Memory (FRAM). The dual MOSFET cell is highly desirable for FRAMs because it provides positive and negative polarities to the capacitor plates. This is a highly useful feature for circuits with such materials.

Since the 2T Cell includes NMOS and PMOS and since they are in a configuration where the Front-End is processed in the same way as in Vertical integration of Vertical MOSFETs, both cell and logic transistors are made simultaneously. This is achieved without any duplication of process steps. All process steps such as epitaxy, etch of vertical structures, gate stack formation, planarization, etc., are done only once. The differentiation is introduced when contacts and interconnects are made. For cell transistors, only the sources and gates are contacted (each drain faces a plate of the capacitor). For logic transistors, drains can also be contacted. For the bottom transistor, this means a contact hole etch through the capacitor. This represents a huge process simplification and cost saving compared to standard DRAM fabrication.

These enhancements are independent of the ways the transistors are fabricated whether by ion implantation, solid phase recrystallization, poly transistors, fully epitaxial CVD or other methods, and also of the substrates used (Bulk or SOI). Due to the intrinsic nature of each of these processes, it is natural to expect maximum electrical performance if those transistors are fully epitaxially grown. Maximum electrical performance can be directly translated into the number of multiple voltage levels possible, for a given voltage supply.

The fabrication of the two-transistor cell (2T cell) is ideally achieved with the capacitor's dielectric being epitaxially compatible with silicon. In that case, the process flow would start wide the epitaxy of the bottom transistor layers, followed by the epitaxy of the insulator, and by the epitaxy of the top transistor layers. The epitaxy approach has the added advantage that an epitaxial insulator will be able to withstand far more write/read cycles than silicon dioxide for example (IE06). This will in turn allow more applications.

A second approach involves wafer-bonding. In this case, PMOS and the NMOS would be epitaxially grown on two separate wafers, and then bonded together, with the insulator sandwiched between them. In this case, it seems that it is also possible to have single crystal (ferroelectric or not) insulator.

A third alternative is to make the top transistor as a poly transistor, where in-situ doped poly layers would be deposited sequentially on the capacitor's dielectric to form the active regions of the transistor.

In all cases, the entire process to make the cell is self-aligned for both transistors and for the capacitor. In all cases also, both transistors can have two (source/channel and channel/drain) or may be of Multi-Junction type.

Since all the processing is identical until Back-Ends the difference between a logic circuit with some memory and a memory circuit with some logic, is that for the first one, the voltage supply will be lower, and therefore, the number of junctions in a transistor will be low (or the minimum), and so will be the number of values possible to store in the capacitor. For the memory, the number of storage levels is maximized and therefore all transistors in the memory cell and CMOS logic are of the Multi-Junction type. Naturally there might be a limit on the number of logic transistors, due to power dissipation.

In fact, the process flow for the 2T cell, can simplify and unify the fabrication of logic, memory and power transistors in a single die. The power dissipation problem affecting Multi-Junctions can be solved by having Multiple-Heterojunctions in place of Multiple-Homojunctions, due to the fact the current can be ballistic at room temperature if Vertical Multi-Heterojunction MOSFETs are used.

Assuming a stepper with 0.3S $\mu$m resolution for dense lines and spaces, the area of a cell is given by: A=(2×0.35× 2×0.35)=(07×07)=0.49 cm$^2$. Since $1\mu m^2 = 1E^{-8} cm^2$, and since $1Giga=1E^9$, the area taken by 1 Giga cells is: cells is $0.49\mu m^2 \times 1E9 = 4.9E^8 \mu m^2 = 4.9 cm^2$.

As an example, ASML PAS 5500/100 has 6.028 cm$^2$ field. It is certainly possible to include one Gigabit die and all the necessary logic circuitry in this field.

A general process flow for manufacturing Vertical MIS-FET memory cell according to the second embodiment of the present invention comprises the following steps:

Formation of Complementary Transistor Stack with Capacitor in between Drains;

Deposition of Insulator(s);

Formation of 1st Trenches;

Formation of 2nd Trenches (perpendicular to 1st ones);

Formation of Surrounding Gate Insulator;

Deposition of Etchback of Gate Electrode;

Oxidation of Gate Electrode below the top Epi-Layer;

Removal of Si$_3$N$_4$ & SiO$_2$ from the Epi-MESAS;

Formation of Poly-Plug on the Epi-MESAS;

Removal of Oxidised Poly from Gate Electrode;

Formation of SiO$_2$ Spacers around Poly-Plugs;
Patterning of Gate Electrode;
Planarization+Deposition of Top Electrode;
Patterning of Top Electrode The following flows: flow 8, flow 9 related to FIGS. 15.1–15.2 and 16.1–16.4 respectively are examples of manufactured (2T+1C) cells.

Flow 8
(2T Cell: With Fully Epitaxial Stack)
1) N-type substrate.
2) Pre-Epitaxial Clean.
3) Epi-deposition of PMOS layers.
4) +deposition of epitaxial insulator
5) +epi-deposition of NMOS layers
6) CVD of thin oxide+thick nitride.
7) Litho MASK 1: lines and spaces (with minimum dimensions for cell transistors).
8) Dry etch of nitride, stopping on oxide.
9) Resist strip+clean.
10) Damageless oxide removal: HF vapor for example.
11) Damageless dry etch of crystalline silicon layers, stopping in the bottom highly doped layer (PMOS Source). In order to obtain some selectivity (>40:1 for dry etch, and more for wet etch), it is possible to have SiGe strained layers in the Source region.
12) Low temperature growth of a sacrificial oxide.
13) Litho (MASK2 lines and spaces perpendicular to the first ones).
14) Dry etch of nitride, stopping on oxide.
15) Resist strip+clean.
16) Oxide removal: HF vapor for example.
17) Damageless dry etch of the full epi-stack into the substrate.
18) Formation of the gate dielectric (a grown oxide is shown).

FIG. 15.1
19) Deposition of a Si mid-gap gate electrode (for example p++ poly Ge, with a ramping to p++ poly Si; or metal like TiN).
20) Etchback of gate electrode, stopping on nitride.
21) Controlled recess of the gate electrode. If the gate electrode is p++ poly, low temperature oxidation (Plasma Enhanced, for example) can be used. If the gate electrode was a metal, then a timed etchback could be performed. The recess must go below the junction layer of the top transistor (source of NMOS in this case). An oxidation of poly gate is shown in the figure.
22) If the gate recess is achieved by poly oxidation, an immediate selective removal of nitride can be performed. If the gate electrode is a metal, a planarization step is needed after the gate electrode recess. Then, nitride should be selectively etched.
23) In-situ doped poly plugs are made by selective CVD. Blanket CVD and etchback could also be used.
24) Selective removal of oxidised poly (or deposited oxide in case of metal gate electrode).
25) CVD and etchback of oxide, to make spacers. This thickness, being larger than the stepper's overlay accuracy, will define the width of the trench between the gates of the different cells. It also makes possible the gate all around.
26) Litho (MASK4: Resist lines to protect the BITLINES).
27) Selective dry etch of gate electrode (against oxide spacers).
28) Resist strip+clean.

FIG. 15.2
29) Planarization by oxide deposition (and/or SOG), and etchback.

30) Deposition of metal.
31) Litho (MASK5: Top BITLINE)
32) Dry etch of metal, selective against the underlying oxide.

Flow 9
(Simultaneous fabrication of 2T Cell & CMOS)
1) N-type substrate.
2) Pre-Epitaxial Clean.
3) Epi-deposition of PMOS layers.
4) +deposition of epitaxial insulator
5) +epi-deposition of NMOS layers
6) CVD of thin oxide+thick nitride.
7) Litho MASK1: lines and spaces (with minimum dimensions for cell transistors).
8) Dry etch of nitride, stopping on oxide.
9) Resist strip+clean.
10) Damageless oxide removal: HF vapor for example.
11) Damageless dry etch of crystalline silicon layers, stopping in the bottom highly doped layer (PMOS Source). In order to obtain some selectivity (>40:1 for dry etch, and more for wet etch), it is possible to have SiGe strained layers in the Source region.
12) Low temperature growth of a sacrificial oxide.
13) Litho (MASK2 lines and spaces perpendicular to the first ones).
14) Dry etch of nitride, stopping on oxide.
15) Oxide removal: HF vapor for example.
16) Damageless dry etch of the full epi-stack into the substrate.
17) Resist strip+clean.
18) Formation of the gate dielectric (a grown oxide is shown).

FIG. 16.1
19) Deposition of a Si mid-gap gate electrode (for example p++ poly Ge, with a ramping to p++ poly Si; or metal like TiN).
20) Etchback of gate electrode, stopping on nitride.
21) Controlled recess of the gate electrode. If the gate electrode is p++ poly, low temperature oxidation (Plasma Enhanced, for example) can be used. If the gate electrode was a metal, then a timed etchback could be performed. The recess must go below the junction layer of the top transistor (source of NMOS in this case). An oxidation of poly gate is shown in the figure.
22) Litho (MASK3 resist lines to protect CMOS areas).
23) Selective nitride removal.
24) Resist strip+clean.
25) In-situ doped poly plugs are made by selective CVD. Blanket CVD and etchback could also be used.
26) Selective oxide (oxidised poly) removal.
27) Formation of oxide spacers: CVD and etchback of oxide.
28) Litho (MASK4: Resist lines to protect the gates of BITLINES & CMOS).
29) Dry etch of gate electrode, masked by resist and self-aligned with oxide spacers.
30) Resist strip+clean.

FIG. 16.2
31) Planarization by oxide deposition (and/or SOG), and etchback.
32) Deposition of an adhesion layer plus an metallic barrier/etchstop (Ti/TiN for example).
33) Litho (MASK5: Contact Hole to drains of NMOS and PMOS→CMOS Inverter).
34) Dry etch of TiN/Ti+Nitride stopping on thin Oxide
35) Damageless dry etch of Source/Channel of top transistor, stopping inside the drain of that transistor.
36) Resist strip+clean.

37) Formation of Nitride spacers: CVD of thin oxide+ nitride, etchback of nitride.
38) Damageless selective removal of oxide: HF vapor for example.
39) Self-aligned dry etch of drain of top transistor and insulator, stopping in the drain of the bottom transistor.
40) Formation of a metal plug. For example by CVD and etchback.

FIG. 16.3

41) Litho (MASK6: Contact Holes to CMOS Gate, and top transistor—NMOS—Source).
42) Dry etch of Oxide, stopping on poly & TiN.
43) Resist strip+clean.
44) Formation of metal plugs (CVD and etchback for example).
45) Litho (MASK7: Contact Holes to bottom transistor— PMOS—Source).
46) Dry etch of TiN/Ti, nitride, stopping on oxide.
47) Damageless dry etch of NMOS layers and PMOS drain & channel, until PMOS Source.
48) Resist strip+clean.
49) Formation of nitride spacers: CVD of thin oxide and nitride, etchback of nitride.
50) Removal of oxide by HF vapor for example.
51) Formation of a metal plug, by CVD and etchback for example.

FIG. 16.4

52) Litho (MASK5: Top BITLINES and contacts to CMOS)
53) Dry etch of metal, selective against the underlying oxide/nitride.

While particular embodiments of the invention have been described in detail, it will be apparent to those skilled in the art that these embodiments are exemplary rather than limiting, and the true scope of the invention is that defined in the following claims.

What is claimed is:

1. A process for manufacturing one Vertical MISFET device or several Vertical MISFET devices, said MISFET devices comprising a stack of several layers, wherein said stack of several layers comprises at least a source layer, a channel layer and a drain layer confined by a peripheral surface formed by edges of said several layers, and wherein said MISFET devices have a surrounding gate overlapping at least partially said peripheral surface formed by the edges of the several layers of the MISFET device, and an insulator positioned between said gate and said peripheral surface, said process comprising the following steps:
    a) epitaxially depositing the several layers sequentially on a silicon substrate;
    b) patterning and etching said several layers to form a plurality of said edges, each of said edges defining one part of said peripheral surfaces;
    c) forming said insulator on at least a portion of said peripheral surface; and
    d) forming said surrounding gate on at least a portion of said insulator.

2. The process of claim 1, wherein steps g) and h) for making the contact to the drain layer(s) of the devices result in a drain common to several stacked devices.

3. The process of claim 2, wherein the contact of said common drain is made inside a border defined by said peripheral surface of the devices.

4. The process of claim 1 wherein the layers of the devices are defined by a single uninterrupted epitaxial deposition in order to create the layers of at least a stack of NMOS/PMOS devices or PMOS/NMOS devices.

5. The process of claim 1, wherein step a) uses a virtual $Si_{1-x}Ge_x$ substrate to create a heterojunction in PMOS or NMOS device(s).

6. The process of claim 1, wherein step a) comprising the substeps of making a heterojunction by incorporating group IV elements into a region selected from the group consisting of said source layer, said drain layer, or said substrate to create significant energy barriers.

7. A process for manufacturing an array of Vertical MISFET devices arranged on a silicon substrate, each of said MISFET devices comprising a stack of layers, wherein said stack comprises at least a source layer, a channel layer and a drain layer and is confined with a periphery formed by edges of said layers so as to define a configuration unit, and wherein each of said MISFET devices has a gate layer overlapping at least partially said periphery and an insulation layer positioned between said gate layer and said periphery, said process comprising the following steps:
    a) epitaxially depositing said layers sequentially on said silicon substrate;
    b) conducting a first masking, said first masking comprising:
        i) etching said layers to form an array of said stacks separated from each other by said peripheries, each said stack defining one said configuration unit,
        ii) forming a first additional layer corresponding to said insulation layer on said layers and said peripheries, then forming a second additional layer corresponding to said gate layer on top, of said first additional layer,
        iii) etching back said first and second additional layers to form said insulation layer and said gate layer on said peripheries,
        iv) filling spaces between said configuration units and forming a planarized surface on top of said configuration units;
    c) conducting a second masking comprising:
        i) etching said planarized surface to form gate contact holes leading to said gate layer for receiving gate contacts,
        ii) filling said gate contact holes with a gate contact material to form said gate contacts;
    d) conducting a third masking comprising:
        i) forming common drain contact holes leading to the drain layer(s),
        ii) forming spacers at least partially on internal layers to separate said internal layers from said contact holes, and
        iii) filling said drain contact holes with silicide and metal to form drain contacts; and
    e) conducting a fourth masking comprising:
        i) forming source contact holes leading to the source layer,
        ii) filling said source contract holes with silicide and metal, and
        iii) metalizing said devices.

8. The process of claim 1, further comprising the steps of:
    e) patterning and etching at least one of said several layers to form a first hole leading to said source layer;
    f) forming a contact of said source layer by filling said first hole with contacting material;
    g) patterning and etching said several layers to form a second hole leading to said drain layer;
    h) forming a contact of said drain layer by filling said second hole with contacting material.

* * * * *